（12）United States Patent
Lee et al.

(10) Patent No.: US 11,696,434 B2
(45) Date of Patent: Jul. 4, 2023

(54) SEMICONDUCTOR MEMORY DEVICE

(71) Applicant: SAMSUNG ELECTRONICS CO., LTD., Suwon-si (KR)

(72) Inventors: Kiseok Lee, Hwaseong-si (KR); Kyunghwan Lee, Seoul (KR); Dongoh Kim, Daegu (KR); Yongseok Kim, Suwon-si (KR); Hui-Jung Kim, Seongnam-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 17/241,860

(22) Filed: Apr. 27, 2021

(65) Prior Publication Data

US 2022/0102352 A1    Mar. 31, 2022

(30) Foreign Application Priority Data

Sep. 28, 2020   (KR) .................. 10-2020-0126251

(51) Int. Cl.
*H10B 12/00*   (2023.01)

(52) U.S. Cl.
CPC ......... *H10B 12/315* (2023.02); *H10B 12/395* (2023.02); *H10B 12/50* (2023.02)

(58) Field of Classification Search
CPC ......... H01L 27/10814; H01L 27/10841; H01L 27/10897; H01L 29/78642; H01L 25/18; H01L 27/10873; H01L 27/2463; H01L 29/7869; H01L 27/2454; H01L 27/10805; H01L 27/1085; H10B 12/315; H10B 12/395; H10B 12/50; H10B 12/05
See application file for complete search history.

(56) References Cited

U.S. PATENT DOCUMENTS

| 8,759,892  | B2  | 6/2014  | Lee |
| 8,906,775  | B2  | 12/2014 | Cho et al. |
| 9,177,872  | B2  | 11/2015 | Sandhu |
| 10,388,658 | B1  | 8/2019  | Ramaswamy |
| 10,600,772 | B2  | 3/2020  | Sukekawa |
| 11,329,046 | B2* | 5/2022  | Choi ................. H01L 27/10805 |
| 2012/0039104 | A1 | 2/2012 | Lin et al. |
| 2012/0119276 | A1 | 5/2012 | Chuang et al. |
| 2014/0247674 | A1 | 9/2014 | Karda et al. |
| 2017/0287932 | A1 | 10/2017 | Jang |
| 2018/0069117 | A1 | 3/2018 | Cho et al. |
| 2019/0039222 | A1 | 2/2019 | Wang et al. |

(Continued)

FOREIGN PATENT DOCUMENTS

| KR | 10-2005-0101996 A | 10/2005 |
| TW | 201220459 A1 | 5/2012 |

*Primary Examiner* — Edward Chin
(74) *Attorney, Agent, or Firm* — Sughrue Mion, PLLC

(57) ABSTRACT

A semiconductor memory device includes a bit line extending in a first direction, a channel pattern on the bit line, the channel pattern including first and second vertical portions facing each other and a horizontal portion connecting the first and second vertical portions, first and second word lines provided on the horizontal portion and between the first and second vertical portions and extended in a second direction crossing the bit line, and a gate insulating pattern provided between the first word line and the channel pattern and between the second word line and the channel pattern.

20 Claims, 65 Drawing Sheets

(56) References Cited

U.S. PATENT DOCUMENTS

| | | |
|---|---|---|
| 2019/0067298 A1 | 2/2019 | Karda et al. |
| 2019/0067453 A1 | 2/2019 | Torek |
| 2019/0333917 A1 | 10/2019 | Ramaswamy |
| 2019/0355726 A1 | 11/2019 | Pillarisetty et al. |
| 2019/0393222 A1* | 12/2019 | Sharma ............. H01L 29/78642 |
| 2020/0092506 A1 | 3/2020 | Park et al. |
| 2020/0111800 A1* | 4/2020 | Ramaswamy ...... H01L 29/7869 |
| 2022/0115378 A1* | 4/2022 | Lee ........................ H10B 12/09 |

\* cited by examiner

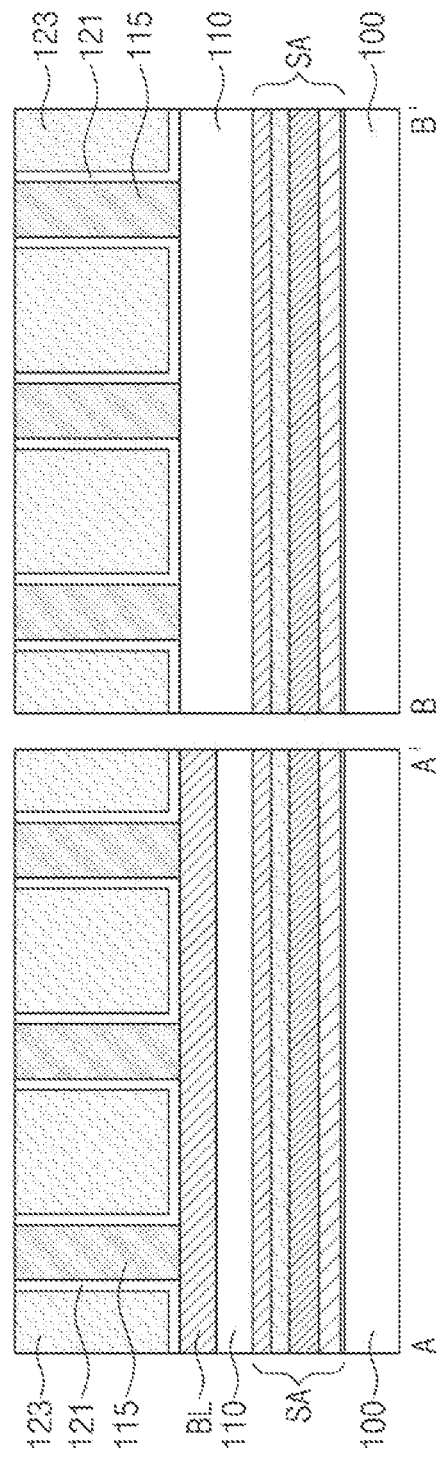

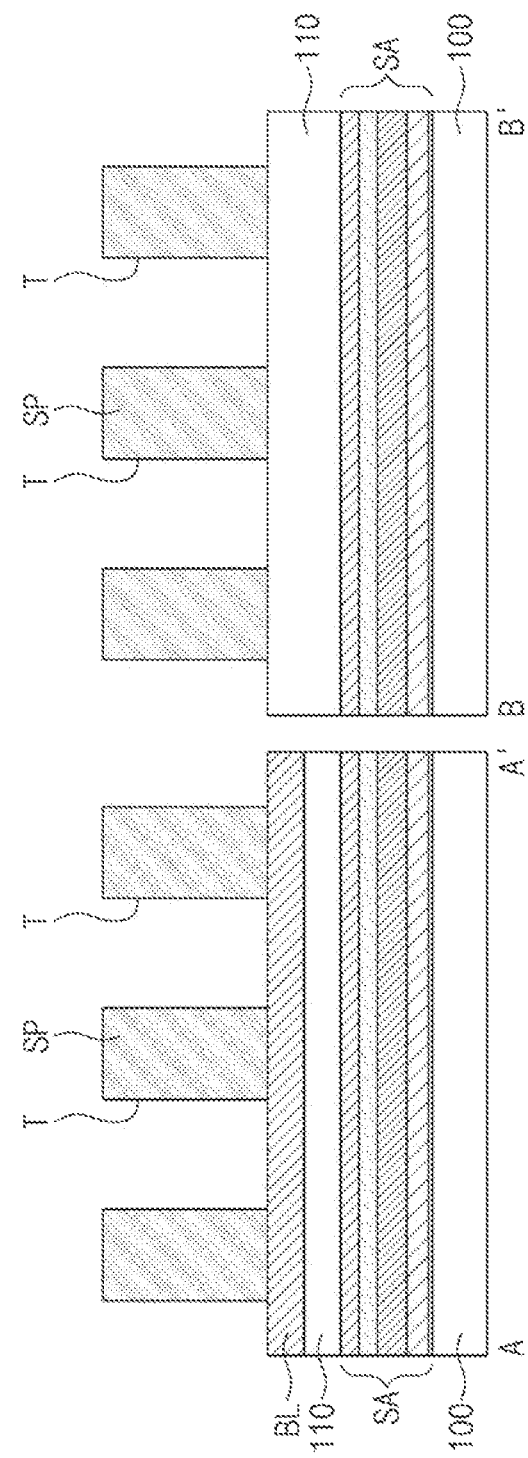

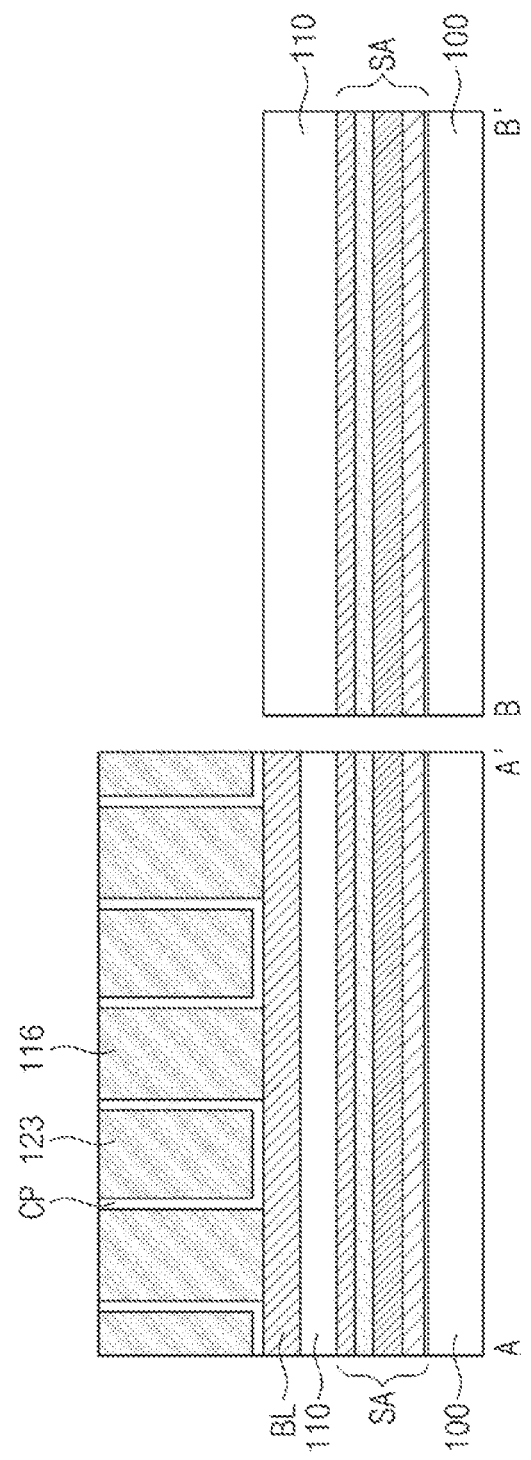

SEMICONDUCTOR MEMORY DEVICE

CROSS-REFERENCE TO RELATED APPLICATIONS

This application is based on and claims priority under 35 U.S.C. § 119 to Korean Patent Application No. 10-2020-0126251, filed on Sep. 28, 2020, in the Korean Intellectual Property Office, the disclosure of which is incorporated by reference herein in its entirety.

BACKGROUND

The disclosure relates to a semiconductor memory device, and in particular, to a semiconductor memory device including vertical channel transistors and a method of fabricating the same.

As a design rule of a semiconductor device decreases, it is possible to increase an integration density and an operation speed of the semiconductor device, but new technologies are required to improve or maintain a production yield. Recently, semiconductor devices with vertical channel transistors have been suggested to increase an integration density of a semiconductor device and improve resistance and current driving characteristics of the transistor.

SUMMARY

An embodiment of the disclosure provides a semiconductor memory device with improved electric characteristics and an increased integration density.

In accordance with an aspect of the disclosure, a semiconductor memory device includes a bit line extending in a first direction; a channel pattern on the bit line, the channel pattern including a first vertical portion and a second vertical portion facing each other and a horizontal portion connecting the first vertical portion with the second vertical portion; a first word line and a second word line provided on the horizontal portion and between the first vertical portion and the second vertical portion, the first word line and the second word line extending in a second direction crossing the bit line; and a gate insulating pattern provided between the first word line and the channel pattern and between the second word line and the channel pattern.

In accordance with an aspect of the disclosure, a semiconductor memory device includes a peripheral circuit structure including a plurality of peripheral circuits on a semiconductor substrate and a lower insulating layer covering the plurality of peripheral circuits; a plurality of bit lines extended in a first direction on the peripheral circuit structure; a first insulating pattern defining a trench, the first insulating pattern crossing the plurality of bit lines and extending in a second direction; a plurality of channel patterns provided in the trench and spaced apart from each other in the second direction, each of the plurality of channel patterns including a first vertical portion and a second vertical portion facing each other and a horizontal portion connecting the first vertical portion with the second vertical portion; a first word line and a second word line provided on the horizontal portion of each of the plurality of channel patterns, the first word line and the second word line extending in the second direction, the first word line being adjacent to the first vertical portion of each of the plurality of channel patterns, the second word line being adjacent to the second vertical portion of each of the plurality of channel patterns; for each of the plurality of channel patterns, a gate insulating pattern extending in the second direction disposed between the channel pattern and the first word line and between the channel pattern and the second word line; a second insulating pattern covering the first word line and the second word line in the trench; a plurality of first data storage patterns disposed on respective first vertical portions of the plurality of channel patterns; and a plurality of second data storage patterns disposed on respective second vertical portions of the plurality of channel patterns.

In accordance with an aspect of the disclosure, a semiconductor memory device includes a bit line extending in a first direction; a channel pattern on the bit line, the channel pattern including a first vertical portion and a second vertical portion facing each other and a horizontal portion connecting the first vertical portion and the second vertical portion; a first word line extending in a second direction to cross the bit line, the first word line being disposed on the horizontal portion and between the first vertical portion and the second vertical portion; and a gate insulating pattern interposed between the first word line and the channel pattern.

BRIEF DESCRIPTION OF THE DRAWINGS

The above and other aspects, features, and advantages of certain embodiments of the disclosure will be more apparent from the following description taken in conjunction with the accompanying drawings. The accompanying drawings represent non-limiting, example embodiments as described herein.

FIGS. 18B, 19B, 20B, 21B, 22B, and 23B and FIGS. 18C, 19C, 20C, 21C, 22C, and 23C are sectional views illustrating a method of fabricating a semiconductor memory device according to an embodiment.

FIGS. 25B, 26B, and 27B and FIGS. 25C, 26C, and 27C are sectional views illustrating a method of fabricating a semiconductor memory device according to an embodiment.

Figure 1:
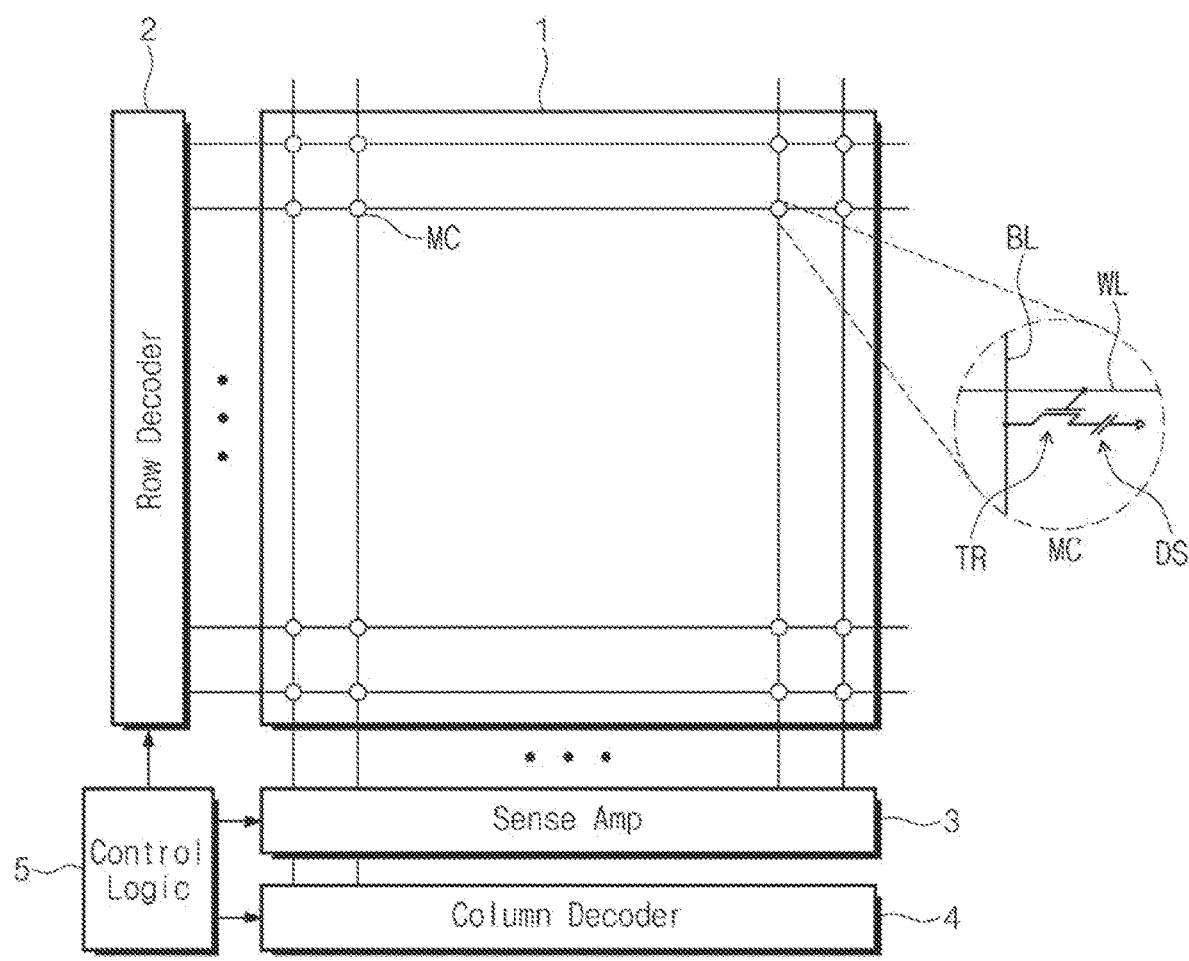
FIG. 1 is a block diagram of a semiconductor memory device including a semiconductor device according to an embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical elements or features.

DETAILED DESCRIPTION

Example embodiments will now be described more fully with reference to the accompanying drawings, in which example embodiments are shown.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a block diagram of a semiconductor memory device including a semiconductor device according to an embodiment.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC, which are two-dimensionally or three-dimensionally arranged. Each of the memory cells MC may be provided between and connected to a word line WL and a bit line BL, which are disposed to cross each other.

Each of the memory cells MC may include a selection element TR and a data storage element DS, which are electrically connected in series. The data storage element DS may be provided between and connected to the bit line BL and the selection element TR, and the selection element TR may be provided between and connected to the data storage element DS and the word line WL. The selection element TR may be a field effect transistor FET, and the data storage element DS may be realized using at least one of a capacitor, a magnetic tunnel junction pattern, and a variable resistor. As an example, the selection element TR may include a transistor, a gate electrode of the transistor may be connected to the word line WL, and drain/source terminals of the transistor may be respectively connected to the bit line BL and the data storage element DS.

The row decoder 2 may be configured to decode address information, which is input from the outside, and to select one of the word lines WL of the memory cell array 1, based on the decoded address information. The address information decoded by the row decoder 2 may be provided to a row driver, and in this case, the row driver may provide respective voltages to the selected one of the word lines WL and the unselected ones of the word lines WL, in response to the control of a control circuit.

The sense amplifier 3 may be configured to sense, amplify, and output a difference in voltage between one of the bit lines BL, which is selected based on address information decoded by the column decoder 4, and a reference bit line.

The column decoder 4 may provide a data transmission path between the sense amplifier 3 and an external device (e.g., a memory controller). The column decoder 4 may be configured to decode address information, which is input from the outside, and to select one of the bit lines BL, based on the decoded address information.

The control logic 5 may be configured to generate control signals, which are used to control data writing or reading operations on the memory cell array 1.

Figure 2:
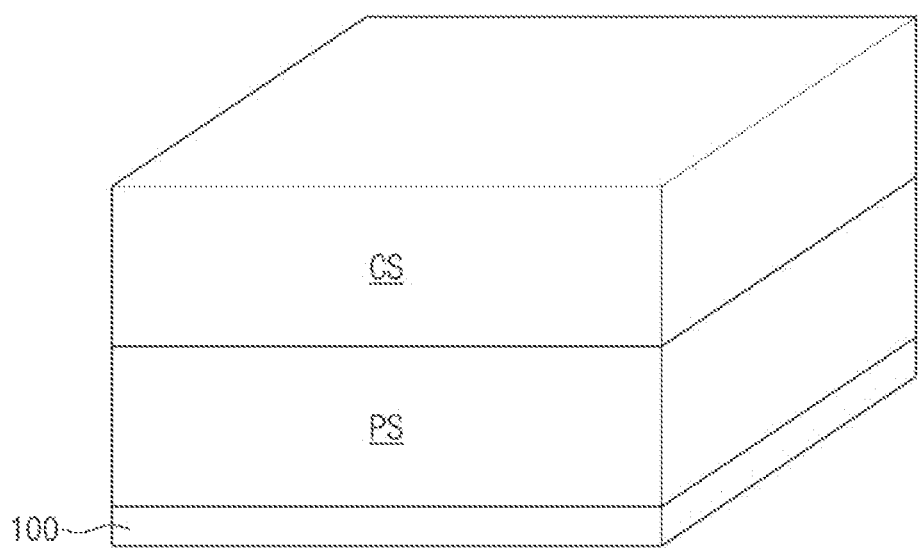
FIGS. 2 and 3 are perspective views schematically illustrating a semiconductor memory device according to an embodiment.
Figure 3:
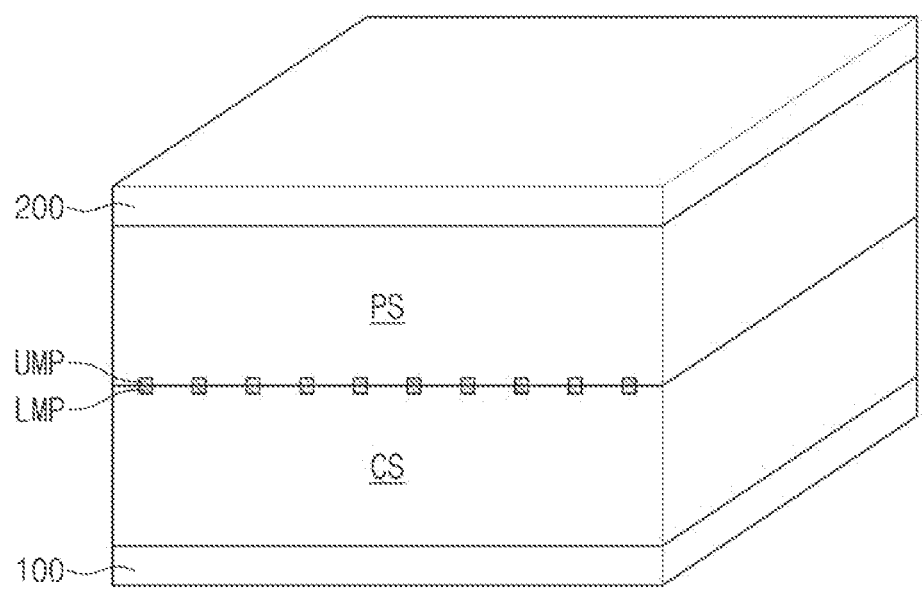

FIGS. 2 and 3 are perspective views schematically illustrating a semiconductor memory device according to an embodiment.

Referring to FIG. 2, the semiconductor memory device may include a peripheral circuit structure PS on a semiconductor substrate 100 and a cell array structure CS on the peripheral circuit structure PS.

The peripheral circuit structure PS may include core and peripheral circuits, which are formed on the semiconductor substrate 100. The core and peripheral circuits may include the row and column decoders 2 and 4, the sense amplifier 3, and the control logics 5 described with reference to FIG. 1.

Referring to FIG. 3, the cell array structure CS may include the memory cell array 1 including the memory cells MC, which are two-dimensionally or three-dimensionally arranged on the first semiconductor substrate 100 (e.g., see FIG. 1). The memory cell array 1 (e.g., of FIG. 1) may include the word lines WL, the bit lines BL, and the memory cells connected therebetween, as described above.

The peripheral circuit structure PS may include core and peripheral circuits, which are formed on a second semiconductor substrate 200. The core and peripheral circuits may include the row and column decoders 2 and 4, the sense amplifier 3, and the control logic 5 described with reference to FIG. 1.

Lower metal pads LMP may be provided at the topmost level of the cell array structure CS. The lower metal pads LMP may be electrically connected to the memory cell array 1 (e.g., see FIG. 1). Upper metal pads UMP may be provided at the topmost level of the peripheral circuit structure PS. The upper metal pads UMP may be electrically connected to the core and peripheral circuits 2, 3, 4, and 5 (e.g., see FIG. 1).

The lower and upper metal pads LMP and UMP may have substantially the same size and arrangement. The lower and upper metal pads LMP and UMP may be formed of or include at least one of, for example, copper (Cu), aluminum (Al), nickel (Ni), cobalt (Co), tungsten (W), titanium (Ti), tin (Sn), and alloys thereof.

The semiconductor memory device may be fabricated by forming the cell array structure CS including the memory cells on the first semiconductor substrate 100, forming the peripheral circuit structure PS including the core and peripheral circuits on the second semiconductor substrate 200 that is distinct from the first semiconductor substrate 100, and then connecting the first semiconductor substrate 100 with the second semiconductor substrate 200 in the bonding manner. In other words, the lower metal pads LMP of the cell array structure CS may be electrically and physically connected to the upper metal pads UMP of the peripheral circuit structure PS, respectively, in a bonding manner. In other words, the lower metal pads LMP may be in direct contact with the upper metal pads UMP.

Figure 4A:
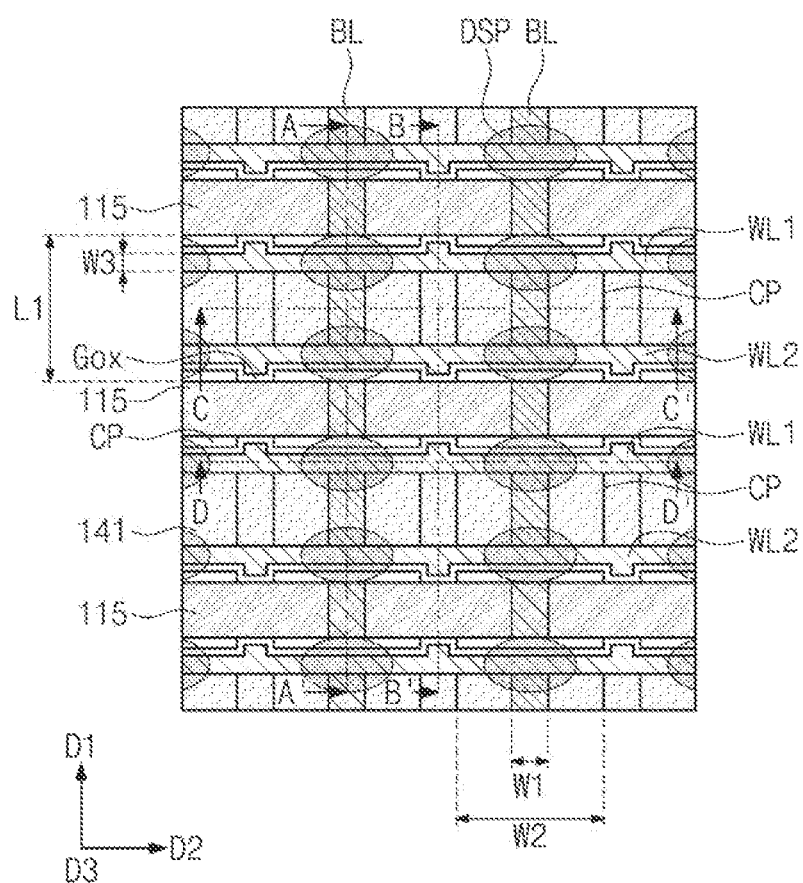
FIG. 4A is a plan view of a semiconductor memory device according to an embodiment.
Figure 4B:
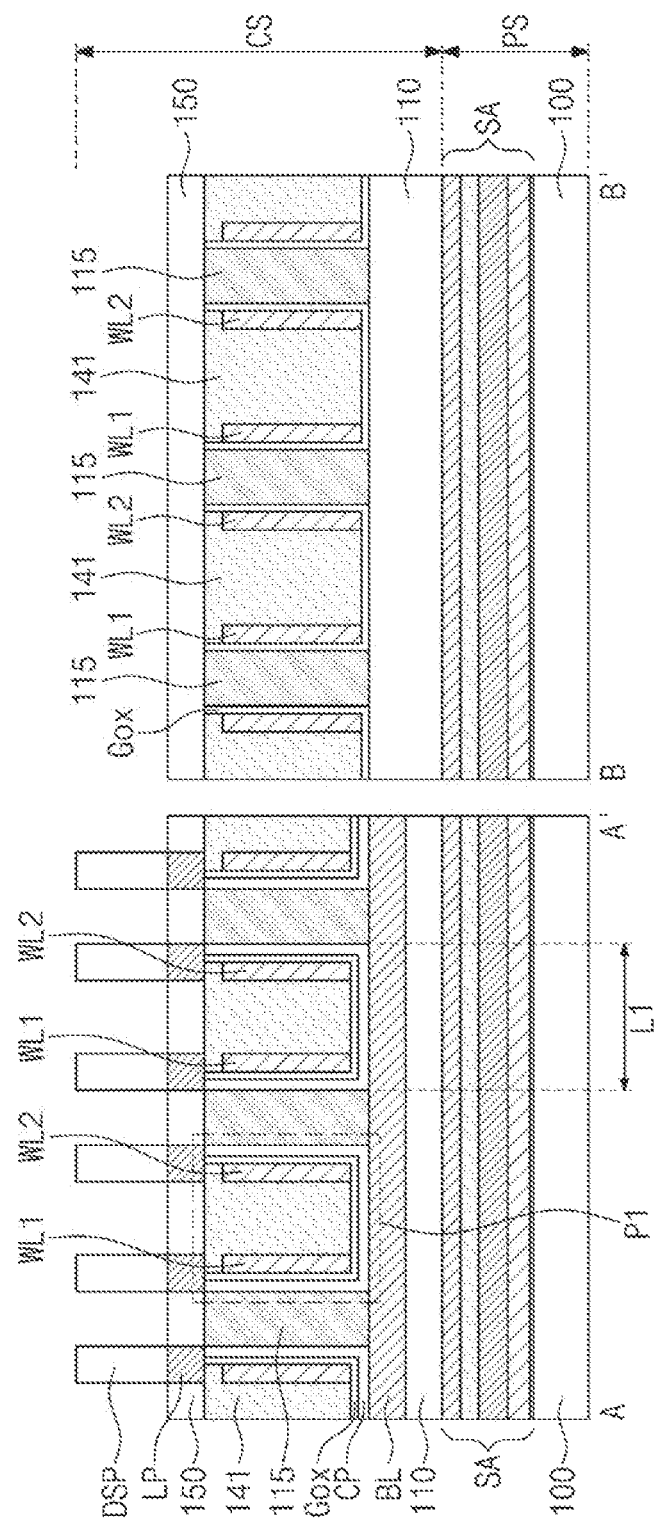
FIGS. 4B and 4C are sectional views, which are respectively taken along lines A-A', B-B', C-C', and D-D' of FIG. 4A to illustrate a semiconductor memory device according to an embodiment.
Figure 4C:
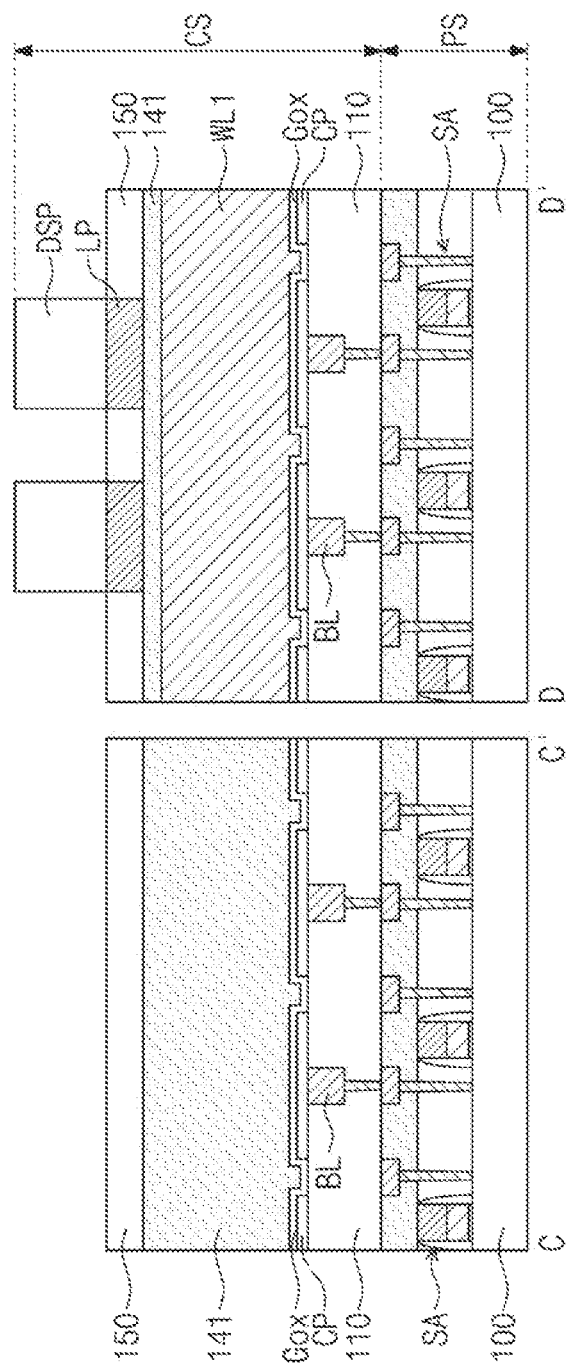

FIG. 4A is a plan view of a semiconductor memory device according to an embodiment. FIGS. 4B and 4C are sectional views, which are respectively taken along lines A-A', B-B', C-C', and D-D' of FIG. 4A to illustrate a semiconductor memory device according to an embodiment. FIGS. 5A, 5B, 5C, and 5D are enlarged sectional views illustrating a portion P1 of FIG. 4B.

The semiconductor device may include the peripheral circuit structure PS and the cell array structure CS on the peripheral circuit structure PS.

The peripheral circuit structure PS may include core and peripheral circuits SA (see, e.g., FIG. 4B), which are integrated on a semiconductor substrate 10, and a lower insulating layer 110, which is provided to cover the core and peripheral circuits SA.

The semiconductor substrate 10 may be a single crystalline silicon substrate. The core and peripheral circuits SA may include the row and column decoders 2 and 4, the sense amplifier 3, and the control logic 5 described with reference to FIG. 1. As an example, the core and peripheral circuits SA may include NMOS and PMOS transistors integrated on the semiconductor substrate 100. The core and peripheral circuits SA may be electrically connected to the bit lines BL through peripheral interconnection lines and peripheral contact plugs. In other words, the sense amplifiers may be electrically connected to the bit lines BL, and each sense amplifier may amplify and output a voltage level between voltages sensed by a pair of the bit lines BL.

The lower insulating layer 110 may cover the core and peripheral circuits SA, the peripheral interconnection lines, and the peripheral contact plugs, on the semiconductor substrate 100. The lower insulating layer 110 may include a plurality of stacked insulating layers. For example, the lower insulating layer 110 may include a silicon oxide layer, a silicon nitride layer, a silicon oxynitride layer, and/or a low-k dielectric layer.

The cell array structure CS may include memory cells, in which vertical channel transistors VCT are included. The vertical channel transistor may refer to a transistor whose channel region is elongated in a direction perpendicular to a top surface of the semiconductor substrate 100. The cell array structure CS may include a plurality of bit lines BL, channel patterns CP, first and second word lines WL1 and WL2, a gate insulating pattern Gox, and data storage patterns DSP.

On the lower insulating layer 110, the bit lines BL may be extended in a first direction D1 and may be spaced apart from each other in a second direction D2. A space between the bit lines BL may be filled with an insulating material. The bit lines BL may have a first width W1 in the second direction D2, and in an embodiment, the first width W1 may range from about 1 nm to 50 nm.

For example, the bit lines BL may include at least one of doped polysilicon, metals, conductive metal nitrides, conductive metal silicides, conductive metal oxides, and combinations thereof. The bit lines BL may be formed at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, and combinations thereof, but the disclosure is not limited to these examples. The bit lines BL may have a single- or multi-layered structure composed of at least one of the above materials. In an embodiment, the bit lines BL may include a two-dimensional semiconductor material (e.g., graphene, carbon nanotube, or combinations thereof).

In an embodiment, a first insulating pattern 115 may be disposed on the bit lines BL, and the first insulating pattern 115 may be extended in the second direction D2 to cross the bit lines BL and may define trenches T, which are spaced apart from each other in the first direction D1.

In each of the trenches T, the channel patterns CP may be spaced apart from each other in the second direction D2. In other words, the first insulating pattern 115 may be disposed between the channel patterns CP that are adjacent to each other in the first direction D1 (see, e.g., FIG. 4A). A top surface of the first insulating pattern 115 may be located at substantially the same level as top surfaces of first and second vertical portions VP1 and VP2 of the channel patterns CP (see, e.g., FIGS. 5A-5D). The first insulating pattern 115 may include, for example, a silicon oxide layer, a silicon nitride layer, a silicon oxynitride layer, and/or a low-k dielectric layer.

The channel patterns CP may be disposed on the bit lines BL. The channel patterns CP, which are disposed on each of the bit lines BL, may be spaced apart from each other in the first direction D1. In other words, the channel patterns CP may be two-dimensionally arranged in two different directions (e.g., the first and second directions D1 and D2).

Each of the channel patterns CP may have a first length L1 in the first direction D1 and may have a second width W2, which is substantially equal to or larger than the first width W1 of the bit lines BL, in the second direction D2. A distance between the channel patterns CP in the first direction D1 may be different from the first length L1 of the channel pattern CP in the first direction D1. As an example, the distance between the channel patterns CP in the first direction D1 may be smaller than the first length L1 of the channel pattern CP in the first direction D1. Alternatively, the distance between the channel patterns CP in the first direction D1 may be substantially equal to the first length L1 of the channel pattern CP in the first direction D1. A distance between the channel patterns CP in the second direction D2 may be substantially equal to or smaller than the second width W2 of the channel pattern CP.

Each of the channel patterns CP may include a horizontal portion HP, which is disposed on the bit line BL, and first and second vertical portions VP1 and VP2, which are vertically extended from the horizontal portion HP to face each other in the first direction D1 (see, e.g., FIGS. 5A-5D). Each of the first and second vertical portions VP1 and VP2 may have an inner side surface and an outer side surface, which are opposite to each other, and the inner side surfaces of the first and second vertical portions VP1 and VP2 may face each other in the first direction D1. In addition, the outer side surfaces of the first and second vertical portions VP1 and VP2 of adjacent ones of the channel patterns CP may face each other. The outer side surfaces of the first and second vertical portions VP1 and VP2 of the channel patterns CP may be in contact with a side surface of the first insulating pattern 115.

The first and second vertical portions VP1 and VP2 may have vertical lengths in a direction perpendicular to the top surface of the semiconductor substrate 100 and may have widths in the first direction D1. The vertical length of each of the first and second vertical portions VP1 and VP2 may be about 2 to 10 times its width, but the disclosure is not limited to this example. The widths of the first and second vertical portions VP1 and VP2 in the first direction D1 may range from several nanometers to several tens of nanometers. For example, the widths of the first and second vertical portions VP1 and VP2 may range from 1 nm to 30 nm (in particular, from 1 nm to 10 nm).

The horizontal portions HP of the channel patterns CP may be in direct contact with top surfaces of the bit lines BL. In an embodiment, a thickness of the horizontal portions HP on the top surfaces of the bit lines BL may be substantially equal to thicknesses of the first and second vertical portions VP1 and VP2 on the side surface of the first insulating pattern 115.

In each of the channel patterns CP, the horizontal portion HP may include a common source/drain region, a top portion of the first vertical portion VP1 may include a first source/drain region, and a top portion of the second vertical portion VP2 may include a second source/drain region. The first vertical portion VP1 may include a first channel region, which is placed between the first source/drain region and the common source/drain region, and the second vertical portion VP2 may include a second channel region, which is placed between the second source/drain region and the common source/drain region. In an embodiment, the first channel region of the first vertical portion VP1 may be controlled by the first word line WL1, and the second channel region of the second vertical portion VP2 may be controlled by the second word line WL2.

The channel patterns CP may be formed of or include at least one of oxide semiconductor materials (e.g., $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, and combinations thereof). As an example, the channel patterns CP may be formed of or include indium gallium zinc oxide (IGZO). The channel patterns CP may include a single layer or multiple layers made of the oxide semiconductor material. The channel patterns CP may be formed of or include an amorphous, single-crystalline, or poly-crystalline oxide semiconductor material. In an embodiment, the channel patterns CP may have a band gap energy that is greater than that of silicon. For example, the channel patterns CP may have a band gap energy of about 1.5 eV to 5.6 eV. As an example, when the channel patterns CP have a band gap energy of about 2.0 eV to 4.0 eV, they may have an optimized channel property. In an embodiment, the channel patterns CP may have polycrystalline or amorphous structure, but the disclosure is not limited to this example. For example, the channel patterns CP may be formed of or include a two-dimensional semiconductor material (e.g., graphene, carbon nanotube, or combinations thereof).

The first and second word lines WL1 and WL2 may be extended in the second direction D2 to cross the bit lines BL and may be alternately arranged in the first direction D1. A pair of the first and second word lines WL1 and WL2 may be disposed between the first and second vertical portions VP1 and VP2 of each channel pattern CP and on the horizontal portion HP (see, e.g., FIGS. 5A-5D).

Each of the first and second word lines WL1 and WL2 may have an inner side surface and an outer side surface, which are opposite to each other, and the inner side surfaces of the first and second word lines WL1 and WL2 may be disposed on the horizontal portion HP to face each other. The outer side surface of the first word line WL1 may be adjacent to the inner side surface of the first vertical portion VP1, and the outer side surface of the second word line WL2 may be adjacent to the inner side surface of the second vertical portion VP2. The first word line WL1 may be adjacent to the first channel region of the first vertical portion VP1, and the second word line WL2 may be adjacent to the second channel region of the second vertical portion VP2. Top surfaces of the first and second word lines WL1 and WL2 may be located at a lower level than top surfaces of the first and second vertical portions VP1 and VP2 of the channel patterns CP. In addition, the first and second word lines WL1 and WL2 may have a spacer-like shape. For example, each of the first and second word lines WL1 and WL2 may have a rounded top surface.

The first and second word lines WL1 and WL2 may have a third width W3 in the first direction D1, which is smaller than the first width W1 of the bit lines BL. The third width W3 of the first and second word lines WL1 and WL2 may range from about 1 nm to 50 nm.

The first and second word lines WL1 and WL2 may be formed of or include at least one, for example, doped polysilicon, metals, conductive metal nitrides, conductive metal silicides, conductive metal oxides, or combinations thereof. The first and second word lines WL1 and WL2 may be formed at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, and combinations thereof, but the disclosure is not limited to these examples. The first and second word lines WL1 and WL2 may have a single- or multi-layered structure composed of at least one of the above materials. In an embodiment, the first and second word lines WL1 and WL2 may include a two-dimensional semiconductor material (e.g., graphene, carbon nanotube, or combinations thereof).

The gate insulating pattern Gox may be disposed between the channel patterns CP and the first and second word lines WL1 and WL2. The gate insulating pattern Gox may cover the surfaces of the channel patterns CP with a uniform thickness. In regions between adjacent channel patterns CP, the gate insulating pattern Gox may be in direct contact with a top surface of the lower insulating layer 110 and side surfaces of the first insulating pattern 115 (see, e.g., FIGS. 4A and 4B).

In the channel patterns CP, the gate insulating pattern Gox may be interposed between the bottom surfaces of the first and second word lines WL1 and WL2 and the horizontal portion HP of the channel pattern CP, between the outer side surface of the first word line WL1 and the inner side surface of the first vertical portion VP1, and between the outer side surface of the second word line WL2 and the inner side surface of the second vertical portion VP2.

The gate insulating pattern Gox may be formed of or include at least one of silicon oxide, silicon oxynitride, or high-k dielectric materials, and combinations thereof. The high-k dielectric materials may have dielectric constants higher than that of silicon oxide and may include metal oxides or metal oxynitrides. For example, the high-k dielectric material for the gate insulating pattern Gox may include HfO2, HfSiO, HfSiON, HfTaO, HfTiO, HfZrO, ZrO2, Al$_2$O$_3$, or combinations thereof, but the disclosure is not limited to this example.

Figure 5A:
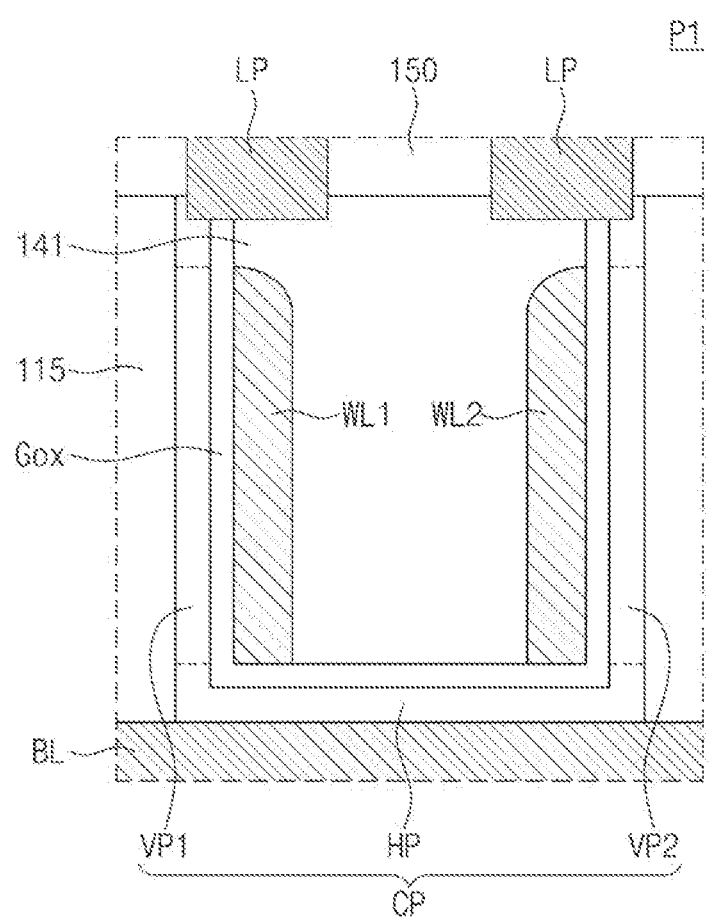
FIGS. 5A, 5B, 5C, and 5D are enlarged sectional views illustrating a portion P1 of FIG. 4B.
Figure 5B:
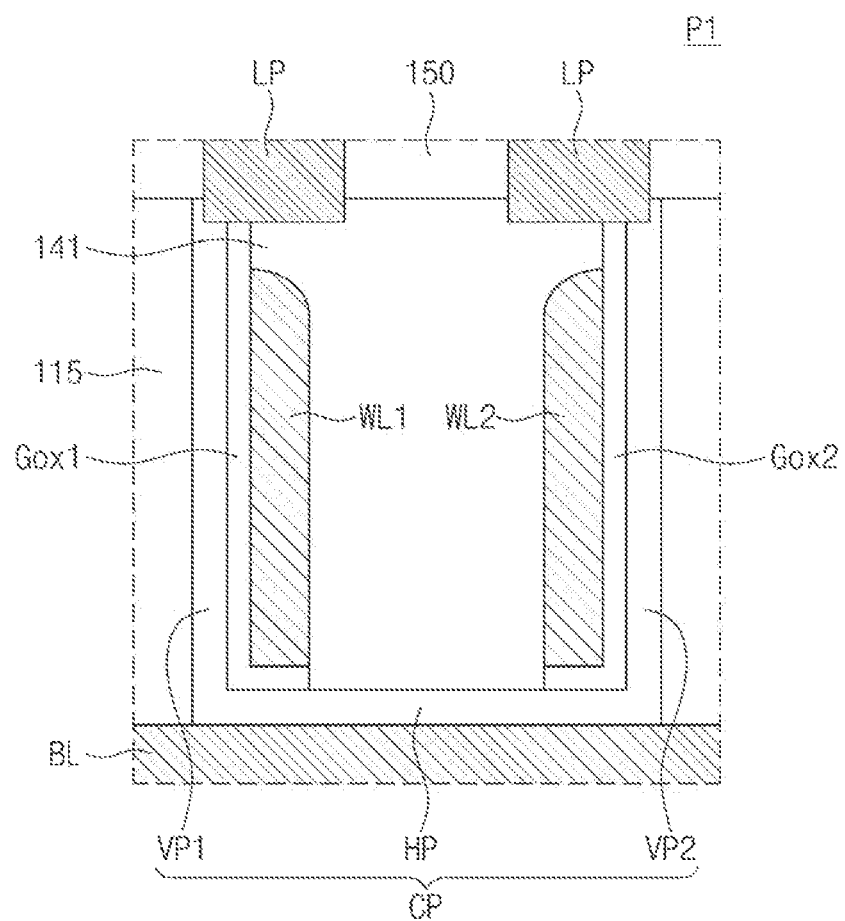

Referring to FIG. 5A, a portion of the channel pattern CP and a portion of the gate insulating pattern Gox may be positioned between the first and second word lines WL1 and WL2. The horizontal portion HP of the channel pattern CP may connect both of the first and second vertical portions VP1 and VP2 to a corresponding bit line BL. In the semiconductor memory device according to an embodiment, a pair of selection transistors may be provided to share a corresponding one of the bit lines BL. The corresponding bit line BL and one of the first and second vertical portions VP1 and VP2 may be electrically connected to each other through signals applied to the first and second word lines WL1 and WL2.

Figure 5C:
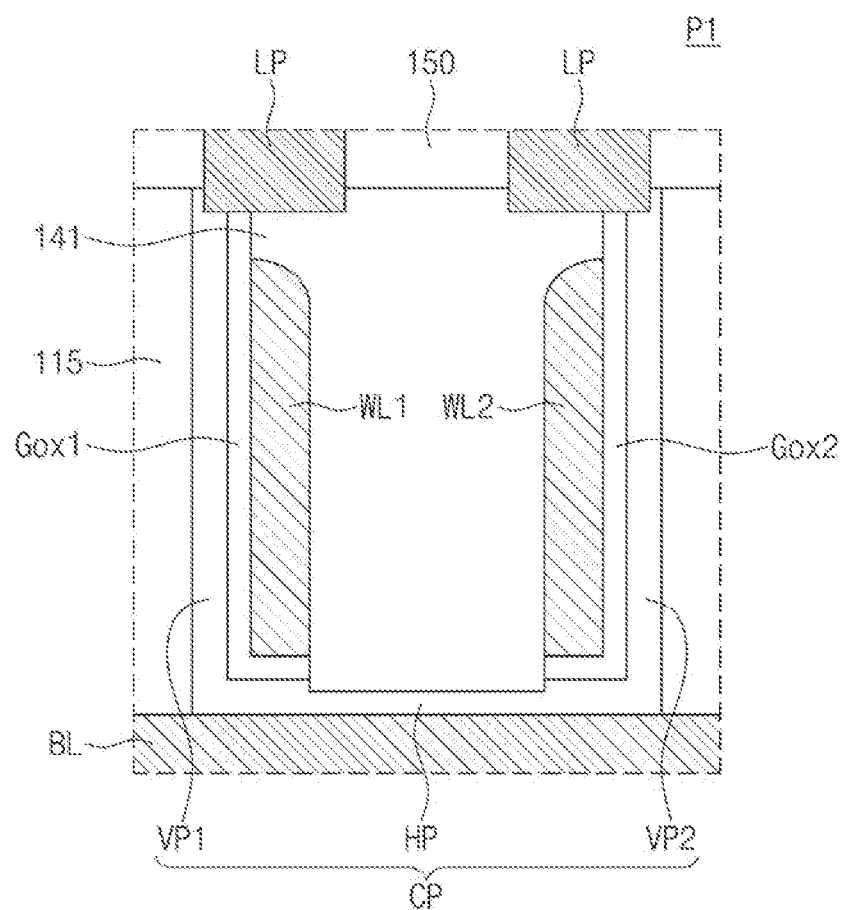
Figure 5D:
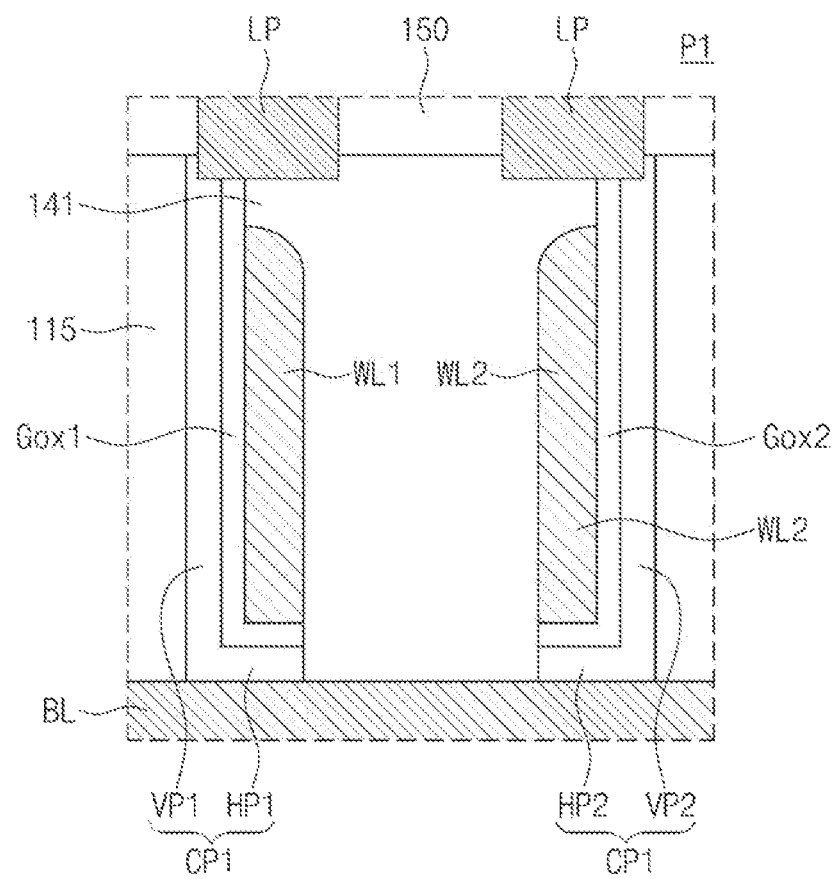

Referring to FIG. 5D, first and second gate insulating patterns Gox1 and Gox2, which are spaced apart from each other, may be disposed on the horizontal portion HP of the channel pattern CP. The first gate insulating pattern Gox1 may be interposed between the bottom surface of the first word line WL1 and the horizontal portion HP of the channel pattern CP and between the outer side surface of the first word line WL1 and the first vertical portion VP1 of the channel pattern CP. The second gate insulating pattern Gox2 may be interposed between the bottom surface of the second word line WL2 and the horizontal portion HP of the channel pattern CP and between the outer side surface of the second word line WL2 and the second vertical portion VP2 of the channel pattern CP. In the first direction D1, the first gate insulating pattern Gox1 and the second gate insulating pattern Gox2 may be mirror symmetric with respect to each other.

The horizontal portion HP of the channel pattern CP may be in contact with a second insulating pattern 141, between the first and second word lines WL1 and WL2.

Referring to FIG. 5C, the first and second gate insulating patterns Gox1 and Gox2 may be spaced apart from each other, on the horizontal portion HP of the channel pattern CP. The thickness of the horizontal portion HP of the channel pattern CP may be smaller between the first and second gate insulating patterns Gox1 and Gox2 than under the first and second gate insulating patterns Gox1 and Gox2.

Referring to FIG. 5D, first and second channel patterns CP1 and CP2 may be disposed on the bit line BL to be spaced apart from each other in the first direction D1 and to be mirror symmetric with respect to each other. The first channel pattern CP1 may include the first horizontal portion HP1, which is in contact with the bit line BL, and the first vertical portion VP1, which is vertically extended from the first horizontal portion HP1 to be adjacent to the outer side surface of the first word line WL1. The second channel pattern CP2 may include the second horizontal portion HP2, which is in contact with the bit line BL, and the second vertical portion VP2, which is vertically extended from the second horizontal portion HP2 to be adjacent to the outer side surface of the second word line WL2.

A side surface of the first horizontal portion HP1 of the first channel pattern CP1 and a side surface of the first gate insulating pattern Gox1 may be aligned to the inner side surface of the first word line WL1. Similarly, a side surface of the second horizontal portion HP2 of the second channel pattern CP2 and a side surface of the second gate insulating pattern Gox2 may be aligned to the inner side surface of the first word line WL1.

Landing pads LP may be disposed on the first and second vertical portions VP1 and VP2 of the channel pattern CP. The landing pads LP may be in direct contact with the first and second vertical portions VP1 and VP2. The landing pads LP may have various shapes, such as circular, elliptical, rectangular, square, diamond, hexagonal shapes, when viewed in a plan view.

The landing pads LP may be formed at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, and combinations thereof, but the disclosure is not limited to these examples.

An interlayer insulating layer 150 may be provided on the first and second insulating patterns 115 and 141 to fill a space between the landing pads LP.

In an embodiment, the data storage patterns DSP may be disposed on the landing pads LP, respectively. The data storage patterns DSP may be electrically and respectively connected to the first and second vertical portions VP1 and VP2 of the channel patterns CP through the landing pads LP. The data storage patterns DSP may be arranged in the first and second directions D1 and D2 or in a matrix shape, as shown in FIG. 4A.

In an embodiment, each of the data storage patterns DSP may be a capacitor including a bottom electrode, a top electrode, and a capacitor dielectric layer interposed therebetween. In this case, the bottom electrode may be in contact with the landing pad LP, and the bottom electrode may have various shapes, such as circular, elliptical, rectangular, square, diamond, hexagonal shapes, when viewed in a plan view.

Alternatively, the data storage patterns DSP may be a variable resistance pattern whose resistance can be switched to one of at least two states by an electric pulse applied thereto. For example, the data storage patterns DSP may be formed of or include at least one of phase-change materials, perovskite compounds, transition metal oxides, magnetic materials, ferromagnetic materials, and antiferromagnetic materials.

Hereinafter, a semiconductor device according to an embodiment will be described in more detail. In the following description, a previously described element may be identified by the same reference number without repeating an overlapping description thereof, for the sake of brevity.

Figure 6A:
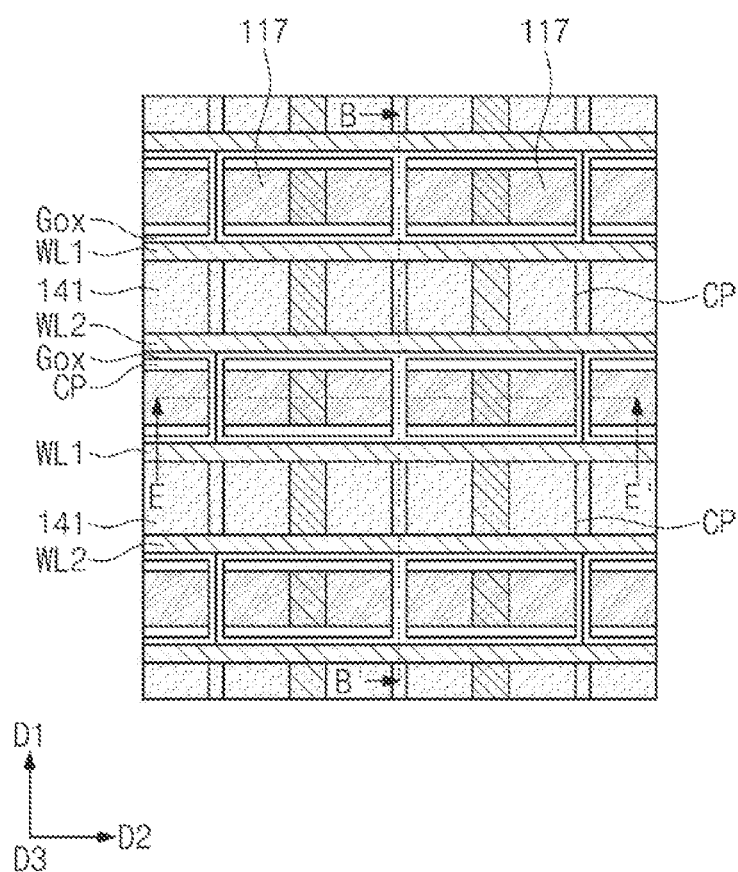
FIG. 6A is a plan view of a semiconductor memory device according to an embodiment.
Figure 6B:
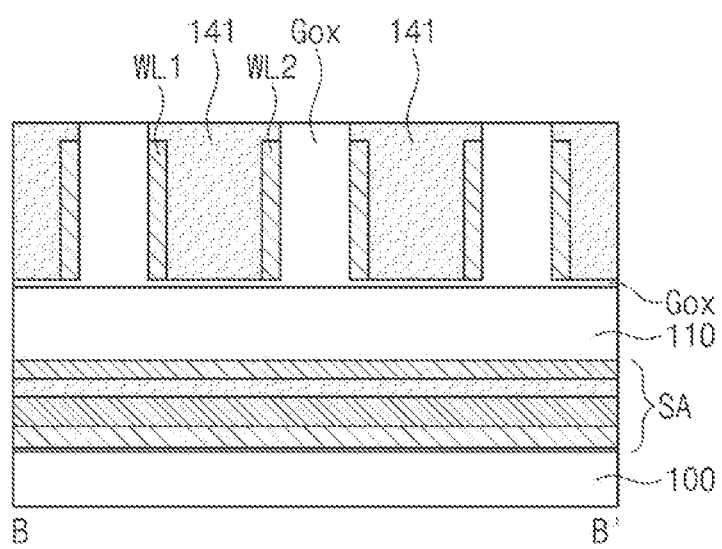
FIGS. 6B and 6C are sectional views, which are respectively taken along lines B-B' and E-E' of FIG. 6A to illustrate a semiconductor memory device according to an embodiment.
Figure 6C:
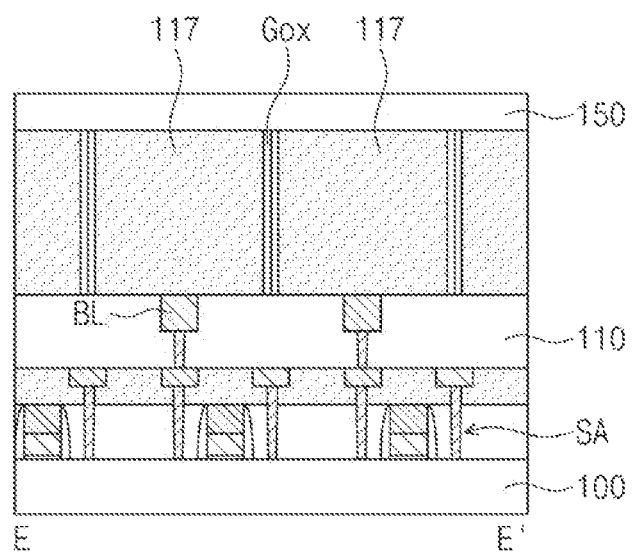

FIG. 6A is a plan view of a semiconductor memory device according to an embodiment. FIGS. 6B and 6C are sectional views, which are respectively taken along lines B-B' and E-E' of FIG. 6A to illustrate a semiconductor memory device according to an embodiment.

Referring to FIGS. 6A and 6B, first insulating patterns 117 may be disposed to be spaced apart from each other in the second direction D2, and the gate insulating pattern Gox may be provided to fill a space between the first insulating patterns 117, which are adjacent to each other in the second direction D2. For example, when viewed in a plan view, the gate insulating pattern Gox may be provided to enclose each of the first insulating patterns 117 and may be extended in the second direction D2. The first and second word lines WL1 and WL2 may be extended in the second direction D2 while having a substantially constant width in the first direction D1.

Figure 7:
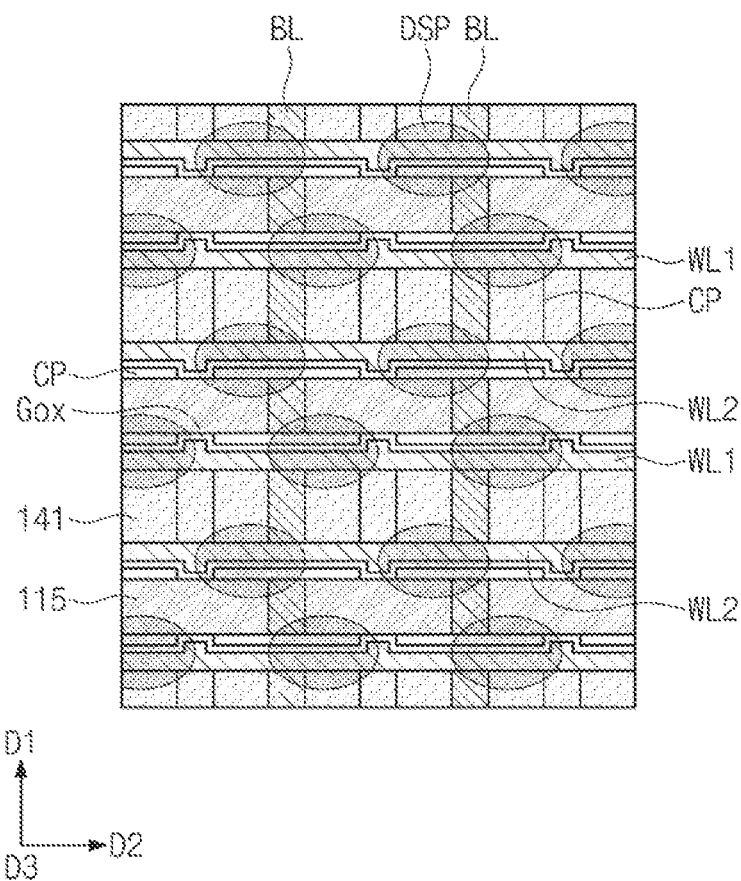
FIG. 7 is a plan view of a semiconductor memory device according to an embodiment.

FIG. 7 is a plan view of a semiconductor memory device according to an embodiment.

The data storage patterns DSP may be arranged in a zigzag or honeycomb shape, as shown in FIG. 7. The data storage patterns DSP may be fully or partially overlapped with the landing pads LP. Each of the data storage patterns DSP may be in contact with the entire or partial region of the top surface of a corresponding one of the landing pads LP.

Figure 8A:
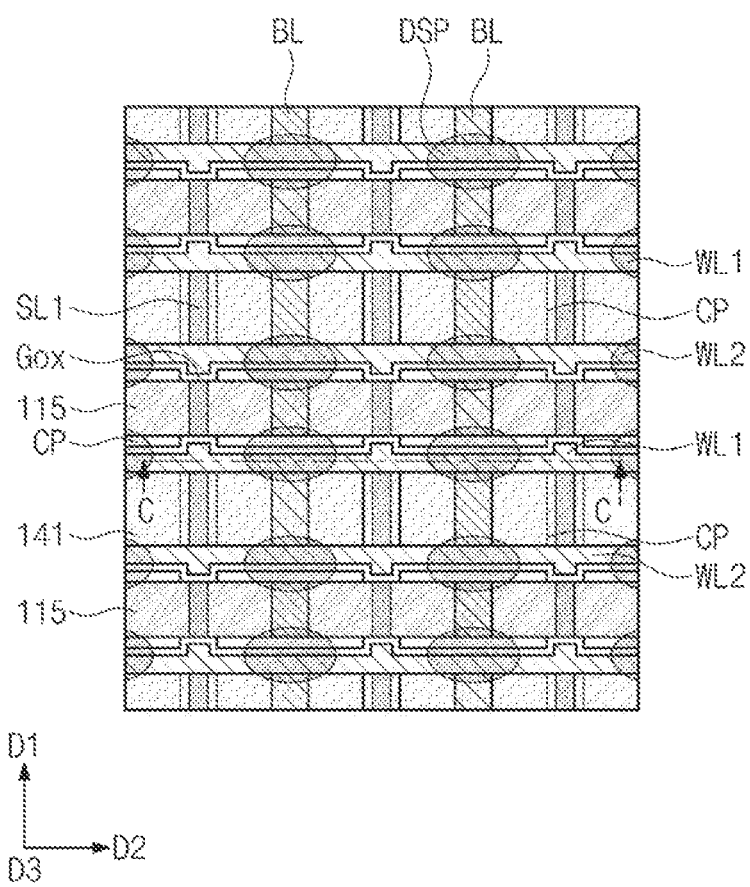
FIG. 8A is a plan view of a semiconductor memory device according to an embodiment.
Figure 8B:
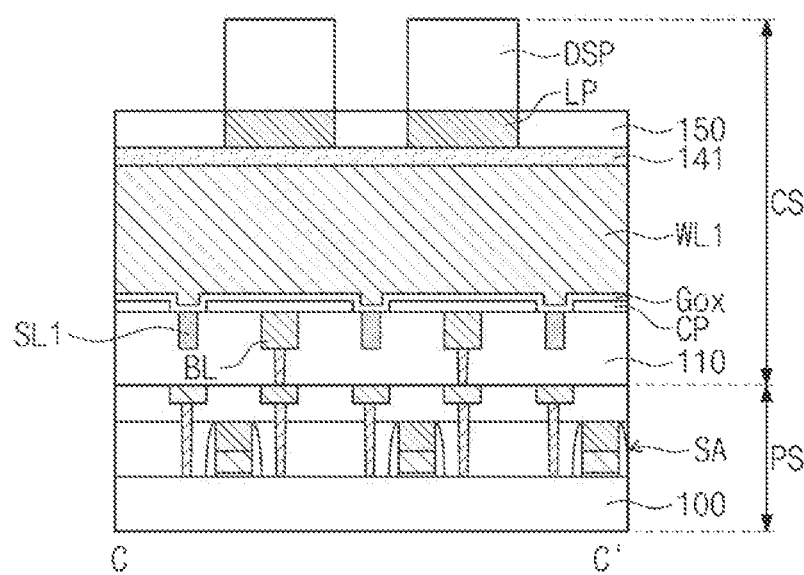
FIG. 8B is a sectional view, which is taken along a line C-C' of FIG. 8A to illustrate a semiconductor memory device according to an embodiment.

FIG. 8A is a plan view of a semiconductor memory device according to an embodiment. FIG. 8B is a sectional view, which is taken along a line C-C' of FIG. 8A to illustrate a semiconductor memory device according to an embodiment.

Referring to FIGS. 8A and 8B, first shielding structures or first air gaps SL1 may be provided between adjacent bit lines BL. The first shielding structures SL1 or the first air gaps SL1 may be extended parallel to the bit lines BL in the first direction D1. The first shielding structures SL1 may be formed of or include at least one of conductive materials (e.g., metallic materials). In the case where the first shielding structures SL1 are formed between the bit lines BL, the formation of the first shielding structures SL1 may include forming a gap region in an insulating layer between bit lines BL, after the formation of the bit lines BL, and then filling the gap region of the insulating layer with a conductive material. In the case where the first air gaps SL1 are formed between the bit lines BL, the formation of the first air gaps SL1 may include filling spaces between the bit lines BL with an insulating material, using a deposition method having a poor step-coverage property, after the formation of the bit lines BL.

Figure 9A:
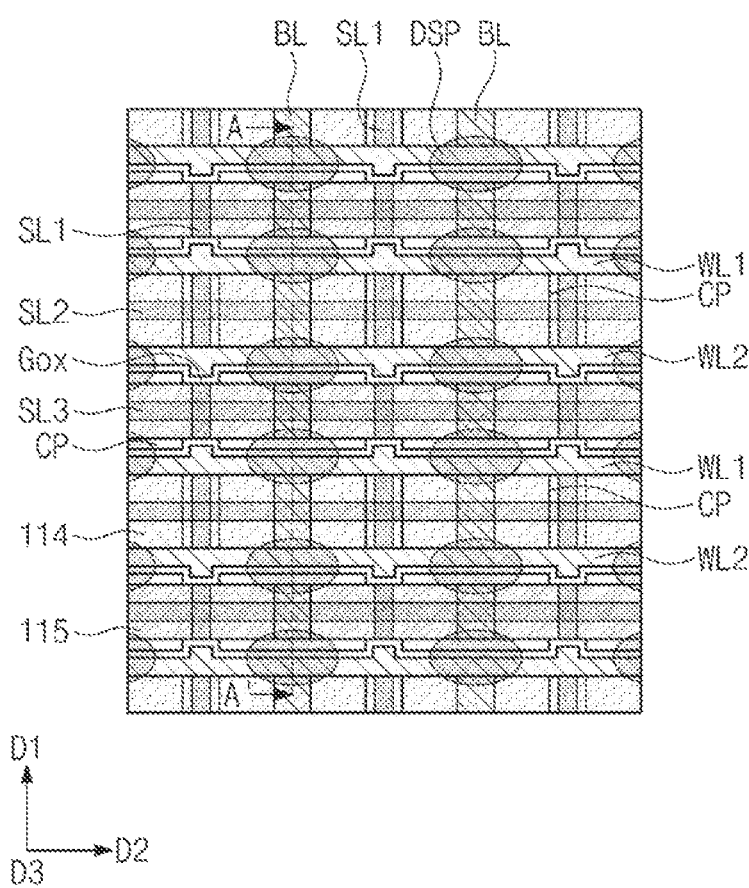
FIG. 9A is a plan view of a semiconductor memory device according to an embodiment.
Figure 9B:
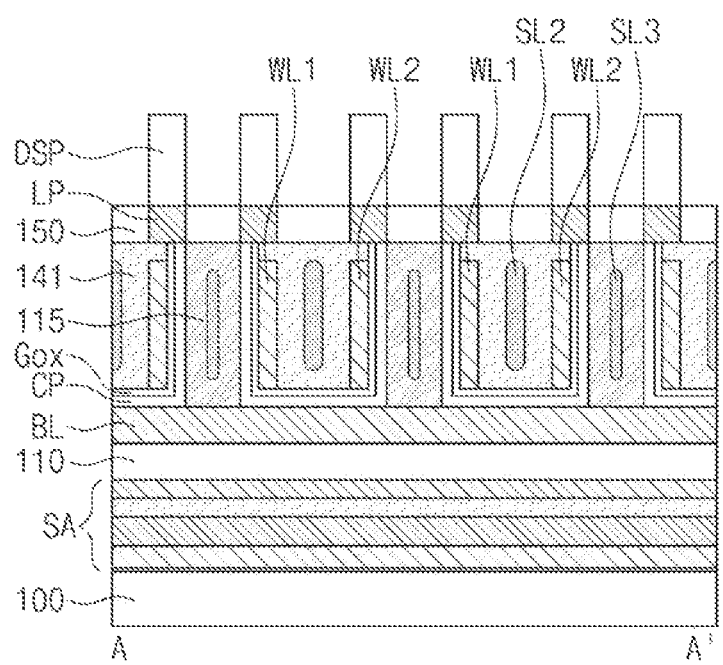
FIG. 9B is a sectional view, which is taken along a line A-A' of FIG. 9A to illustrate a semiconductor memory device according to an embodiment.

FIG. 9A is a plan view of a semiconductor memory device according to an embodiment. FIG. 9B is a sectional view, which is taken along a line A-A' of FIG. 9A to illustrate a semiconductor memory device according to an embodiment.

Referring to FIGS. 9A and 9B, second shielding structures or second air gaps SL2 may be respectively provided between adjacent first and second word lines WL1 and WL2. The second shielding structures or second air gaps SL2 may be extended parallel to the first and second word lines WL1 and WL2 in the second direction D2. In addition, third shielding structures or third air gaps SL3 may be respectively provided between adjacent channel patterns CP. The third shielding structures or third air gaps SL3 may be extended in the second direction D2 to be parallel to each other.

The second shielding structures SL2 may be locally formed in the second insulating patterns 141 by forming a gap region in an insulating layer, when the second insulating patterns 141 are formed after the formation of the first and second word lines WL1 and WL2, and then filling the gap region of the insulating layer with a conductive material. The third shielding structures SL3 may be locally formed in the first insulating patterns 115 by forming a gap region in an insulating layer, when the first insulating patterns 115 are formed, and then filling the gap region of the insulating layer with a conductive material.

The second air gaps SL2 may be locally formed in the second insulating patterns 141 by depositing an insulating layer using a deposition method having a poor step-coverage property, when the second insulating patterns 141 are formed. The third air gaps SL3 may be locally formed in the second insulating patterns 141 by depositing an insulating layer using a deposition method having a poor step-coverage property, when the first insulating patterns 115 are formed.

Figure 10A:
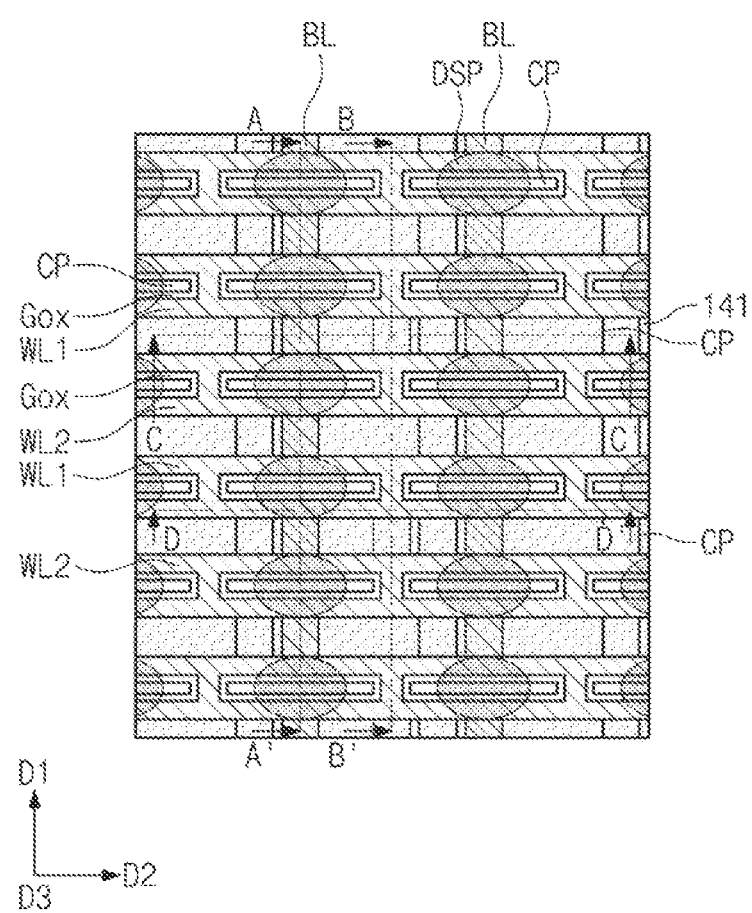
FIG. 10A is a plan view of a semiconductor memory device according to an embodiment.
Figure 10B:
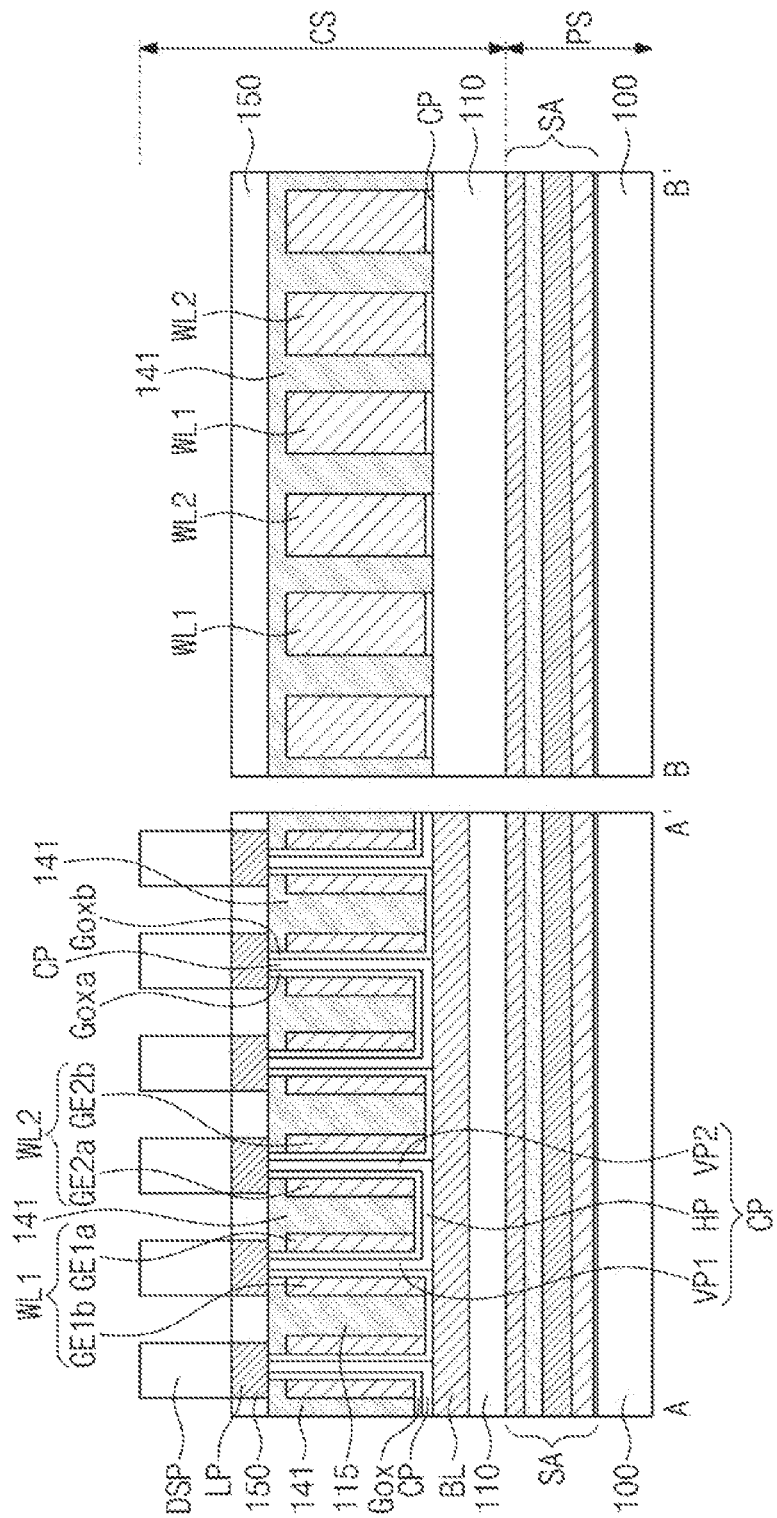
FIGS. 10B and 10C are sectional views, which are respectively taken along lines A-A', B-B' C-C', and D-D' of FIG. 10A to illustrate a semiconductor memory device according to an embodiment.
Figure 10C:
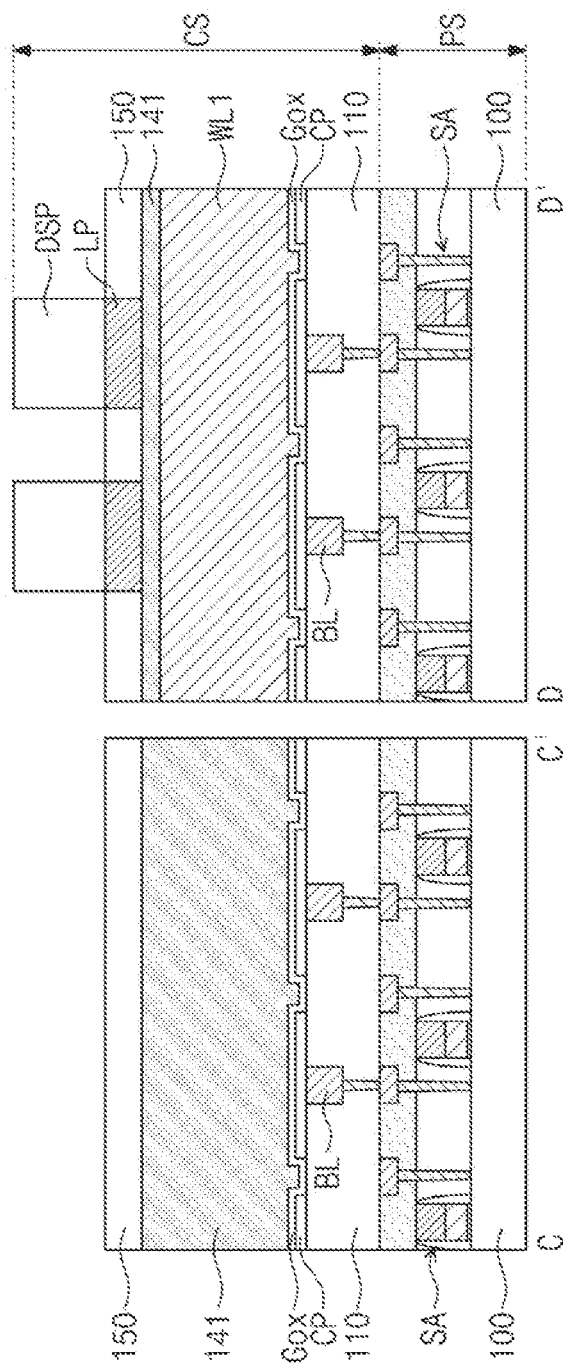

FIG. 10A is a plan view of a semiconductor memory device according to an embodiment. FIGS. 10B and 10C are sectional views, which are respectively taken along lines A-A', B-B' C-C', and D-D' of FIG. 10A to illustrate a semiconductor memory device according to an embodiment Referring to FIGS. 10A and 10B, the bit lines BL extending in the first direction D1 may be disposed on the lower insulating layer 110 of the peripheral circuit structure PS.

The channel patterns CP may be disposed on the bit lines BL. The channel patterns CP, which are disposed on each of the bit lines BL, may be spaced apart from each other in the first direction D1. In other words, the channel patterns CP may be two-dimensionally arranged in two different directions (e.g., the first and second directions D1 and D2).

Each of the channel patterns CP may include the horizontal portion HP, which is disposed on the bit line BL, and the first and second vertical portions VP1 and VP2, which are vertically extended from the horizontal portion HP to face each other in the first direction D1, as described above.

The first and second word lines WL1 and WL2 may be extended in the second direction D2 to cross the bit lines BL and may be alternately arranged in the first direction D1. Each of the first word lines WL1 may be extended to cover the first vertical portions VP1 of the channel patterns CP, which are arranged in the second direction D2. Each of the second word lines WL2 may be extended to cover the second vertical portions VP2 of the channel patterns CP, which are arranged in the second direction D2.

In an embodiment, each of the first word lines WL1 may include first inner and outer gate electrodes GE1a and GE1b, and each of the second word lines WL2 may include second inner and outer gate electrodes GE2a and GE2b.

The first inner gate electrode GE1a may be adjacent to the inner side surface of the first vertical portion VP1 of the channel pattern CP, and the first outer gate electrode GE1b may be adjacent to the outer side surface of the first vertical portion VP1. The second inner gate electrode GE2a may be adjacent to the inner side surface of the second vertical portion VP2 of the channel pattern CP, and the second outer gate electrode GE2b may be adjacent to the outer side surface of the second vertical portion VP2.

Each of the first vertical portions VP1 may be disposed between the first inner gate electrode GE1a and the first outer gate electrode GE1b, and each of the second vertical portions VP2 may be disposed between the second inner gate electrode GE2a and the second outer gate electrode GE2b. In other words, the semiconductor memory device may have a double gate transistor structure.

An inner gate insulating pattern Goxa may cover the inner side surface of the channel pattern CP with a uniform thickness, and an outer gate insulating pattern Goxb may cover the outer side surface of the channel pattern CP with a uniform thickness. In detail, the inner gate insulating pattern Goxa may be interposed between the bottom surfaces of the first and second inner gate electrodes GE1a and GE2a and the horizontal portion HP of the channel pattern CP, between the outer side surface of the first inner gate electrode GE1a and the first vertical portion VP1, and between the outer side surface of the second inner gate electrode GE2a and the second vertical portion VP2. The outer gate insulating pattern Goxb may be interposed between the bottom surfaces of adjacent ones of the first and second outer gate electrodes GE1b and GE2b and the bit line BL, between a side surface of the first outer gate electrode GE1b and the first vertical portion VP1, and between a side surface of the second outer gate electrode GE2b and the second vertical portion VP2. The outer gate insulating pattern Goxb may be in contact with the bit line BL, between adjacent ones of the first and second outer gate electrodes GE1b and GE2b.

The first inner and outer gate electrodes GE1a and GE1b may be connected to each other, between the first vertical portions VP1 arranged in the second direction D2. The second inner and outer gate electrodes GE2a and GE2b may be connected to each other, between the second vertical portions VP2 arranged in the second direction D2.

The insulating patterns 141 may be provided to fill spaces between the first and second inner gate electrodes GE1a and GE2a and between the first and second outer gate electrodes GE1b and GE2b. Top surfaces of the insulating patterns 141 may be located at substantially the same level as the top surfaces of the first and second vertical portions VP1 and VP2.

The landing pads LP and the data storage patterns DSP may be respectively disposed on the first and second vertical portions VP1 and VP2 of the channel patterns CP. Each of the data storage patterns DSP may be overlapped with the first inner and outer gate electrodes GE1a and GE1b or may be overlapped with the second inner and outer gate electrodes GE2a and GE2b.

The landing pads LP and the data storage patterns DSP may be disposed on centers of the first and second vertical portions VP1 and VP2 to form a matrix-shaped arrangement, when viewed in a plan view.

Figure 11:
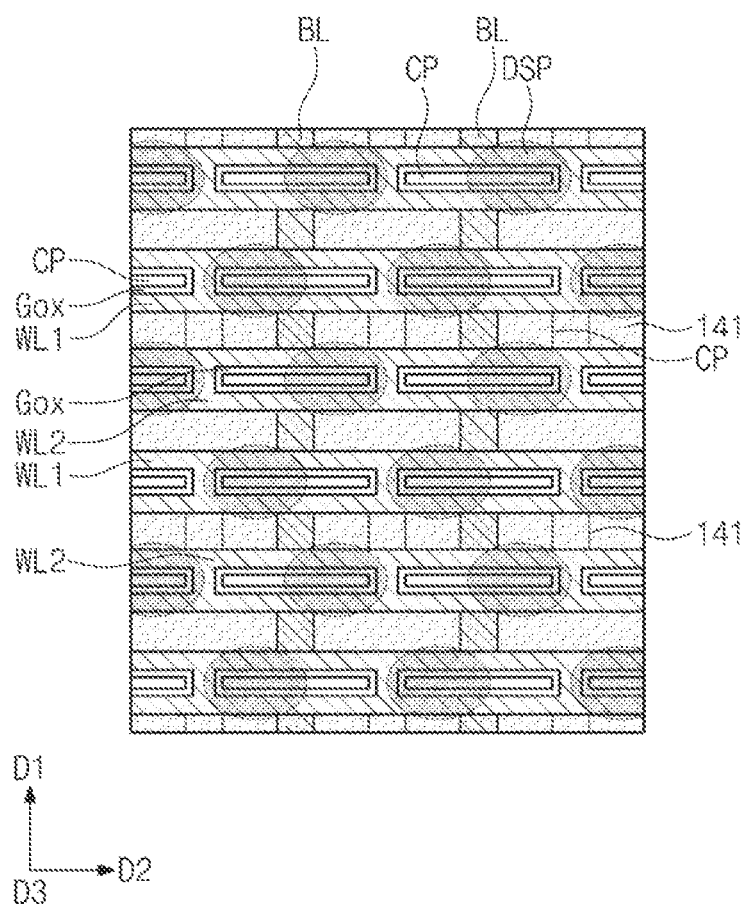
FIG. 11 is a plan view of a semiconductor memory device according to an embodiment.

FIG. 11 is a plan view of a semiconductor memory device according to an embodiment.

In the embodiment shown in FIG. 11, the landing pads LP and the data storage patterns DSP may be electrically connected to the first and second vertical portions VP1 and VP2 but may be disposed at positions that are shifted from the centers of the first and second vertical portions VP1 and VP2. For example, the landing pads LP and the data storage patterns DSP may be arranged in a zigzag or honeycomb shape.

Figure 12A:
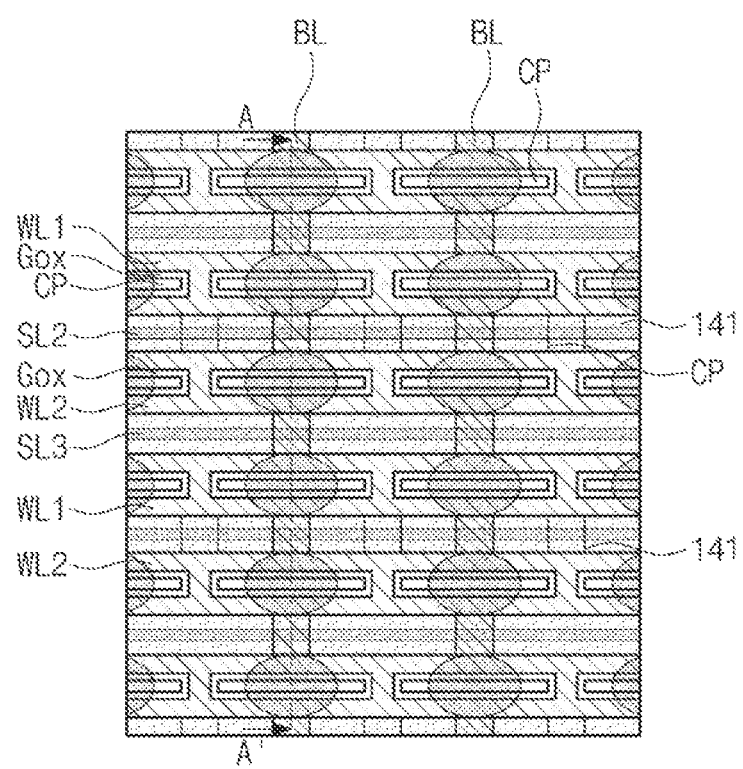
FIG. 12A is a plan view of a semiconductor memory device according to an embodiment.
Figure 12B:
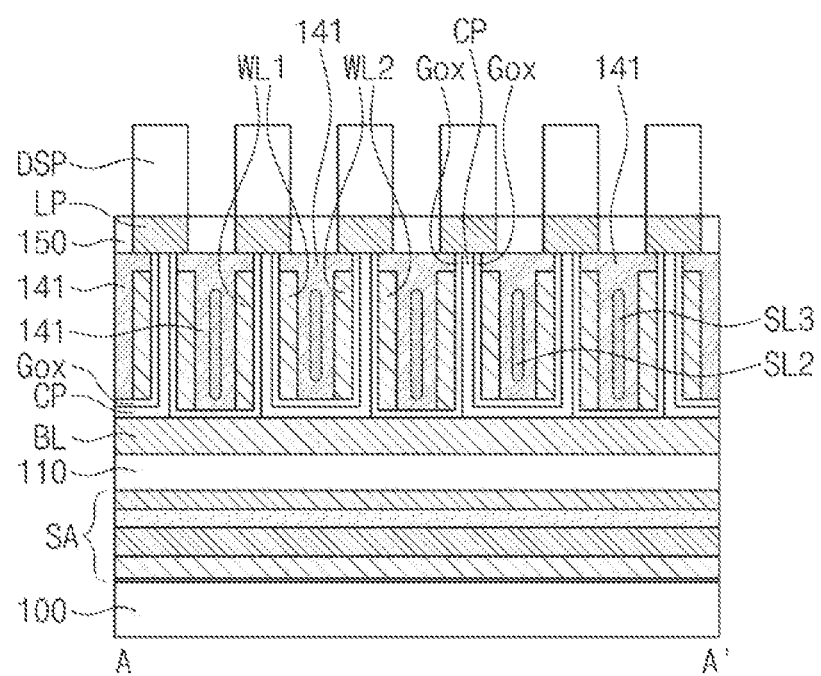
FIG. 12B is a sectional view, which is taken along a line A-A' of FIG. 12A to illustrate a semiconductor memory device according to an embodiment.

FIG. 12A is a plan view of a semiconductor memory device according to an embodiment. FIG. 12B is a sectional view, which is taken along a line A-A' of FIG. 12A to illustrate a semiconductor memory device according to an embodiment.

Referring to FIGS. 12A and 12B, the second shielding structures SL2 or the second air gaps SL2 extending in the second direction D2 may be respectively provided between adjacent ones of the first and second inner gate electrodes GE1a and GE2a in the embodiment described with reference to FIGS. 10A, 10B, and 10C.

In addition, the third shielding structures SL3 or the third air gaps SL3 extending in the second direction D2 may be respectively provided between adjacent ones of the first and second outer gate electrodes GE1b and GE2b.

The second and third shielding structures or the second and third air gaps in the embodiments of FIGS. 12A and 12B may be formed by substantially the same method as that for the shielding structures previously described with reference to FIGS. 9A and 9B.

Figure 13A:
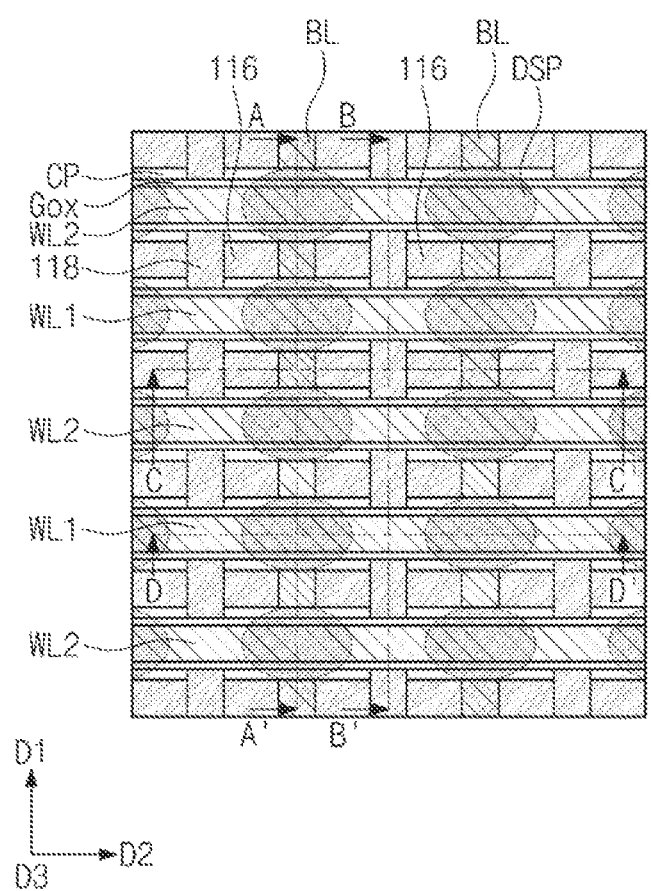
FIG. 13A is a plan view of a semiconductor memory device according to an embodiment.
Figure 13B:
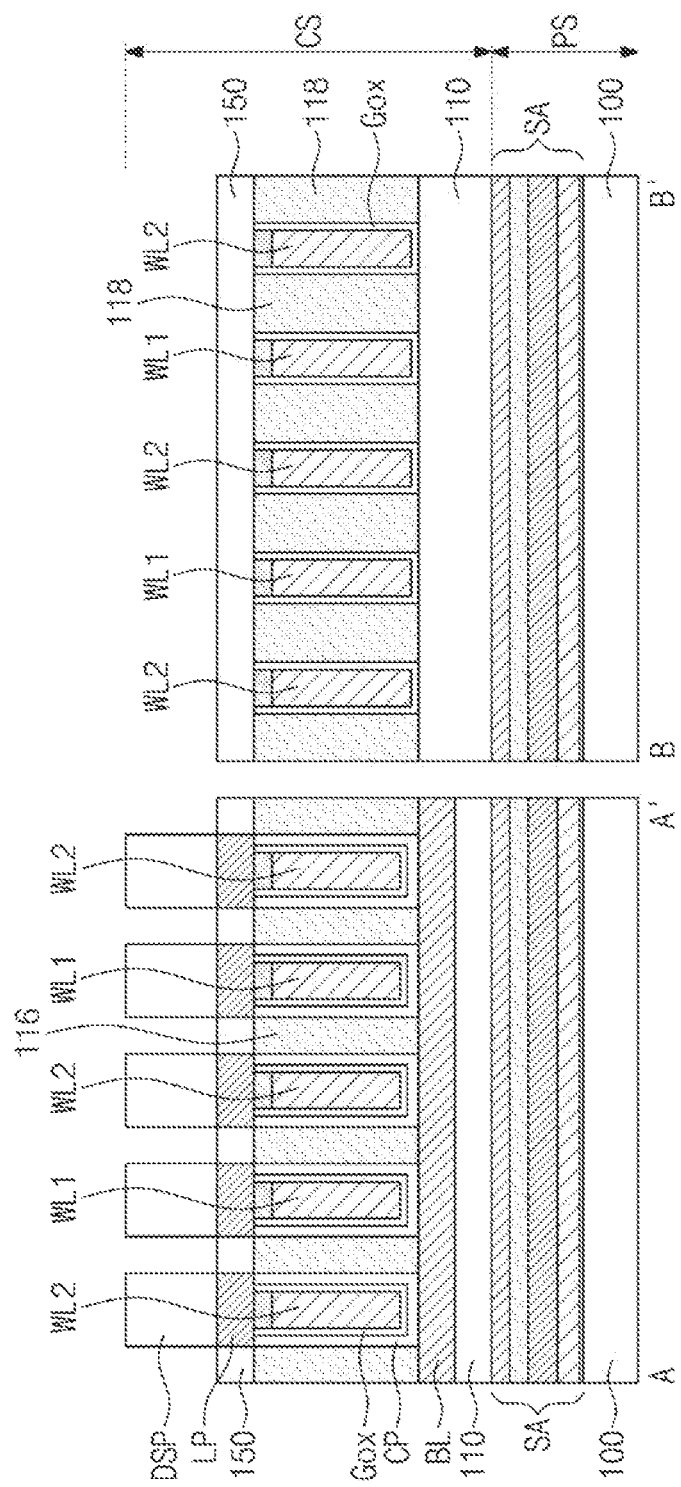
FIGS. 13B and 13C are sectional views, which are respectively taken along lines A-A', B-B' C-C', and D-D' of FIG. 13A to illustrate a semiconductor memory device according to an embodiment.
Figure 13C:
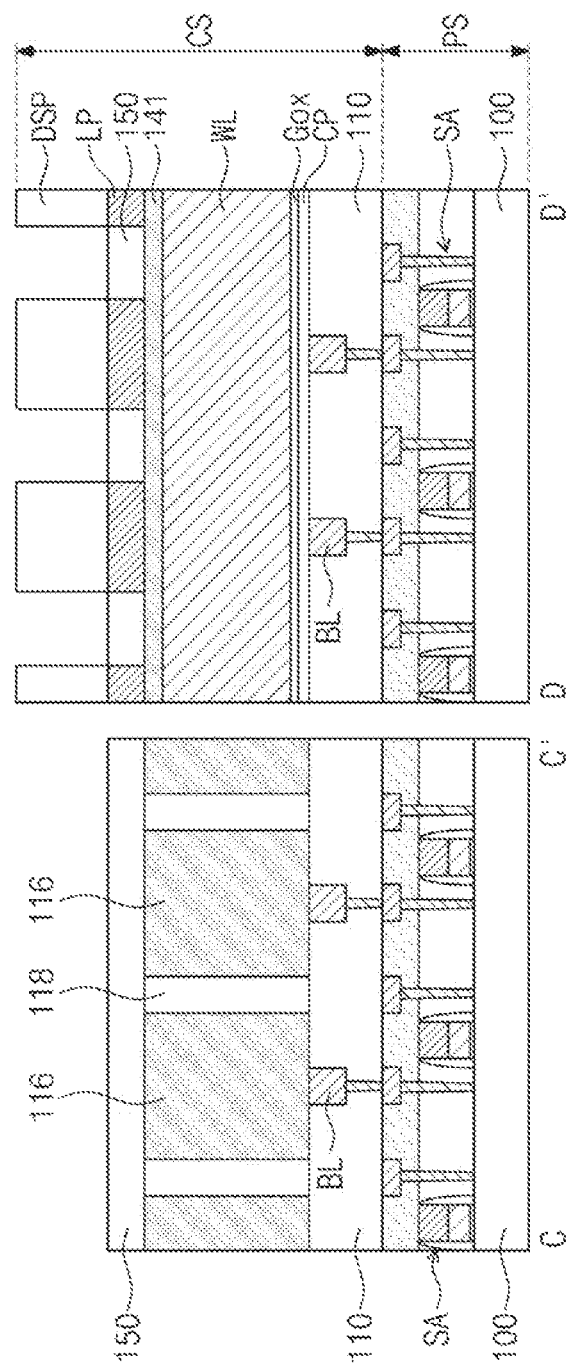

FIG. 13A is a plan view of a semiconductor memory device according to an embodiment. FIGS. 13B and 13C are sectional views, which are respectively taken along lines A-A', B-B' C-C', and D-D' of FIG. 13A to illustrate a semiconductor memory device according to an embodiment Referring to FIGS. 13A, 13B, and 13C, the bit lines BL may be extended in the first direction D1, on the peripheral circuit structure, and may be spaced apart from each other in the second direction D2.

The first and second word lines WL1 and WL2 may be extended in the second direction D2, on the bit lines BL. The first and second word lines WL1 and WL2 may be alternately arranged in the first direction D1. Here, a width of each of the first and second word lines WL1 and WL2 may be larger than half a distance between the first and second vertical portions VP1 and VP2 of each channel pattern CP (see, e.g., FIG. 13B).

The channel patterns CP may be respectively disposed between the first and second word lines WL1 and WL2 and the bit lines BL. The channel patterns CP on each bit line may be spaced apart from each other in the first direction D1. Each of the channel patterns CP may include the first and second vertical portions VP1 and VP2, which face each other, and the horizontal portion HP, which connects the first and second vertical portions VP1 and VP2 to each other, as described above. The horizontal portion HP may be in contact with the top surface of the bit line, and the first and second vertical portions VP1 and VP2 may each be adjacent to a respective side surface of the first or second word line WL1 or WL2. The insulating pattern 141 may be disposed on the top surface of each of the first and second word lines WL1 and WL2. The top surfaces of the first and second word lines WL1 and WL2 may be located at a level lower than the top surfaces of the first and second vertical portions VP1 and VP2 of the channel patterns CP. According to an embodiment, the channel regions of the first and second vertical portions VP1 and VP2 of each channel pattern CP may be controlled in common by the first or second word line WL1 or WL2.

The gate insulating pattern Gox may be interposed between the channel pattern CP and the side and bottom surfaces of each of the first and second word lines WL1 and WL2. The gate insulating pattern Gox may be in direct contact with the side and bottom surfaces of each of the first and second word lines WL1 and WL2.

The channel patterns CP may be spaced apart from each other in the first direction D1 by third insulating patterns 116 and may be spaced apart from each other in the second direction D2 by fourth insulating patterns 118. The top surfaces of the first and second vertical portions VP1 and VP2 of the channel patterns CP may be located at substantially the same level as the top surfaces of the third and fourth insulating patterns 116 and 118.

The landing pads LP may be provided on the channel patterns CP, respectively, and each of the landing pads LP may be coupled in common to the first and second vertical portions VP1 and VP2.

The data storage patterns DSP may be disposed on the landing pads LP, respectively, and each of the data storage patterns DSP may be coupled in common to a corresponding one of the first and second vertical portions VP1 and VP2 of the channel pattern CP through the landing pad LP. When viewed in a plan view, the data storage patterns DSP may be respectively disposed at intersections of the first and second word lines WL1 and WL2 with the bit lines BL. For example, the data storage patterns DSP may be arranged in the first and second directions D1 and D2 or in the matrix shape.

Figure 14:
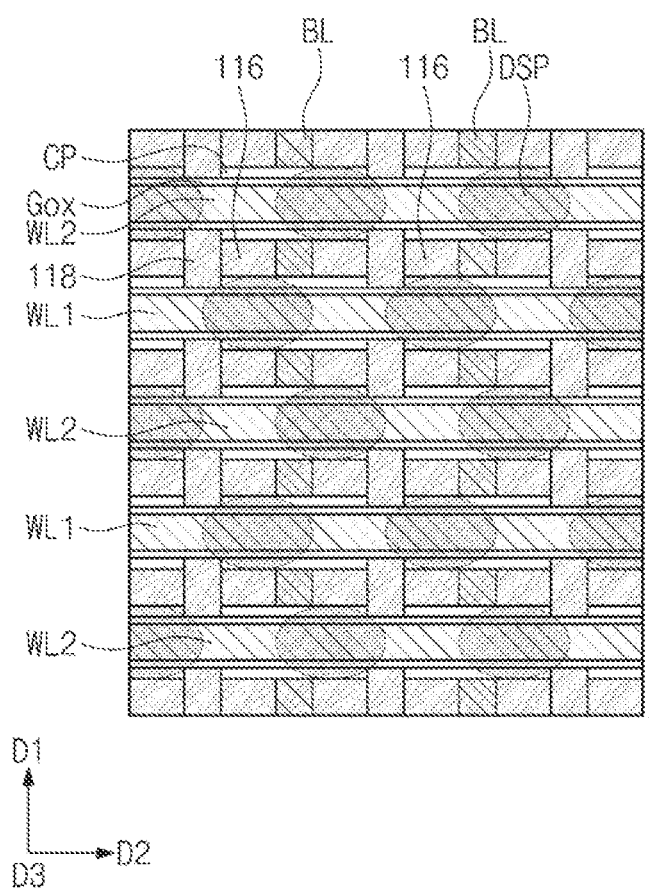
FIG. 14 is a plan view of a semiconductor memory device according to an embodiment.

FIG. 14 is a plan view of a semiconductor memory device according to an embodiment.

As shown in FIG. 14, the data storage patterns DSP may be arranged in the zigzag or honeycomb shape, when viewed in a plan view.

Figure 15A:
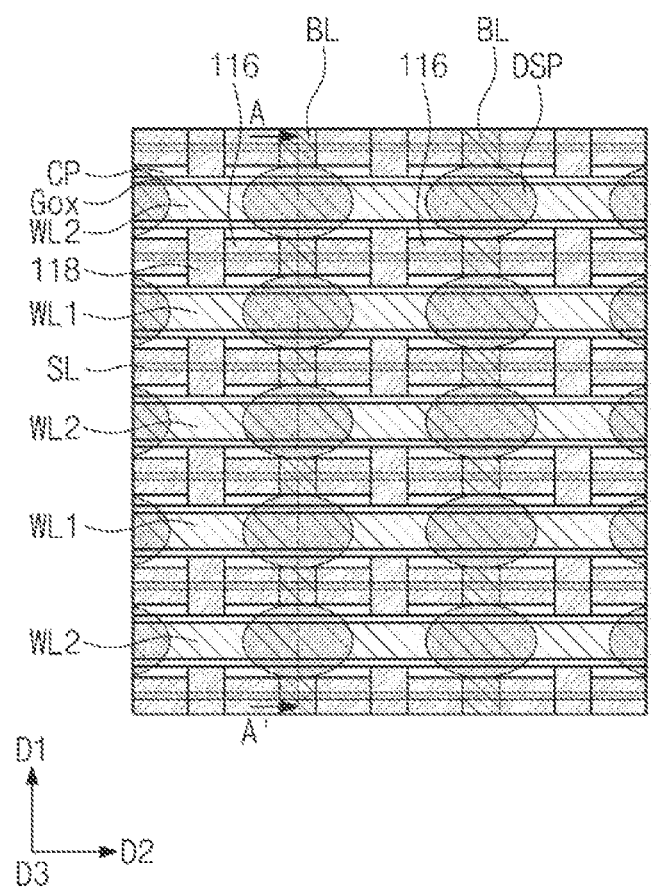
FIG. 15A is a plan view of a semiconductor memory device according to an embodiment.
Figure 15B:
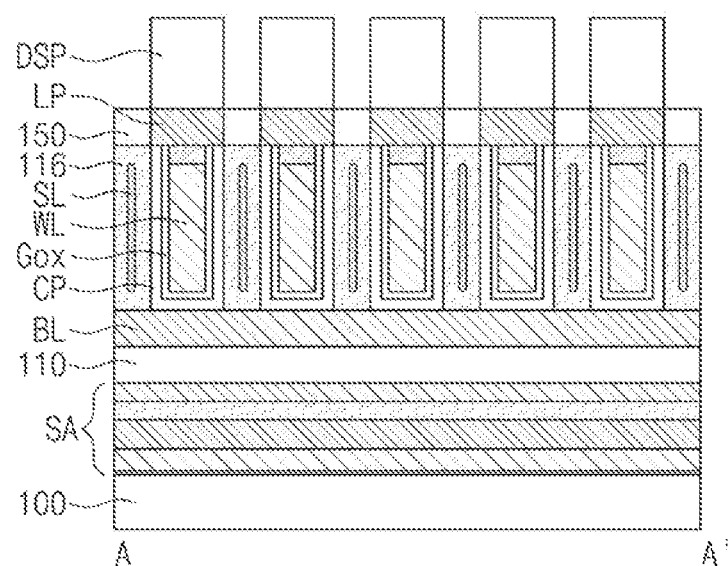
FIG. 15B is a sectional view, which is taken along a line A-A' of FIG. 15A to illustrate a semiconductor memory device according to an embodiment.

FIG. 15A is a plan view of a semiconductor memory device according to an embodiment. FIG. 15B is a sectional view, which is taken along a line A-A' of FIG. 15A to illustrate a semiconductor memory device according to an embodiment.

Referring to FIGS. 15A and 15B, shielding structures SL or air gaps SL extending in the second direction D2 may be respectively provided between adjacent ones of the first and second word lines WL1 and WL2 in the embodiment described with reference to FIGS. 13A, 13B, and 13C. The shielding structures or air gaps SL may be locally provided in the third and fourth insulating patterns 116 and 118.

Figure 16:
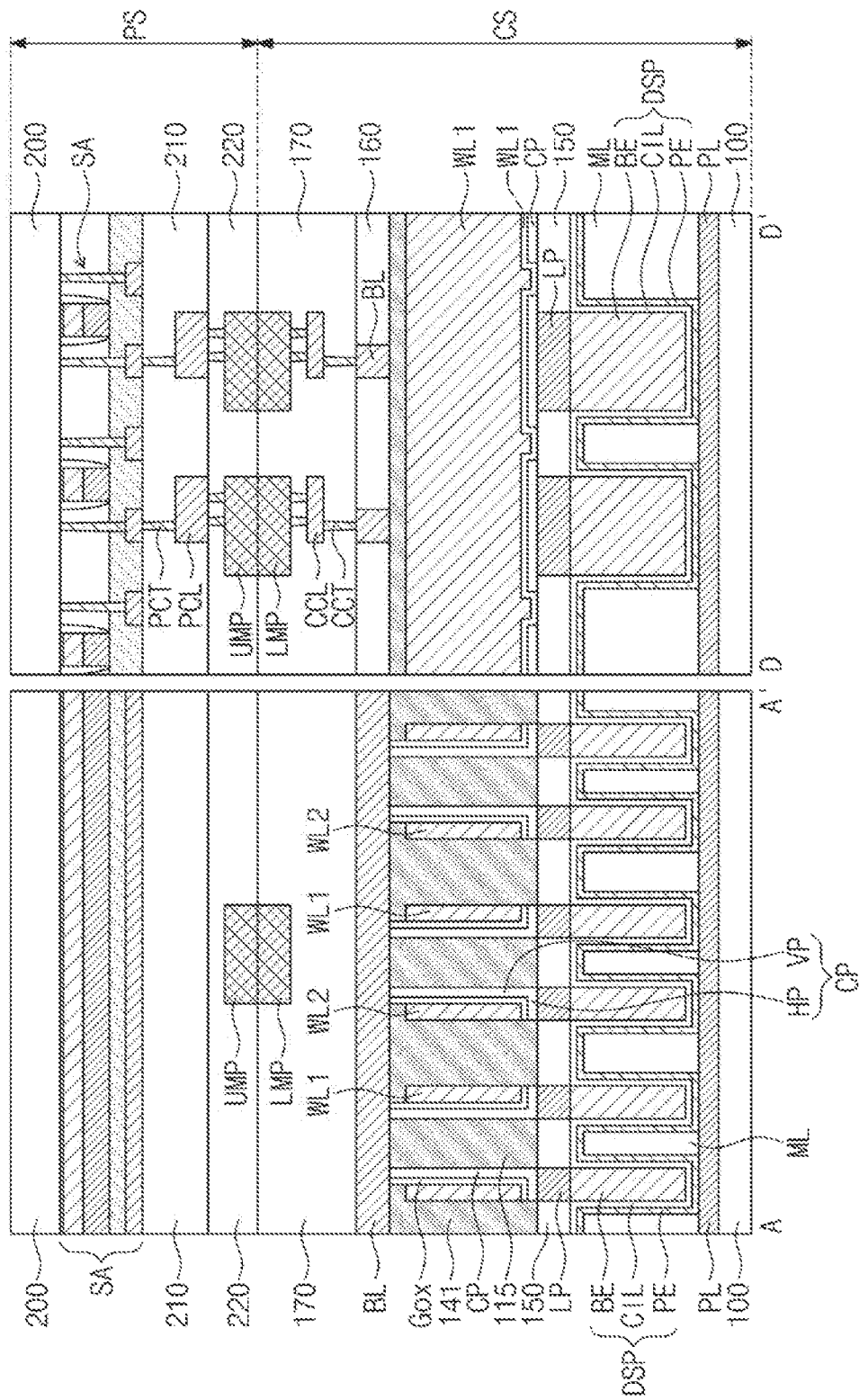
FIG. 16 is a sectional view, which is taken along lines A-A', and D-D' of FIG. 4A to illustrate a semiconductor memory device according to an embodiment.

FIG. 16 is a sectional view, which is taken along lines A-A', and D-D' of FIG. 4A to illustrate a semiconductor memory device according to an embodiment.

Referring to FIG. 16, the semiconductor memory device may include the cell array structure CS including the lower metal pads LMP, which are provided at the highest level thereof, and the peripheral circuit structure PS including the upper metal pads UMP, which are provided at the highest level thereof. Here, the lower metal pads LMP of the cell array structure CS may be electrically and physically connected to the upper metal pads UMP of the peripheral circuit structure PS, respectively, in a bonding manner. The lower and upper metal pads LMP and UMP may be formed of or include at least one of metallic materials (e.g., copper (Cu)).

In detail, the cell array structure CS may include the data storage patterns DSP, which are provided on the first semiconductor substrate 100, the first and second word lines WL1 and WL2, which are provided on the data storage patterns DSP, are extended in the second direction D2, and are alternately arranged in the first direction D1, the bit lines BL, which are provided on the first and second word lines WL1 and WL2, are extended in the first direction D1, and are spaced apart from each other in the second direction D2, and the lower metal pads LMP, which are electrically connected to the bit lines BL.

In more detail, a plate conductive layer PL may be disposed on the first semiconductor substrate 100, and a mold layer ML may be disposed on the plate conductive layer PL. The mold layer ML may have mold openings, which are separated from each other in the first and second directions D1 and D2.

Each of the data storage patterns DSP may include a plate electrode PE, which is provided to conformally cover a surface of the mold layer ML with the mold openings, a capacitor dielectric layer CIL, which is provided to conformally cover a surface of the plate electrode PE, and storage electrodes BE, which are respectively provided in the mold openings provided with the plate electrode PE and the capacitor dielectric layer CIL.

The landing pads LP may be disposed on the storage electrodes BE, respectively, and the interlayer insulating layer 150 may be provided to fill a space between the landing pads LP.

The first and second word lines WL1 and WL2 may be respectively disposed on the landing pads LP, which are arranged in the second direction D2. The first and second word lines WL1 and WL2 may be extended in the second direction D2 and may be spaced apart from each other in the first direction D1, as described above.

The channel patterns CP may be respectively disposed on the landing pads LP, and each of the channel patterns CP may include the horizontal portion HP, which is in contact with the landing pad LP, and a vertical portion VP, which is vertically extended from the horizontal portion HP and is adjacent to the outer side surface of the first or second word line WL1 or WL2. The channel patterns CP may be spaced apart from each other in the first and second directions D1 and D2, and a pair of the channel patterns CP, which are adjacent to each other in the first direction D1, may be disposed to be mirror symmetric with respect to each other.

Each of the bit lines BL may be in contact with the top surfaces of the vertical portions VP of the channel patterns CP, which are arranged in the first direction D1. The bit lines BL may be electrically connected to the lower metal pads LMP through cell interconnection lines CCL and cell contact plugs CCT. The lower metal pads LMP may be disposed in the topmost insulating layer 170 of the cell array structure CS.

In the case where, as described above, the bit lines BL are provided at a level higher than the first and second word lines WL1 and WL2, copper lines, which are formed by a damascene process, may be used as the bit lines BL. In this case, it may be possible to improve electric resistance of the bit lines BL.

The peripheral circuit structure PS may include the core and peripheral circuits SA, which are integrated on the second semiconductor substrate 200, peripheral contact plugs PCT and peripheral interconnection lines PCL, which are electrically connected to the core and peripheral circuits SA, and the upper metal pads UMP, which are electrically connected to the peripheral interconnection lines PCL. The upper metal pads UMP may be disposed in the topmost insulating layer 220 of the peripheral circuit structure PS.

Figure 17A:
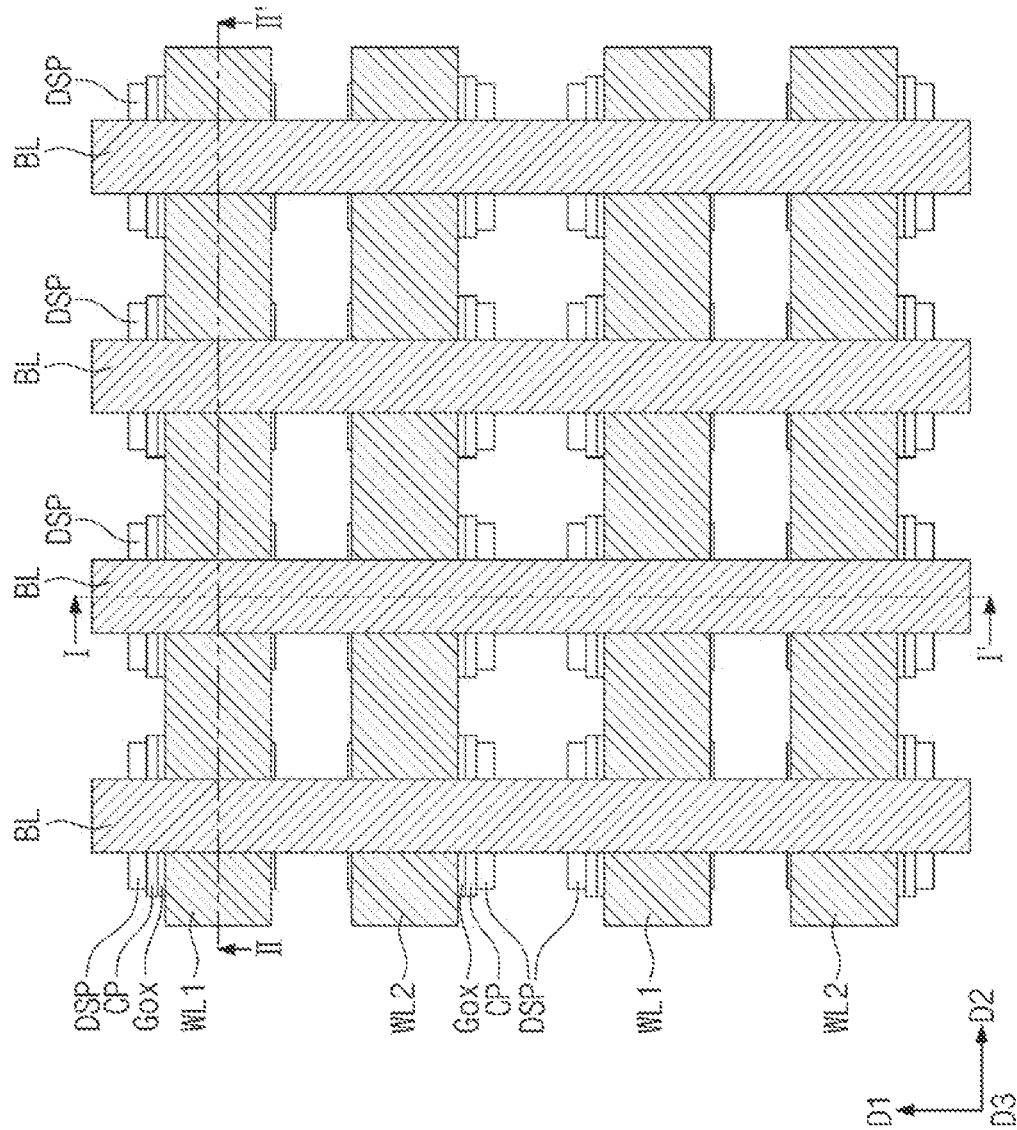
FIG. 17A is a plan view of a semiconductor memory device according to an embodiment.
Figure 17B:
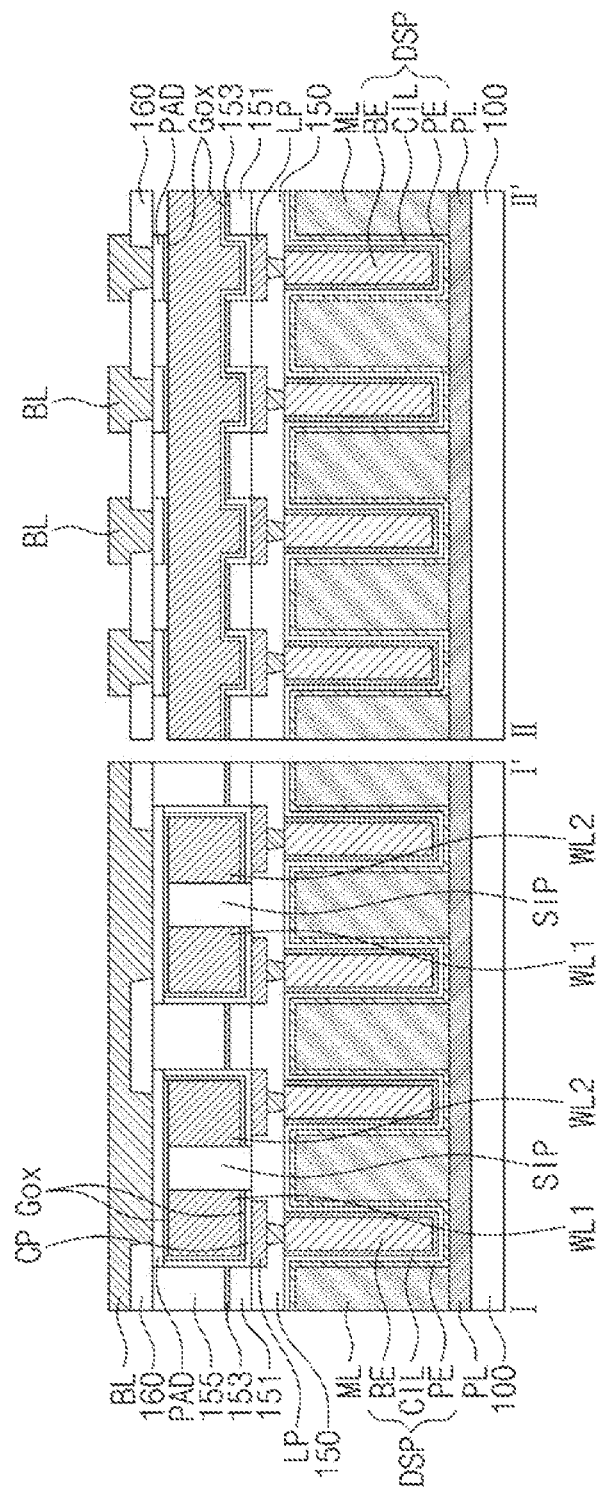
FIGS. 17B and 17C are sectional views, which are respectively taken along lines I-I' and II-II' of FIG. 17A to illustrate a semiconductor memory device according to an embodiment.
Figure 17C:
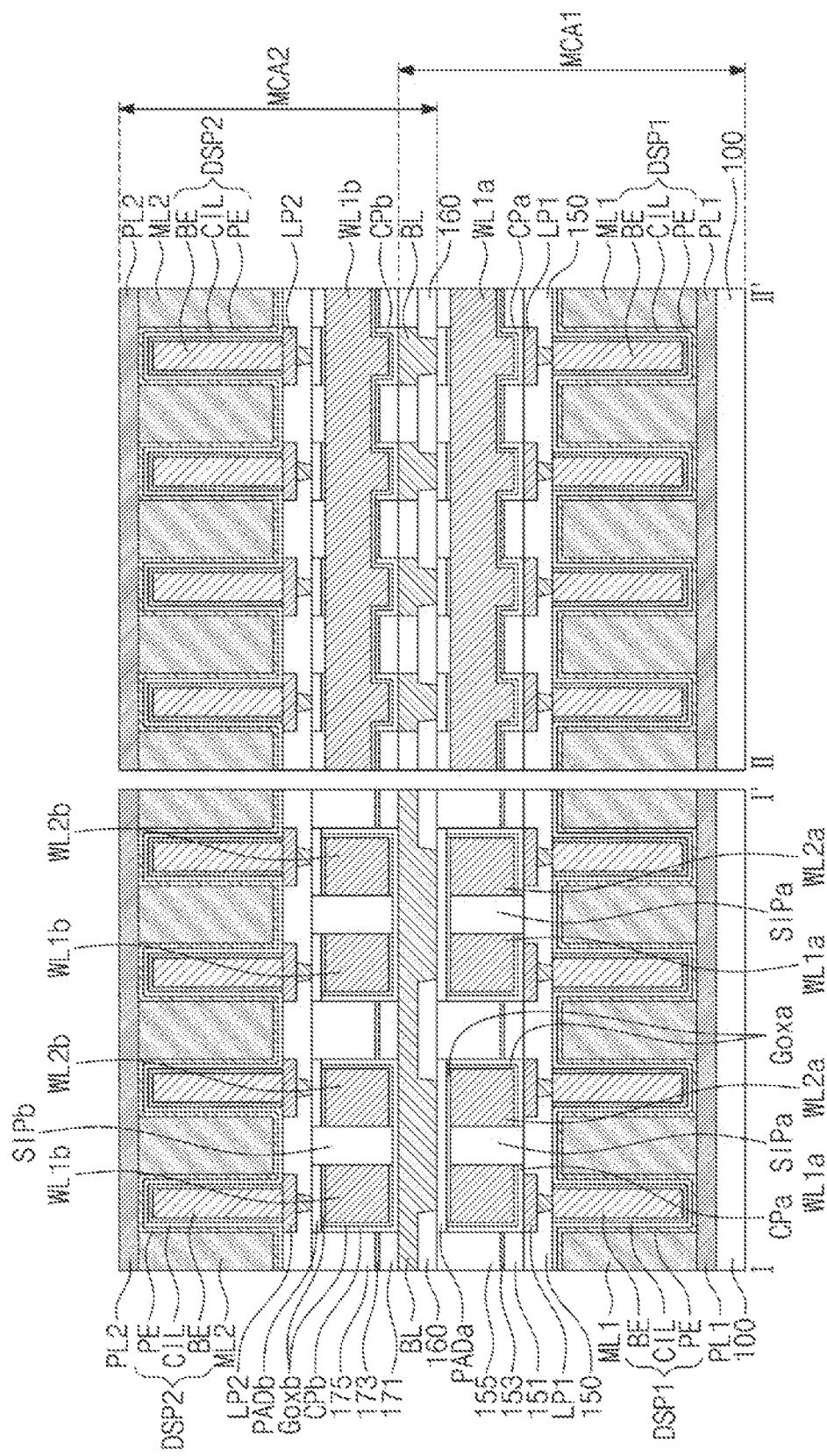

FIG. 17A is a plan view of a semiconductor memory device according to an embodiment. FIGS. 17B and 17C are sectional views, which are respectively taken along lines I-I' and II-II' of FIG. 17A to illustrate a semiconductor memory device according to an embodiment.

Referring to FIGS. 17A and 17B, the plate conductive layer PL may be disposed on the semiconductor substrate 100, and the mold layer ML may be disposed on the plate conductive layer PL. The mold layer ML may have mold openings, which are separated from each other in the first and second directions D1 and D2.

Each of the data storage patterns DSP may include the plate electrode PE, which is provided to conformally cover a surface of the mold layer ML with the mold openings, the capacitor dielectric layer CIL, which is provided to conformally cover a surface of the plate electrode PE, and the storage electrodes BE, which are respectively provided in the mold openings provided with the plate electrode PE and the capacitor dielectric layer CIL.

The landing pads LP may be disposed on the storage electrodes BE, respectively, and the interlayer insulating layer 150 may be provided to fill a space between the landing pads LP. The landing pads LP may be in direct contact with the storage electrodes BE and may be connected to the storage electrodes BE through contact plugs.

The first and second word lines WL1 and WL2 may be respectively disposed on the landing pads LP, which are arranged in the second direction D2. The first and second word lines WL1 and WL2 may be extended in the second direction D2 and may be spaced apart from each other in the first direction D1, as described above.

A separation insulating pattern SIP may be disposed between adjacent ones of the first and second word lines WL1 and WL2. The separation insulating pattern SIP may fill a space between adjacent ones of the gate insulating patterns Gox and the channel patterns CP.

The channel patterns CP may be disposed on the landing pads LP, respectively, and each of the channel patterns CP may include the horizontal portion HP, which is in contact with the landing pad LP, and the vertical portion VP, which is vertically extended from the horizontal portion HP and is adjacent to an outer side surface of the first or second word line WL1 or WL2.

In an embodiment, the channel patterns CP may be disposed in interlayer insulating patterns 151, 153, and 155, each of which is formed to have a trench extending in the second direction D2. The interlayer insulating patterns 151, 153, and 155 may include first, second, third insulating patterns 151, 153, and 155, which are sequentially stacked, and the second insulating pattern 153 may be formed of or include an insulating material that is chosen to have an etch selectivity with respect to the first and third insulating patterns 151 and 155.

The channel patterns CP may be spaced apart from each other in the first and second directions D1 and D2, and a pair of the channel patterns CP, which are adjacent to each other in the first direction D1, may be disposed to be mirror symmetric with respect to each other. The channel patterns CP, which are adjacent to each other in the second direction D2, may be spaced apart from each other by the second insulating layers 153. Each of the channel patterns CP may have an 'L'-shaped section in the first direction D1 and may have a shaped section in the second direction D2.

A channel pad PAD may cover the top surfaces of adjacent ones of the first and second word lines WL1 and WL2 in common. The channel pad PAD may be formed of or include the same material as the channel pattern CP. That is, the channel pad PAD may be formed of or include at least one of silicon, germanium, silicon-germanium, and oxide semiconductor materials. The top surface of the channel pad PAD may be located at substantially the same level as the top surfaces of the interlayer insulating pattern 155.

The gate insulating pattern Gox may conformally cover the bottom surfaces, the outer side surfaces, and the top surfaces of the first and second word lines WL1 and WL2. The gate insulating pattern Gox may be spaced apart from each other in the first direction D1, by the separation insulating pattern SIP.

The bit lines BL may be disposed on an upper interlayer insulating layer 160 covering the channel pads PAD and may be electrically connected to the channel pad PAD through bit line contact plugs, which are provided to penetrate the upper interlayer insulating layer 160. Each of the bit line contact plugs may be connected in common to a pair of the channel patterns CP through the channel pad PAD.

Referring to FIGS. 17A and 17C, a plurality of memory cell array layers MCA1 and MCA2 may be stacked on the semiconductor substrate 100. As an example, a second memory cell array layer MCA2 may be disposed on a first memory cell array layer MCA1, and in this case, the bit lines BL may be shared by the first and second memory cell array layers MCA1 and MCA2.

The first memory cell array layer MCA1 may include first data storage patterns DSP1, which are two-dimensionally arranged on a first plate conductive layer PL1, lower channel patterns CPa, which are respectively disposed on the first data storage patterns DSP1, first and second lower word lines WL1a and WL2a, which are provided on the first channel patterns CP1 and are extended in the second direction D2, and the bit lines BL, which are provided on the first and second lower word lines WL1a and WL2a and are extended in the first direction D1. In an embodiment, the first memory cell array layer MCA1 may have substantially the same structure as the semiconductor memory device described with reference to FIG. 17B. In the first memory cell array layer MCA1, the lower channel patterns CPa may be spaced apart from each other in the first and second directions D1 and D2. Each of the lower channel patterns CPa may have an 'L'-shaped section, in the first direction D1, and may have a 'U'-shaped section, in the second direction D2. A lower channel pad PADa may be disposed in common on the top surfaces of the first and second lower word lines WL1a and WL1b. A lower separation insulating pattern SIPa may be disposed between adjacent ones of the first and second lower word lines WL1a and WL2a.

The second memory cell array layer MCA2 may include second data storage patterns DSP2, which are two-dimensionally arranged on a second plate conductive layer PL2, upper channel patterns CPb, which are respectively disposed on the second data storage patterns DSP2, first and second upper word lines WL1b and WL2b, which are provided on the upper channel patterns CPb and are extended in the second direction D2, and the bit lines BL, which are provided on the first and second upper word lines WL1b and WL2b and are extended in the first direction D1. An upper separation insulating pattern SIPb may be disposed between adjacent ones of the first and second upper word lines WL1b and WL2b.

Upper channel pads PADb may be respectively disposed on the top surfaces of the first and second upper word lines WL1b and WL2b, and the upper channel pads PAD may be respectively and electrically connected to upper landing pads LP2.

The upper channel patterns CPb may include the horizontal portion HP covering the bottom surfaces of the first and second upper word lines WL1b and WL2b, which are adjacent to each other, in common.

FIGS. 18A to 23A are plan views illustrating a method of fabricating a semiconductor memory device according to an embodiment. FIGS. 18B to 23B and FIGS. 18C to 23C are sectional views illustrating a method of fabricating a semiconductor memory device according to an embodiment.

Figure 18A:
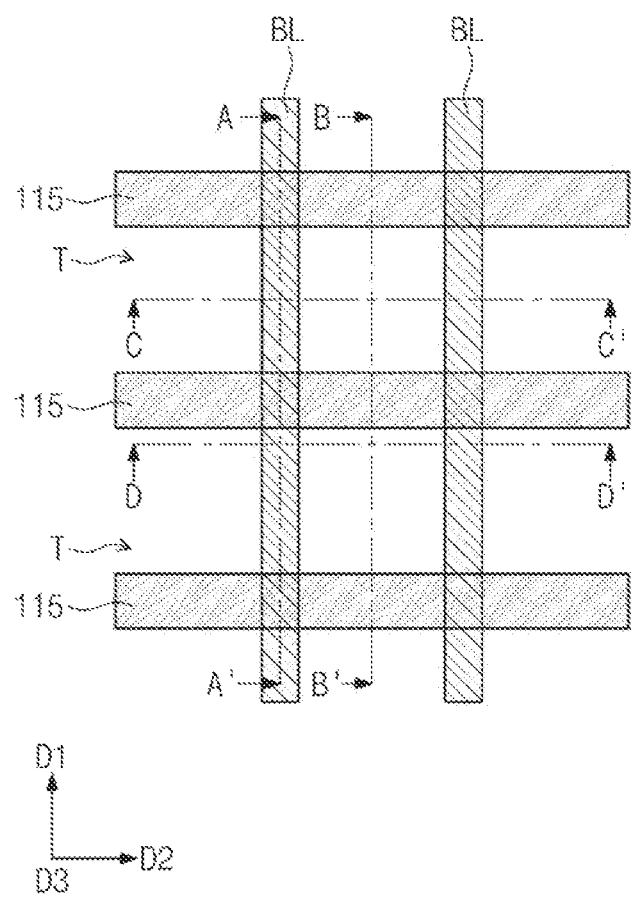
FIGS. 18A, 19A, 20A, 21A, 22A, and 23A are plan views illustrating a method of fabricating a semiconductor memory device according to an embodiment.
Figure 18B:
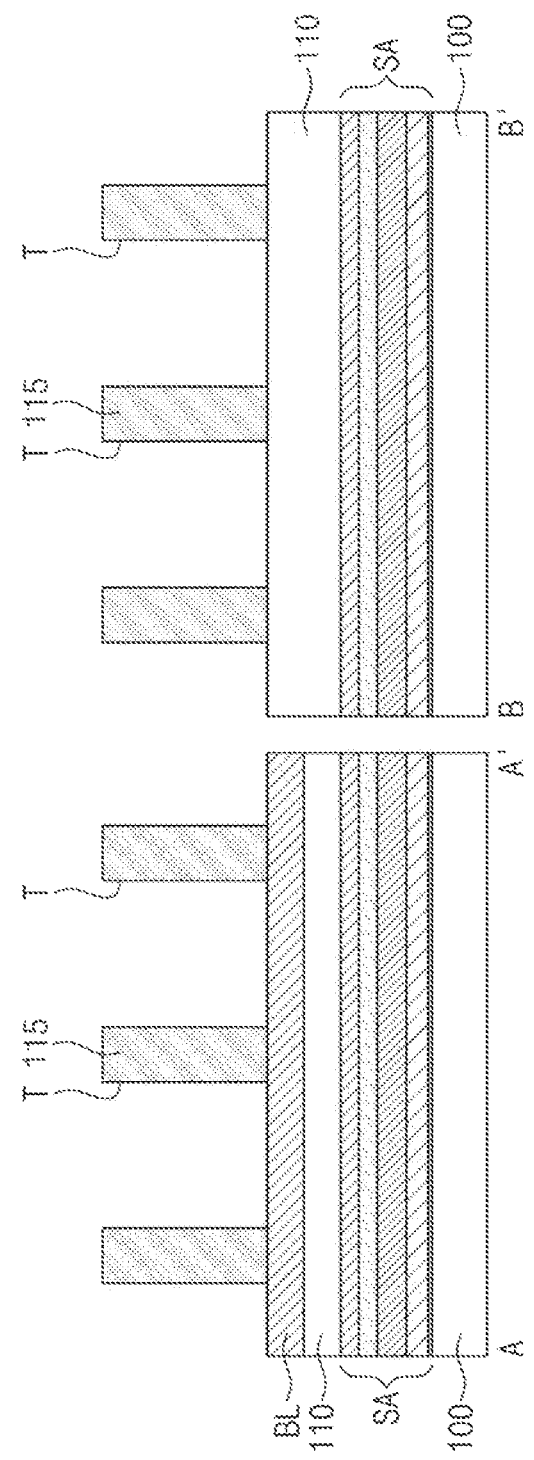
Figure 18C:
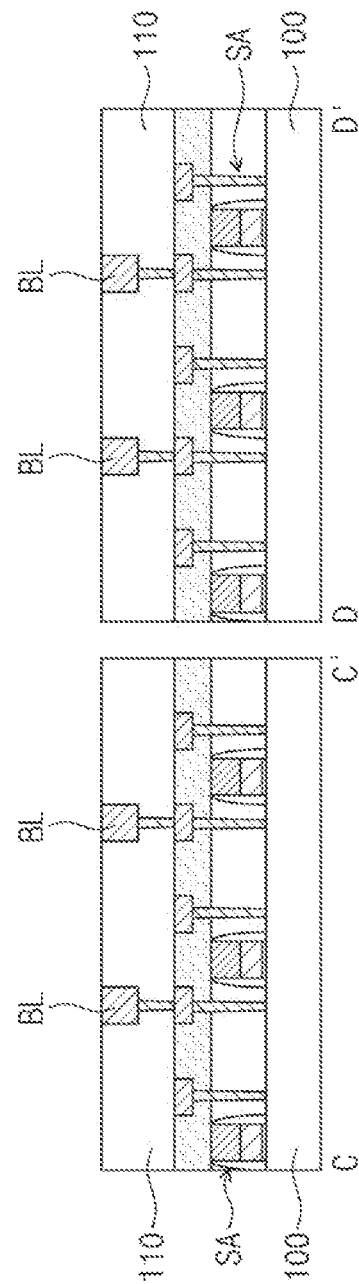

Referring to FIGS. 18A, 18B, and 18C, NMOS and PMOS transistors, which constitute the core and peripheral circuits SA, may be formed on the semiconductor substrate 100. In addition, the peripheral interconnection lines and the peripheral contact plugs, which are electrically connected to the core and peripheral circuits SA, may be formed on the semiconductor substrate 100.

The lower insulating layer 110 may be formed on the semiconductor substrate 100 to cover the core and peripheral circuits SA, the peripheral interconnection lines, and the peripheral contact plugs. The lower insulating layer 110 may include a plurality of stacked insulating layers. For example, the lower insulating layer 110 may include at least one of a silicon oxide layer, a silicon nitride layer, a silicon oxynitride layer, and/or low-k dielectric layers.

The bit lines BL, which are extended in the first direction D1 and are spaced apart from each other in the second direction D2, may be formed on the lower insulating layer 110. An insulating material may be formed to fill a space between the bit lines BL. The bit lines BL may be formed by depositing a conductive layer on the lower insulating layer 110 and patterning the conductive layer.

The first insulating pattern 115, which are extended in the second direction D2, may be formed on the bit lines BL to define the trenches T spaced apart from each other in the first direction D1. The trenches T may be formed to cross the bit lines BL. The first insulating pattern 115 may be formed of or include at least one of, for example, silicon oxide, silicon nitride, silicon oxynitride, and/or low-k dielectric materials.

Figure 19A:
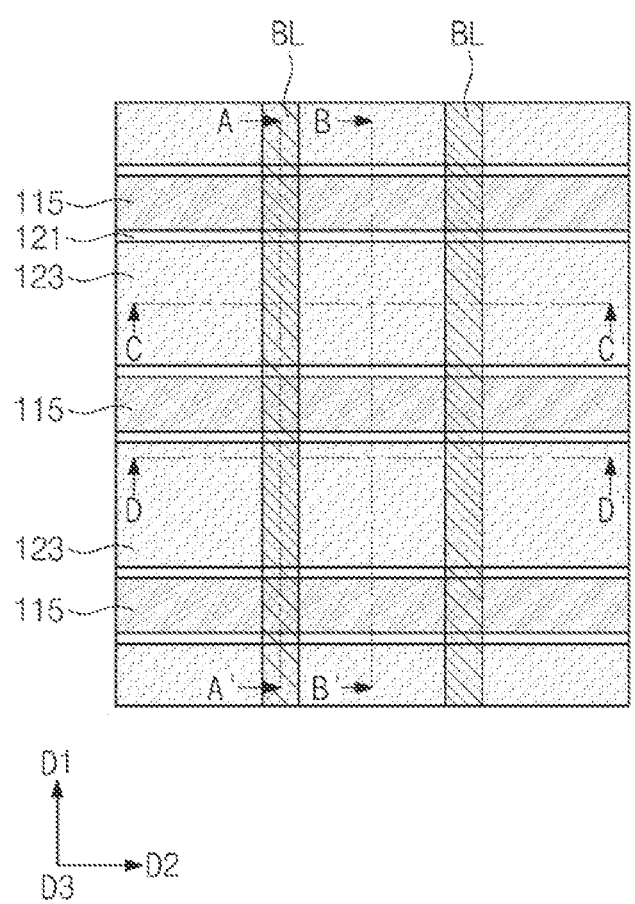
Figure 19C:
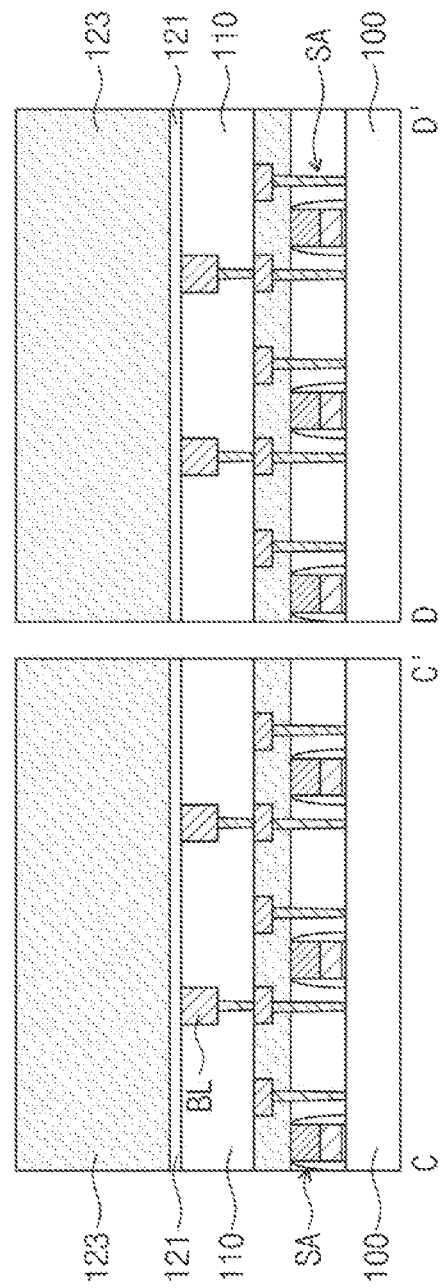

Referring to FIGS. 19A, 19B, and 19C, preliminary channel patterns 121 may be formed in the trenches T, respectively. The preliminary channel patterns 121 may be extended in the second direction D2.

The formation of the preliminary channel patterns 121 may include conformally depositing a channel layer on the lower insulating layer 110, on which the first insulating patterns 115 are formed, forming a sacrificial layer on the channel layer to fill the trenches T, and planarizing the sacrificial layer and the channel layer to expose the top surfaces of the first insulating patterns 115. Accordingly, the preliminary channel pattern 121 and a sacrificial pattern 123 on the preliminary channel pattern 121 may be formed in each of the trenches T.

The channel layer may be formed using at least one of physical vapor deposition (PVD), thermal chemical vapor deposition (thermal CVD), low pressure chemical vapor deposition (LP-CVD), plasma-enhanced chemical vapor deposition (PE-CVD), and atomic layer deposition (ALD) technologies. The channel layer may be formed to cover the bottom surfaces and the inner surfaces of the trenches T with a substantially constant thickness. The thickness of the channel layer may be smaller than half the width of the trench. The channel layer may be deposited to have a thickness of several to several tens of nanometers (in particular, 1 nm to 30 nm or more in particular, 1 nm to 10 nm). The channel layer may be formed of or include at least one of semiconductor materials, oxide semiconductor materials, and two-dimensional semiconductor materials. For example, the channel layer may be formed of or include at least one of silicon, germanium, silicon-germanium, and indium gallium zinc oxide (IGZO).

The sacrificial patterns 123 may be formed of or include an insulating material having an etch selectivity with respect to the first insulating patterns 115. As an example, the sacrificial patterns 123 may be formed of one of insulating materials and silicon oxide, which are formed using a spin-on-glass (SOG) technology.

Figure 20A:
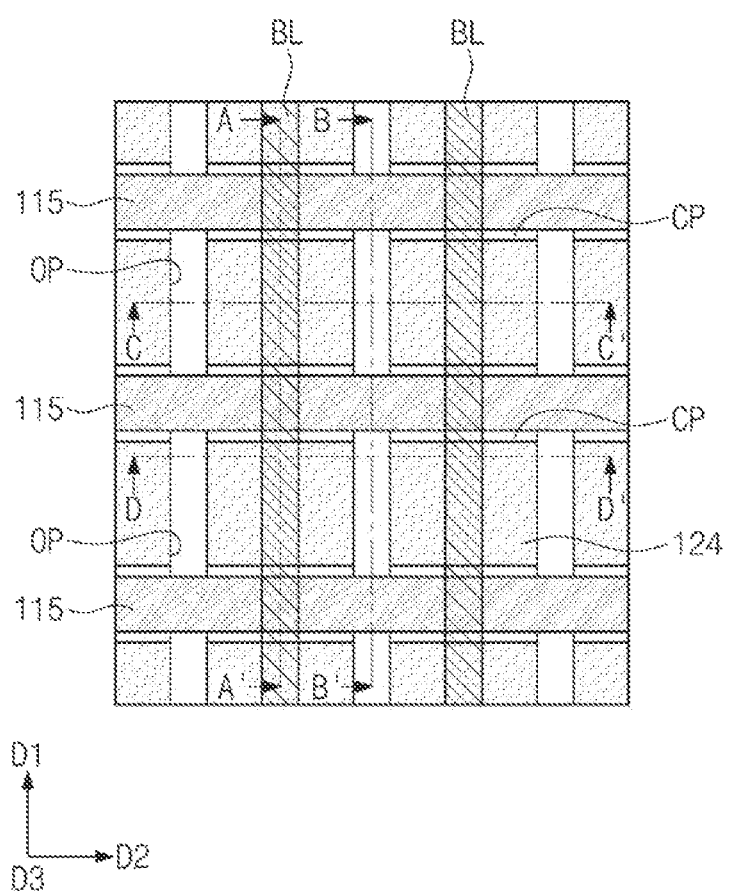
Figure 20B:
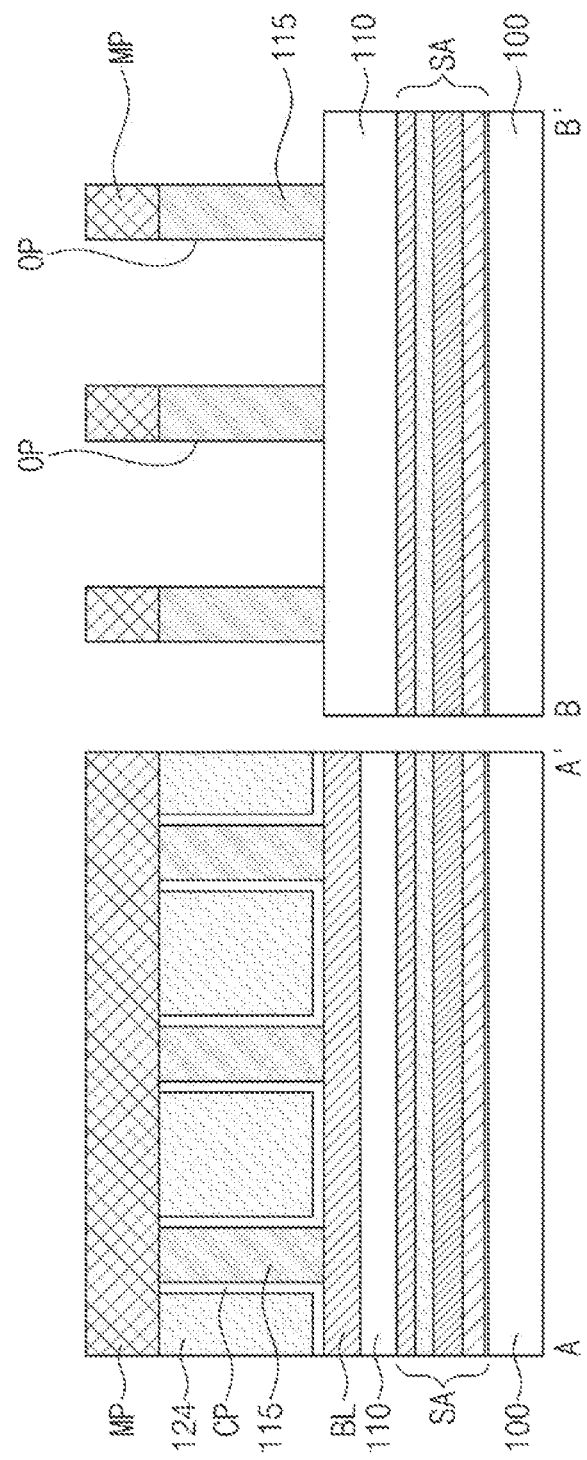
Figure 20C:
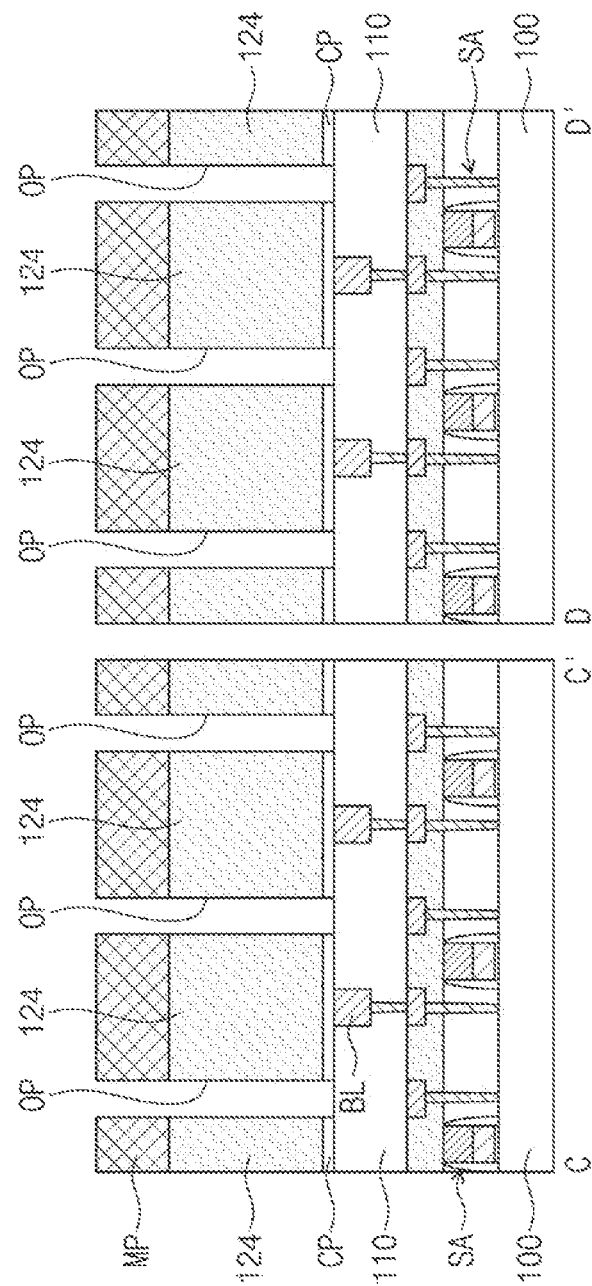

Referring to FIGS. 20A, 20B, and 20C, the preliminary channel patterns 121 and the sacrificial patterns 123 may be patterned to form the channel patterns CP, which are spaced apart from each other in the second direction D2, in each trench T.

The formation of the channel patterns CP may include forming a mask pattern MP on the preliminary channel patterns 121 and the sacrificial patterns 123 and then sequentially etching the sacrificial patterns 123 and the preliminary channel patterns 121, using the mask pattern MP as an etch mask, to form openings OP exposing the lower insulating layer 110.

As an example, the openings OP may be bar-shaped regions, which are elongated in the first direction D1, and may be spaced apart from each other in the first and second directions D1 and D2. The openings OP may be spaced apart from the bit lines BL, when viewed in a plan view. As another example, the openings OP may be line-shaped regions, which are extended parallel to the bit lines BL or in the first direction D1, and may be formed to extend in a direction crossing the first insulating pattern 115.

In the case where the channel patterns CP are formed by the afore-described method, each of the channel patterns CP may include the horizontal portion HP, which is in contact with the bit line BL, and the vertical portions VP, which cover both side surfaces of the trench.

An ashing process may be performed to remove the mask pattern MP, after the formation of the channel patterns CP, and the sacrificial patterns 123 may be removed using an etch recipe having an etch selectivity with respect to the first insulating pattern 115 and the channel patterns CP.

Figure 21A:
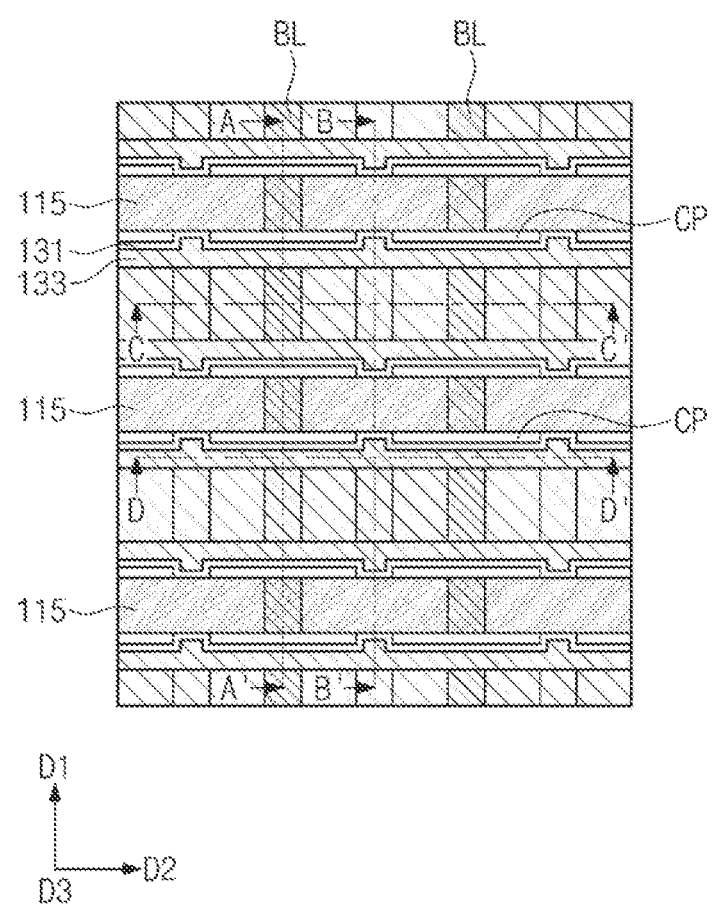
Figure 21B:
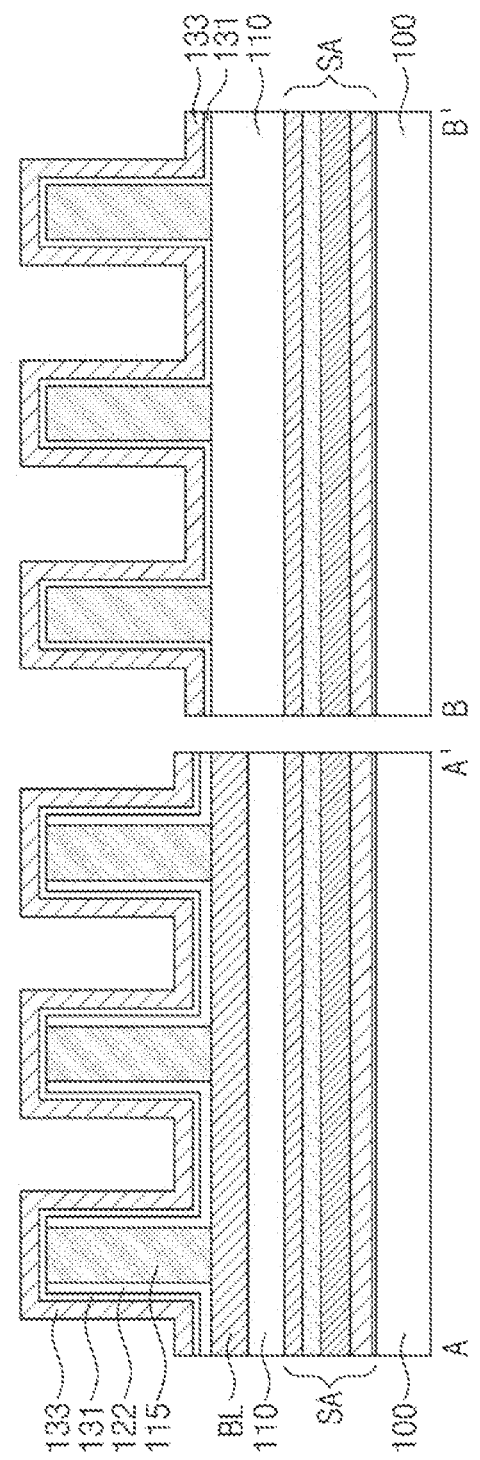
Figure 21C:
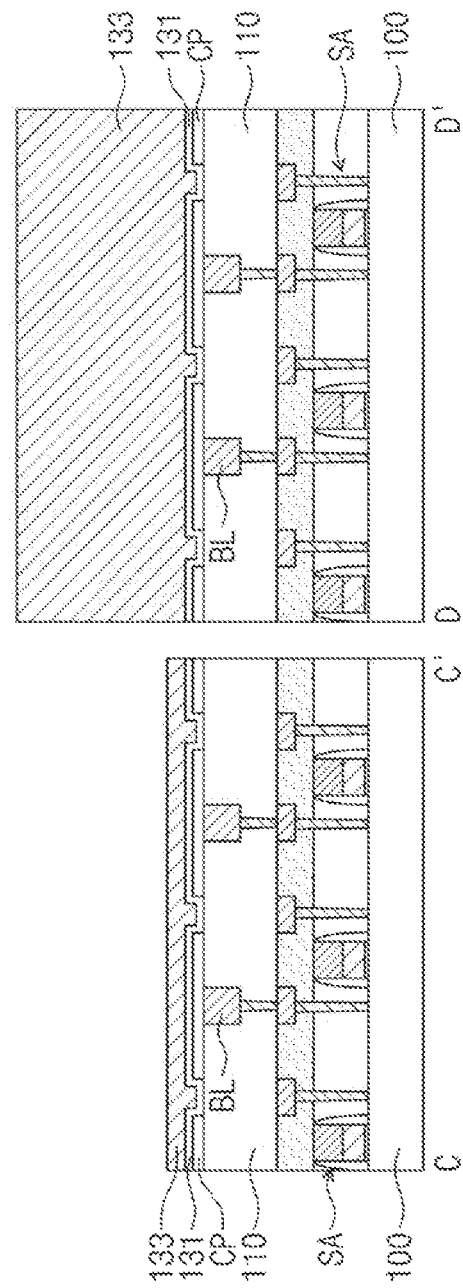

Referring to FIGS. 21A, 21B, and 21C, a gate insulating layer 131 and a gate conductive layer 133 may be sequentially deposited to conformally cover the channel patterns CP. The gate insulating layer 131 and the gate conductive layer 133 may be formed using at least one of physical vapor deposition (PVD), thermal chemical vapor deposition (thermal CVD), low pressure chemical vapor deposition (LP-CVD), plasma-enhanced chemical vapor deposition (PE-CVD), and atomic layer deposition (ALD) technologies.

The gate insulating layer 131 and the gate conductive layer 133 may cover the horizontal portion HP and the vertical portions VP of the channel pattern CP with a substantially constant thickness.

A sum of thicknesses of the gate insulating layer 131 and the gate conductive layer 133 may be smaller than half the width of the trench T. Accordingly, the gate conductive layer 133 may be formed on the gate insulating layer to define a gap region in the trench T.

In regions between the channel patterns CP, the gate insulating layer 131 may be formed to be in direct contact with the lower insulating layer 110 and the side surfaces of the first insulating pattern 115.

Figure 22A:
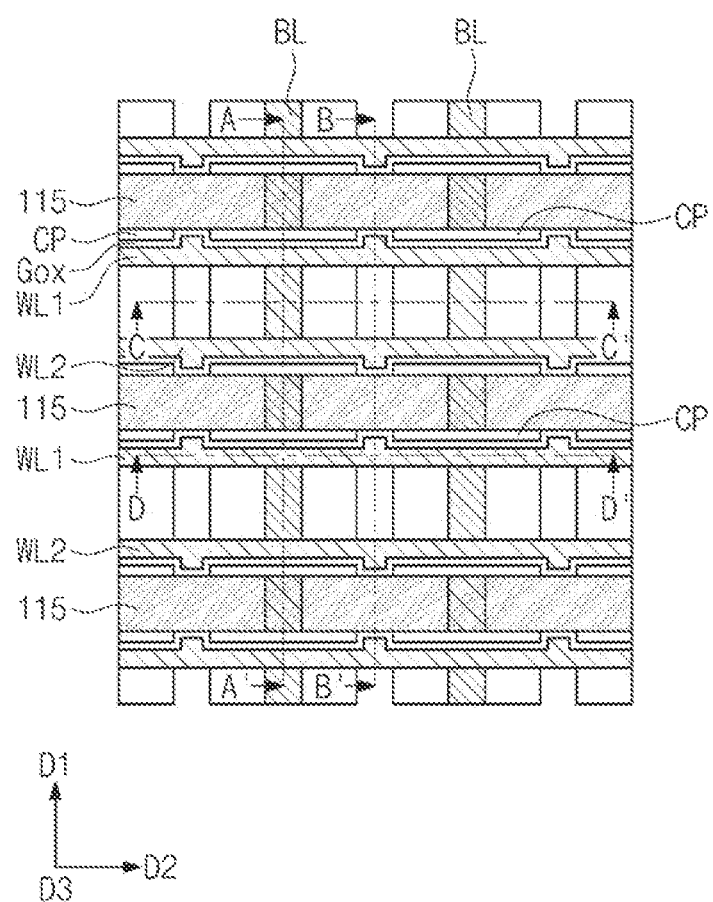
Figure 22B:
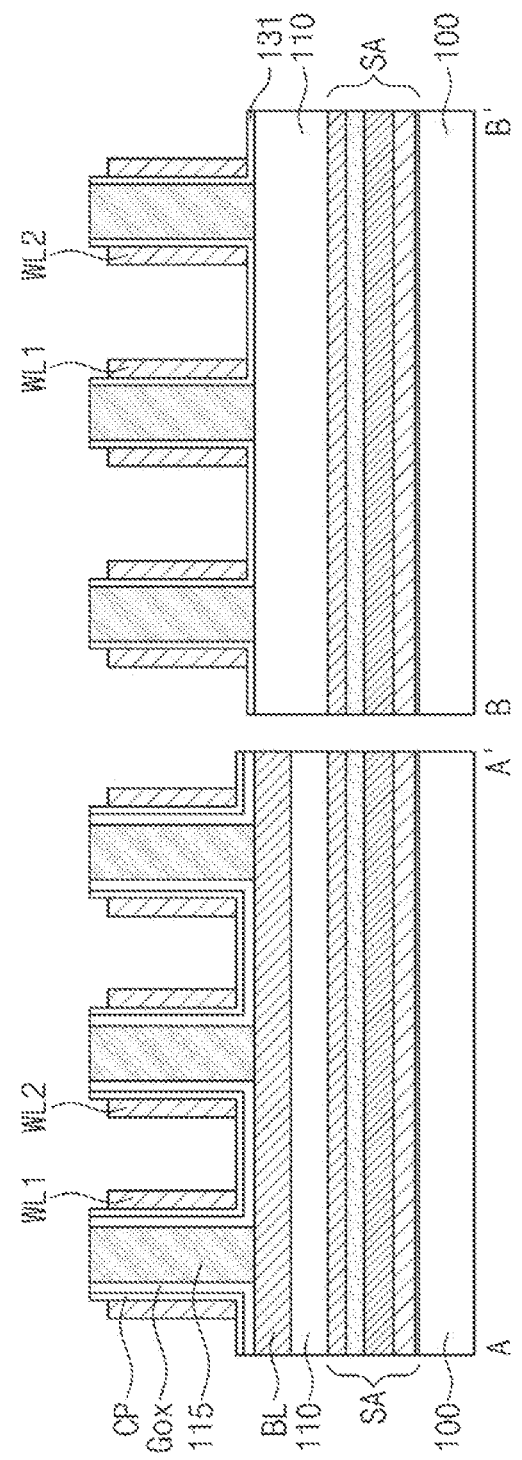
Figure 22C:
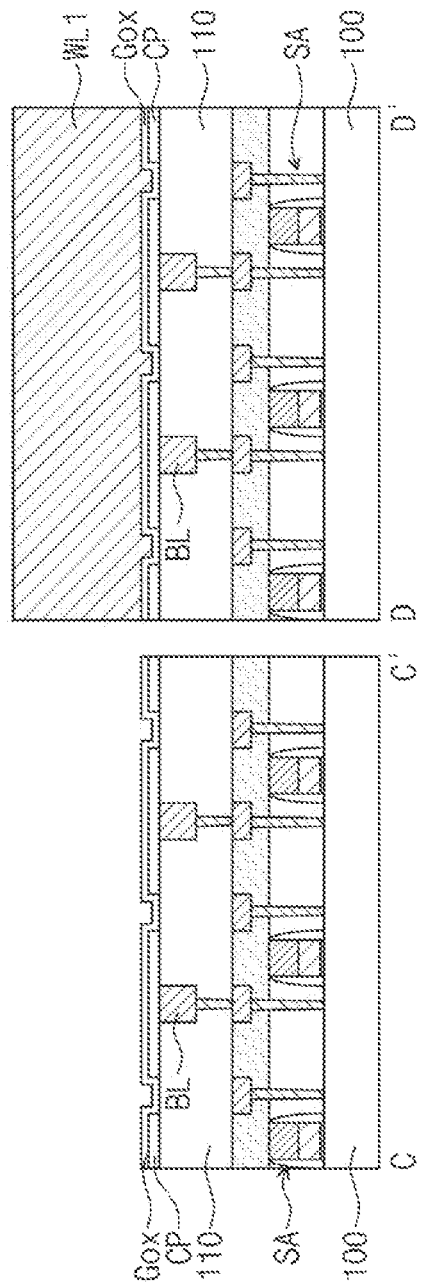

Next, referring to FIGS. 22A, 22B, and 22C, an anisotropic etching process may be performed on the gate conductive layer 133 to form the first and second word lines WL1 and WL2, which are spaced apart from each other, in each trench T. The anisotropic etching process on the gate conductive layer 133 may be performed in such a way that the top surfaces of the first and second word lines WL1 and WL2 are lower than the top surface of the channel pattern CP. Alternatively, an additional etching process may be further performed to recess the top surfaces of the first and second word lines WL1 and WL2.

In certain embodiments, the gate insulating layer 131 may also be etched during the anisotropic etching process on the gate conductive layer 133, and in this case, the channel pattern CP may be exposed. Accordingly, a pair of the gate insulating patterns Gox may be formed, as shown in FIG. 5C. In certain embodiments, during the anisotropic etching process on the gate conductive layer 133, the gate insulating pattern Gox and the channel pattern CP may be sequentially etched to expose the lower insulating layer 110. Accordingly, a pair of the first and second channel patterns CP1 and CP2, which are spaced apart from each other, may be formed in each trench T, as shown in FIG. 5D. Hereinafter, the gate insulating layer 131, on which the etching process has been performed, will be referred to as the gate insulating pattern Gox.

Figure 23A:
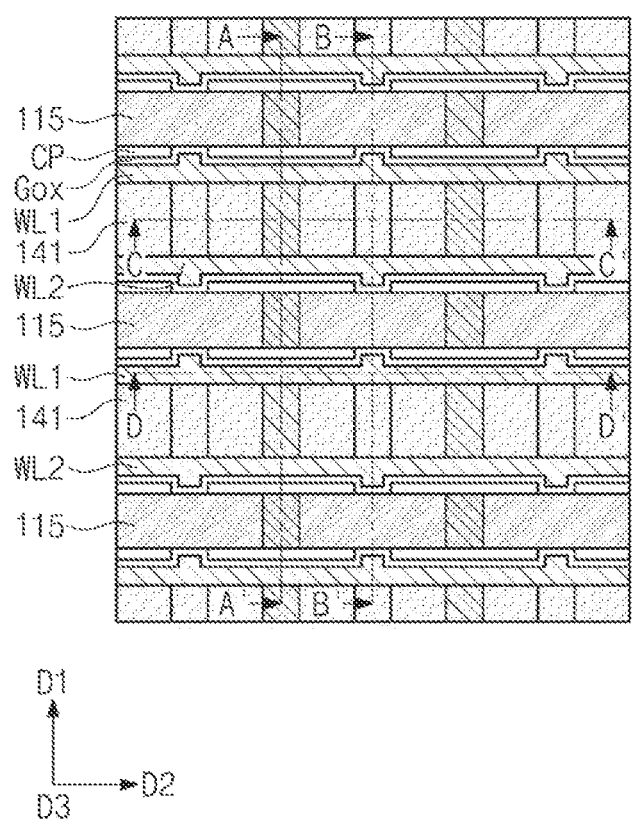
Figure 23B:
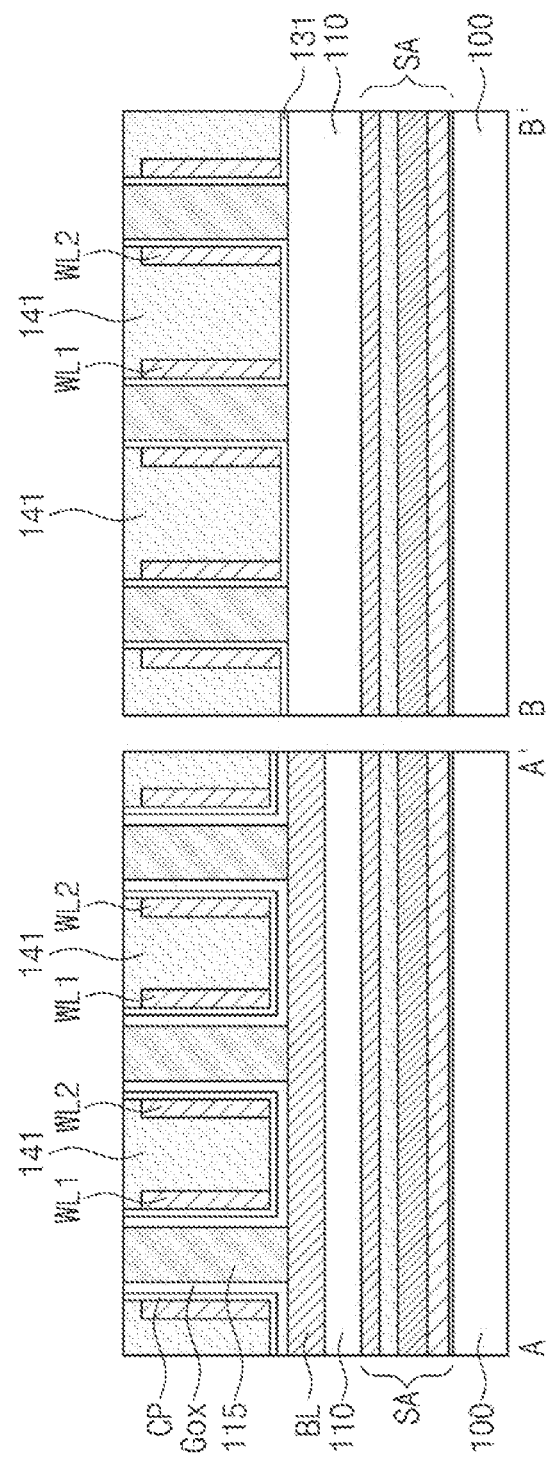
Figure 23C:
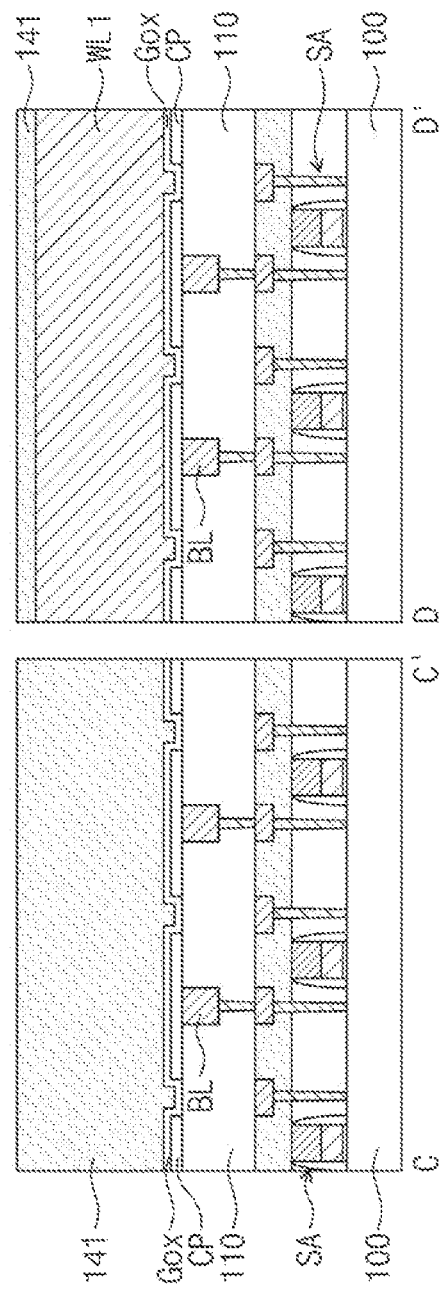

Referring to FIGS. 23A, 23B, and 23C, the second insulating patterns 141 may be formed to fill the trenches T, after the formation of the first and second word lines WL1 and WL2. The second insulating pattern 141 may be formed of or include at least one of, for example, silicon oxide, silicon nitride, silicon oxynitride, and/or low-k dielectric materials.

The formation of the second insulating pattern 141 may include depositing an insulating layer to fully fill the trenches T, in which the first and second word lines WL1 and WL2 are formed, and then performing a planarization process to expose the top surfaces of the channel patterns CP.

Thereafter, referring to FIGS. 4A, 4B, and 4C, an interlayer insulating layer may be formed on the first and second insulating patterns 115 and 141 and the channel patterns CP.

Next, the landing pads LP, which are in contact with the vertical portions of the channel patterns CP, respectively, may be formed in the interlayer insulating layer 150. The formation of the landing pads LP may be formed patterning the interlayer insulating layer to form holes, which expose the vertical portions of the channel patterns CP, respectively, and then filling the holes with a conductive material.

Next, the data storage patterns DSP may be formed on the landing pads LP, respectively. As an example, in the case where the data storage patterns DSP include capacitors, bottom electrodes, capacitor dielectric layer, and a top electrode may be sequentially formed.

Figure 24A:
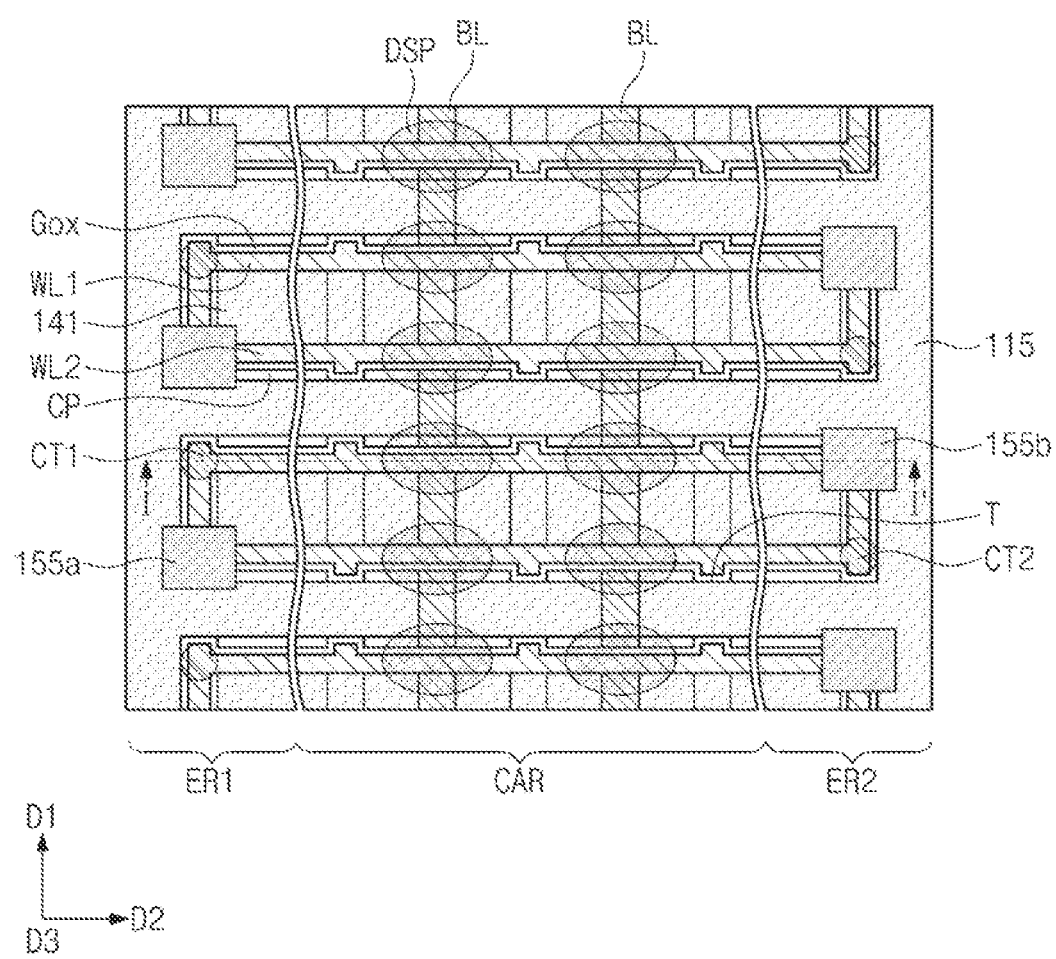
FIG. 24A is a plan view of a semiconductor memory device according to an embodiment.
Figure 24B:
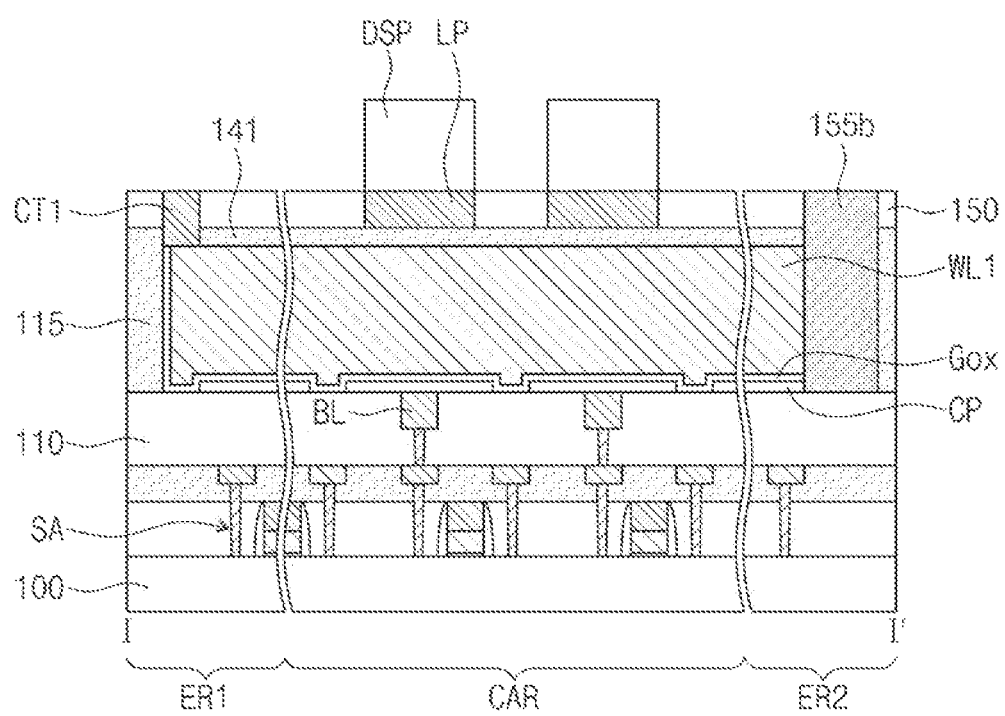
FIG. 24B is a sectional view, which is taken along a line I-I' of FIG. 24A to illustrate a semiconductor memory device according to an embodiment.

FIG. 24A is a plan view of a semiconductor memory device according to an embodiment. FIG. 24B is a sectional view, which is taken along a line I-I' of FIG. 24A to illustrate a semiconductor memory device according to an embodiment.

Referring to FIGS. 24A and 24B, the semiconductor substrate may include first and second edge regions ER1 and ER2 and a cell array region CAR therebetween.

The first and second word lines WL1 and WL2 may be extended from the cell array region CAR to the first and second edge regions ER1 and ER2.

Each of the first and second word lines WL1 and WL2 may include a line portion, which is extended in the second direction D2, and a protruding portion, which is extended in the first direction D1 and is connected to the line portion. As an example, the protruding portion of the first word line WL1 may be disposed in the first edge region ER1, and the protruding portion of the second word line WL2 may be disposed in the second edge region ER2 as shown, e.g., in FIG. 24A.

In the first edge region ER1, a first word line contact plug CT1 may be coupled to the first word line WL1, and in the second edge region ER2, a second word line contact plug CT2 may be coupled to the second word line WL2.

First and second separation insulating patterns 155a and 155b may be provided in the first and second edge regions ER1 and ER2, respectively. The first separation insulating pattern 155a may be provided to vertically penetrate the first and second word lines WL1 and WL2, in the first edge region ER1. The second separation insulating pattern 155b may be provided to vertically penetrate the first and second word lines WL1 and WL2, in the second edge region ER2. The first and second word lines WL1 and WL2 may be electrically separated from each other by the first and second separation insulating patterns 155a and 155b, in the first and second edge regions ER1 and ER2.

FIGS. 25A to 27A are plan view illustrating a method of fabricating a semiconductor memory device according to an embodiment. FIGS. 25B to 27B and FIGS. 25C to 27C are sectional views illustrating a method of fabricating a semiconductor memory device according to an embodiment.

Figure 25A:
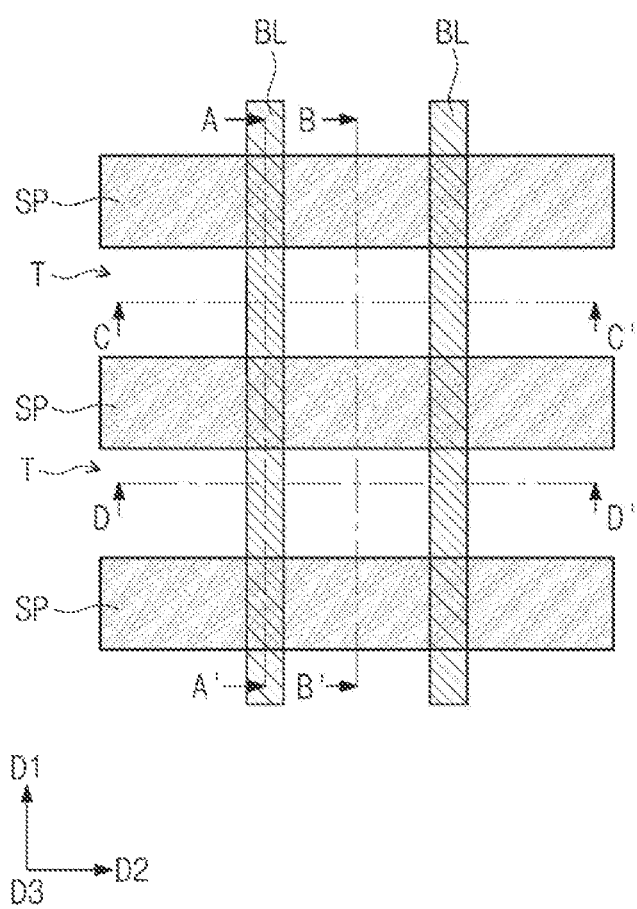
FIGS. 25A, 26A, and 27A are plan views illustrating a method of fabricating a semiconductor memory device according to an embodiment.
Figure 25C:
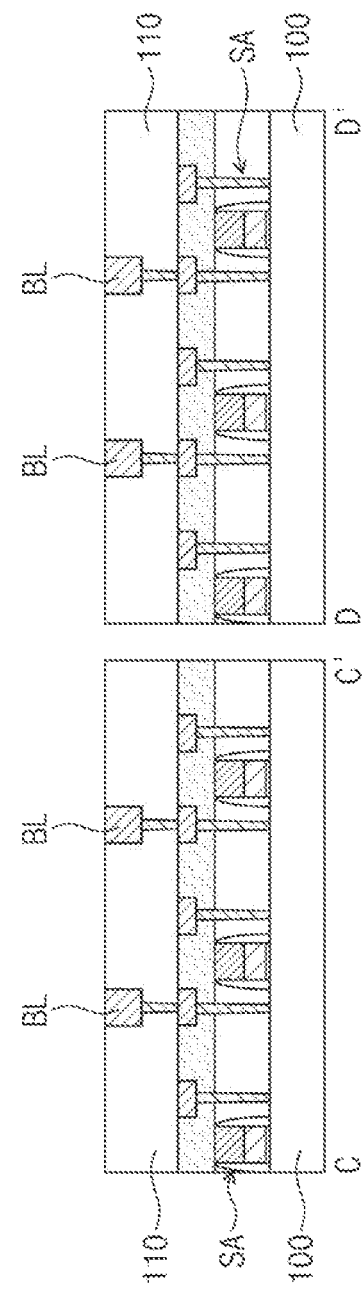

Referring to FIGS. 25A, 25B, and 25C, first sacrificial patterns SP may be formed on the lower insulating layer 110, on which the bit lines BL extending in the first direction D1 are formed, and here, the first sacrificial patterns SP may be extended in the second direction D2 to define trenches T spaced apart from each other in the first direction D1.

The first sacrificial pattern SP may be formed of or include an insulating material having an etch selectivity with respect to the lower insulating layer 110. The first sacrificial pattern SP may be formed of or include at least one of, for example, silicon oxide, silicon nitride, silicon oxynitride, and/or low-k dielectric materials.

Figure 26A:
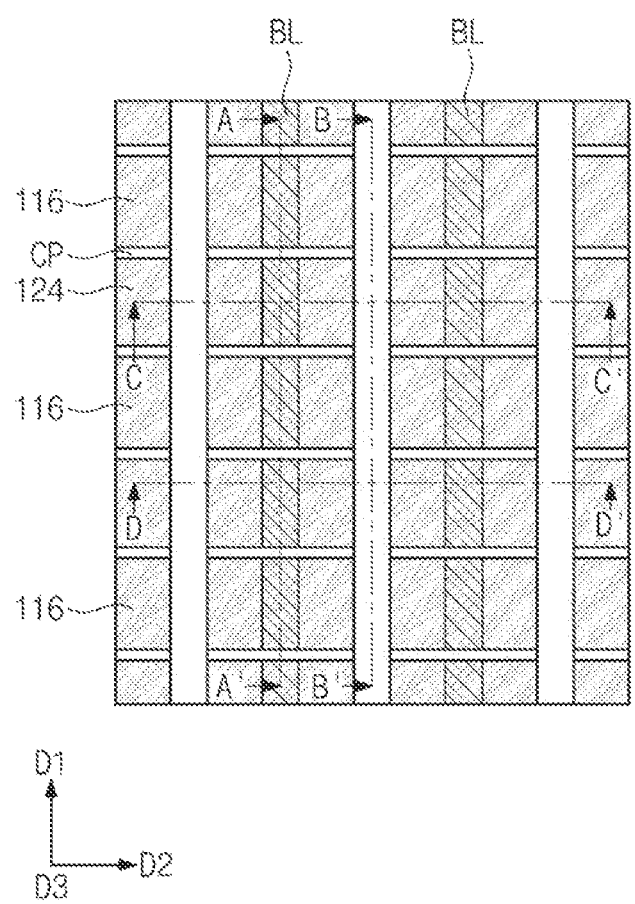
Figure 26C:
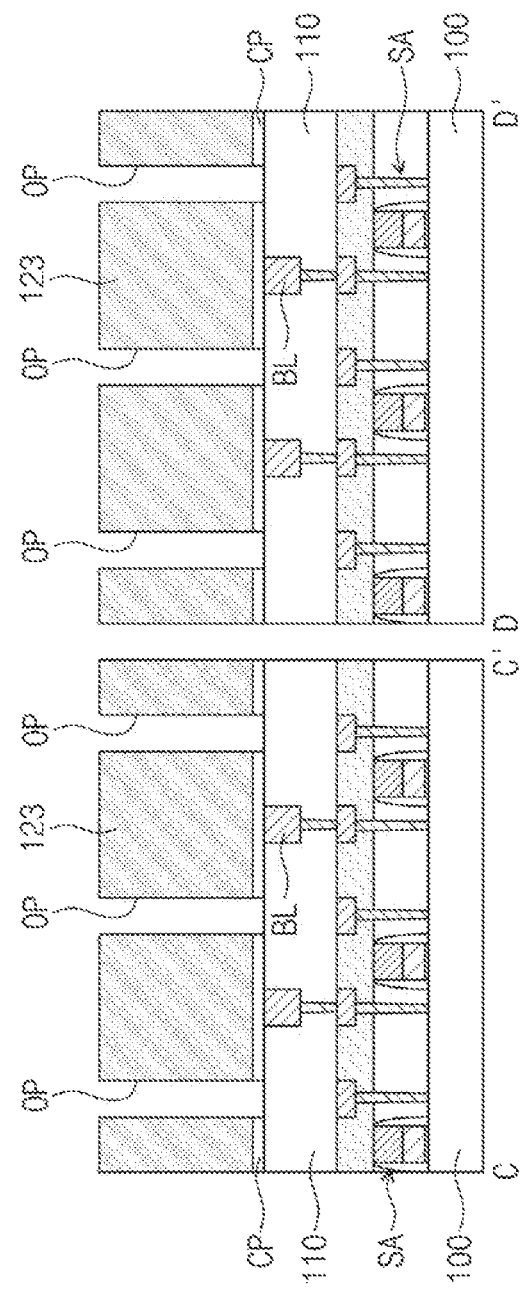

Referring to FIGS. 26A, 26B, and 26C, the channel patterns CP, which are spaced apart from each other, may be formed in each of the trenches T. Here, as previously described with reference to FIGS. 19A, 19B, and 19C, the formation of the channel patterns CP may include forming the preliminary channel patterns 121 in the trenches T, forming the second sacrificial patterns 123 to fill the trenches T provided with the preliminary channel patterns 121, and forming openings to penetrate the second sacrificial patterns 123, the first sacrificial patterns SP, and the preliminary channel patterns 121 and to extend in the first direction D1.

Here, the second sacrificial patterns 123 may be formed of or include the same insulating material as the first sacrificial patterns SP. In addition, the openings may be formed to have a bar shape, as previously described with reference to FIGS. 20A, 20B, and 20C.

Each of the channel patterns CP, which are formed by the afore-described method, may include the horizontal portion HP, which is in contact with the bit line BL, and the first and second vertical portions VP1 and VP2, which are vertically extended from the horizontal portion HP to face each other, as previously described with reference to FIGS. 10A, 10B, and 10C.

After the formation of the channel patterns CP, an etching process may be performed to remove the first and second sacrificial patterns 116 and 123. Accordingly, the surfaces of the channel patterns CP may be exposed. For example, the inner and outer side surfaces of the channel patterns CP may be exposed.

Figure 27A:
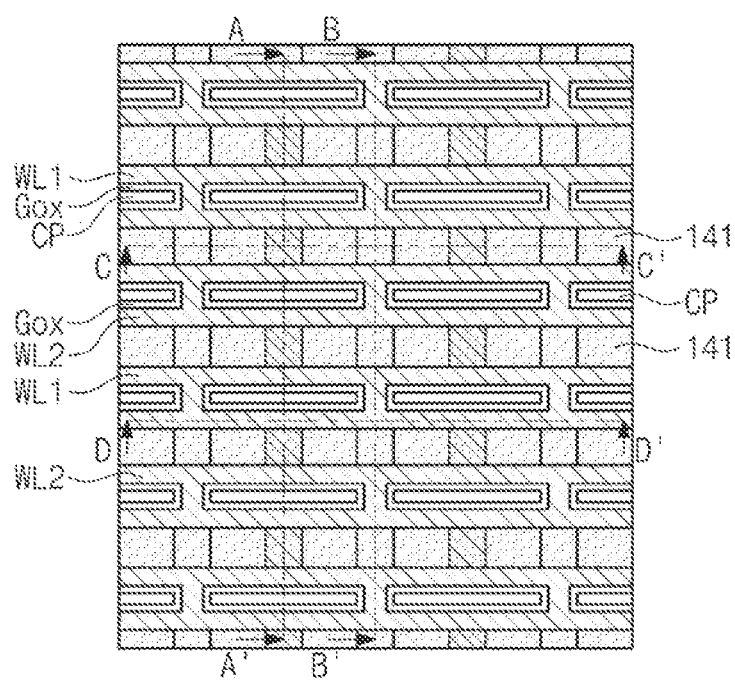
Figure 27B:
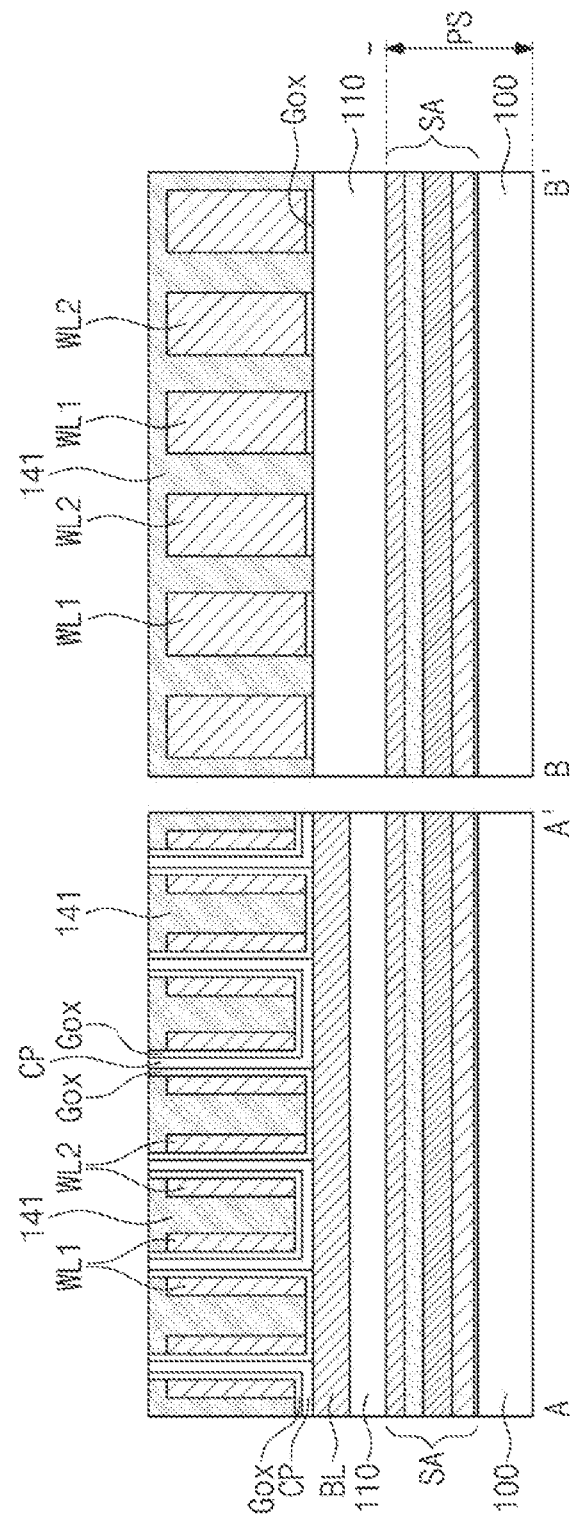
Figure 27C:
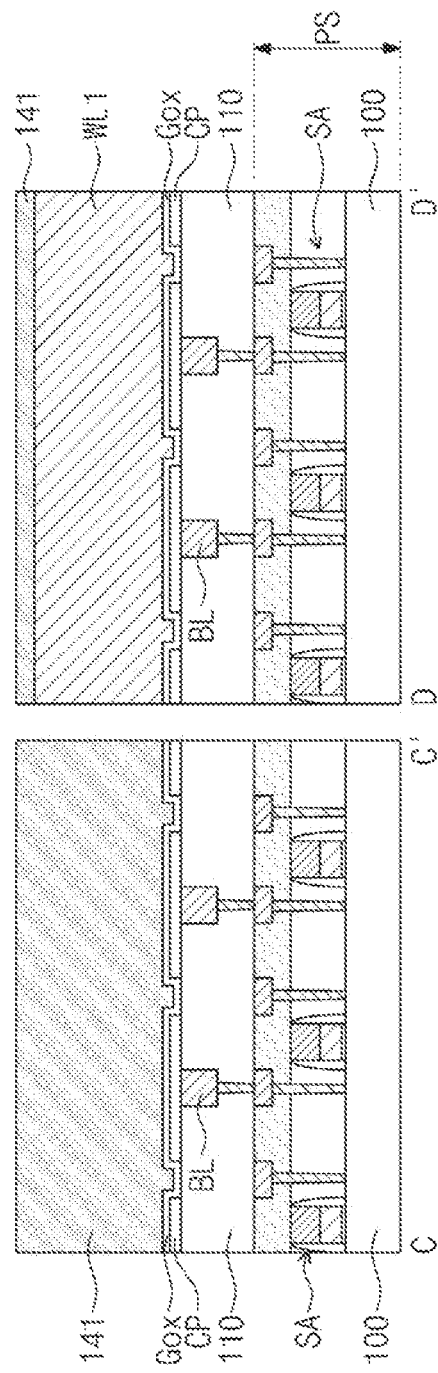

Referring to FIGS. 27A, 27B, and 27C, the first word lines WL1 may be formed to extend in the second direction D2 and to enclose the first vertical portions VP1 of the channel patterns CP, and the second word lines WL2 may be formed to extend in the second direction D2 and to enclose the second vertical portions VP2 of the channel patterns CP.

The formation of the first and second word lines WL1 and WL2 may include sequentially and conformally depositing a gate insulating layer and a gate conductive layer on the lower insulating layer 110, on which the channel patterns CP are formed, and then performing an anisotropic etching process on the gate conductive layer to expose the gate insulating layer or the horizontal portions HP of the channel patterns CP. The first word line WL1 may be formed to be adjacent to outer and inner side surfaces of the first vertical portions of the channel patterns CP. The second word line WL2 may be formed to be adjacent to outer and inner side surfaces of the second vertical portions of the channel patterns CP.

Thereafter, the insulating pattern 141 may be formed to fill a space between the first and second word lines WL1 and WL2. The insulating pattern 141 may cover the top surfaces of the first and second word lines WL1 and WL2. The formation of the insulating pattern 141 may include forming an insulating layer to cover the top surfaces of the first and second word lines WL1 and WL2 and to fill the space between the first and second word lines WL1 and WL2 and then performing a planarization process to expose the top surfaces of the channel patterns CP.

Next, referring to FIGS. 10A, 10B, and 10C, the interlayer insulating layer 150 may be formed on the insulating patterns 141 and the channel patterns CP.

The landing pads LP may be formed to penetrate the interlayer insulating layer 150 and to be in contact with the vertical portions of the channel patterns CP, and then, the data storage patterns DSP may be formed on the landing pads LP.

Figure 28A:
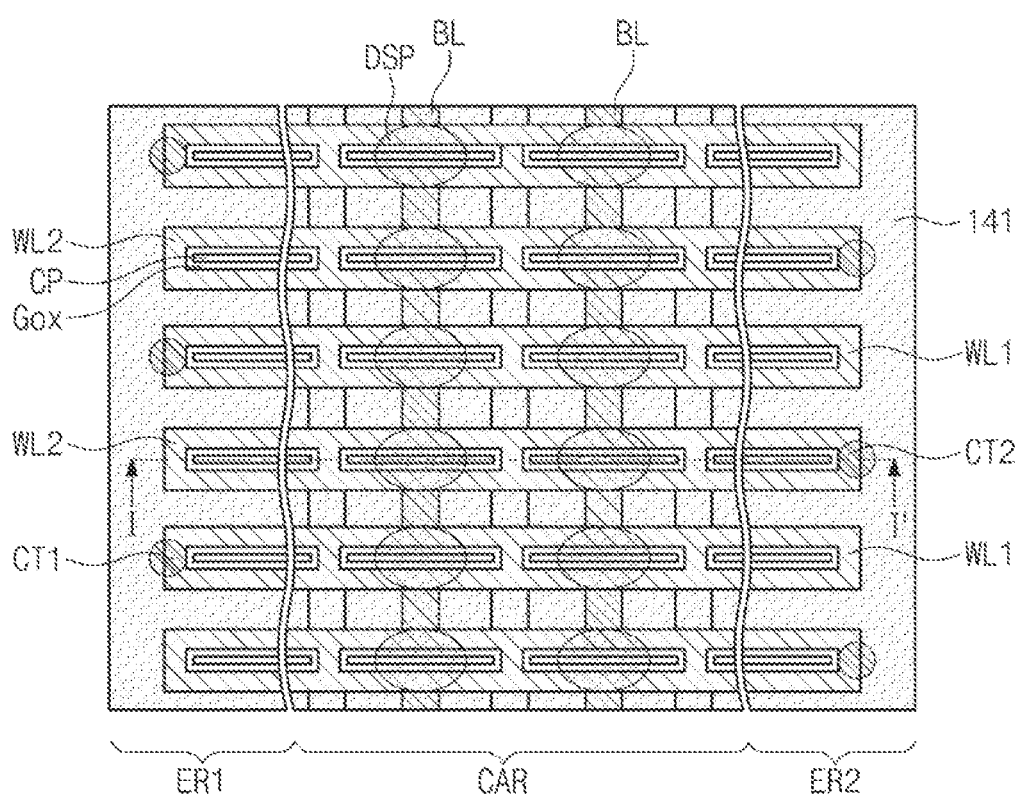
FIG. 28A is a plan view of a semiconductor memory device according to an embodiment.
Figure 28B:
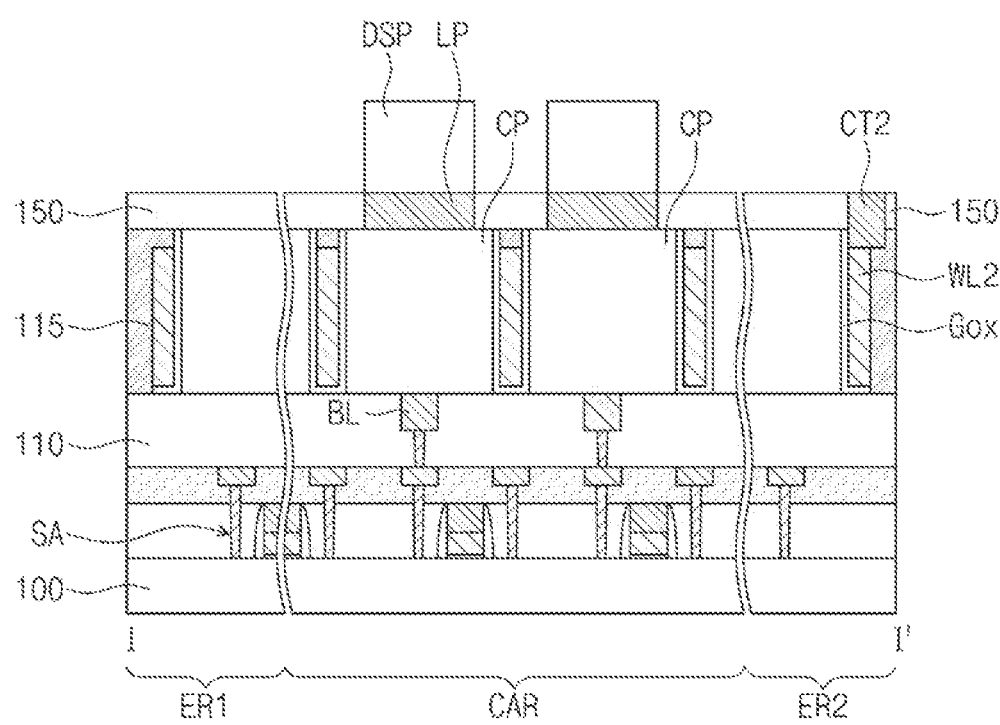
FIG. 28B is a sectional view, which is taken along a line I-I' of FIG. 28A to illustrate a semiconductor memory device according to an embodiment.

FIG. 28A is a plan view of a semiconductor memory device according to an embodiment. FIG. 28B is a sectional view, which is taken along a line I-I' of FIG. 28A to illustrate a semiconductor memory device according to an embodiment.

Referring to FIGS. 28A and 28B, the semiconductor substrate 100 may include the first and second edge regions ER1 and ER2 and the cell array region CAR therebetween.

The first and second word lines WL1 and WL2 may be extended from the cell array region CAR to the first and second edge regions ER1 and ER2. Each of the first and second word lines WL1 and WL2 may fill a space between a corresponding pair of the channel patterns CP, which are adjacent to each other in the second direction D2.

The first word line contact plugs CT1 may be respectively coupled to the first word lines WL1, in the second edge region ER2. The second word line contact plugs CT2 may be respectively coupled to the second word lines WL2, in the first edge region ER1.

When measured in the first direction D1, a distance between the first word line contact plugs CT1 may be larger than a distance between the first word lines WL1. Similarly, when measured in the first direction D1, a distance between the second word line contact plugs CT2 may be larger than a distance between the second word lines WL2.

According to an embodiment, it may be possible to realize a vertical channel transistor having a mirror symmetric channel pattern. In this case, it may be possible to increase an integration density of a semiconductor memory device.

The mirror symmetric channel pattern may be formed by a deposition method, and thus, it may be possible to prevent technical issues, such as void or seam. Accordingly, it may be possible to improve electrical and reliability characteristics of the transistor. Since the channel pattern is formed using the deposition method, each channel pattern may be used to realize a pair of transistors, and thus, a size of a unit memory cell may be reduced.

Furthermore, since an oxide semiconductor material is used for the channel pattern, a leakage current of the transistor can be reduced. In addition, peripheral circuits may be overlapped with a cell array layer, and thus, the integration density of the semiconductor memory device may be further improved.

While example embodiments have been particularly shown and described, it will be understood by one of ordinary skill in the art that variations in form and detail may be made therein without departing from the spirit and scope of the attached claims.

What is claimed is:

1. A semiconductor memory device, comprising:
   a bit line extending in a first direction;
   a channel pattern on the bit line, the channel pattern comprising a first vertical portion and a second vertical portion facing each other and a horizontal portion connecting the first vertical portion with the second vertical portion;
   a first word line and a second word line provided on the horizontal portion and between the first vertical portion and the second vertical portion, the first word line and the second word line extending in a second direction crossing the bit line; and
   a gate insulating pattern provided between the first word line and the channel pattern and between the second word line and the channel pattern,
   wherein the horizontal portion of the channel pattern is substantially parallel to the bit line.

2. The semiconductor memory device of claim 1, wherein the channel pattern comprises an oxide semiconductor material.

3. The semiconductor memory device of claim 1, wherein a portion of the horizontal portion is disposed between the first word line and the second word line.

4. The semiconductor memory device of claim 1, wherein top surfaces of the first word line and the second word line are located at a level lower than top surfaces of the first vertical portion and the second vertical portion.

5. The semiconductor memory device of claim 1, wherein the gate insulating pattern comprises:
   a first portion provided between the first vertical portion and an outer side surface of the first word line;
   a second portion provided between the second vertical portion and an outer side surface of the second word line; and
   a third portion provided between a bottom surface of the first word line and the horizontal portion and between a bottom surface of the second word line and the horizontal portion.

6. The semiconductor memory device of claim 1, wherein the bit line has a first width in the second direction, and
   wherein the horizontal portion of the channel pattern has a second width in the second direction that is substantially equal to or larger than the first width.

7. The semiconductor memory device of claim 1, wherein the channel pattern has a first length in the first direction, and wherein each of the first word line and the second word line has a third width in the first direction that is smaller than half the first length.

8. The semiconductor memory device of claim 1, wherein the horizontal portion of the channel pattern has a first thickness at a position contacting bottom surfaces of the first word line and the second word line, and
wherein the first vertical portion and the second vertical portion of the channel pattern each have a second thickness substantially equal to the first at a position contacting outer side surfaces of the first word line and the second word line.

9. The semiconductor memory device of claim 1, further comprising:
a first data storage pattern connected to the first vertical portion; and
a second data storage pattern connected to the second vertical portion.

10. The semiconductor memory device of claim 9, further comprising:
a first landing pad disposed between the first vertical portion and the first data storage pattern; and
a second landing pad disposed between the second vertical portion and the second data storage pattern.

11. The semiconductor memory device of claim 1, further comprising:
a semiconductor substrate comprising a first edge region, a second edge region, and a cell array region between the first edge region and the second edge region;
a first word line contact plug coupled to the first word line in the first edge region; and
a second word line contact plug coupled to the second word line in the second edge region.

12. The semiconductor memory device of claim 11, further comprising:
a first separation insulating pattern disposed between the first word line and the second word line in the first edge region; and
a second separation insulating pattern disposed between the first word line and the second word line in the second edge region.

13. A semiconductor memory device, comprising:
a peripheral circuit structure comprising a plurality of peripheral circuits on a semiconductor substrate and a lower insulating layer covering the plurality of peripheral circuits;
a plurality of bit lines extended in a first direction on the peripheral circuit structure;
a first insulating pattern defining a trench, the first insulating pattern crossing the plurality of bit lines and extending in a second direction;
a plurality of channel patterns provided in the trench and spaced apart from each other in the second direction, each of the plurality of channel patterns comprising a first vertical portion and a second vertical portion facing each other and a horizontal portion connecting the first vertical portion with the second vertical portion;
a first word line and a second word line provided on the horizontal portion of each of the plurality of channel patterns, the first word line and the second word line extending in the second direction, the first word line being adjacent to the first vertical portion of each of the plurality of channel patterns, the second word line being adjacent to the second vertical portion of each of the plurality of channel patterns;
for each of the plurality of channel patterns, a gate insulating pattern extending in the second direction disposed between the channel pattern and the first word line and between the channel pattern and the second word line;
a second insulating pattern covering the first word line and the second word line in the trench;
a plurality of first data storage patterns disposed on respective first vertical portions of the plurality of channel patterns; and
a plurality of second data storage patterns disposed on respective second vertical portions of the plurality of channel patterns,
wherein the first direction and the second direction are substantially parallel to a top surface of the semiconductor substrate.

14. The semiconductor memory device of claim 13, wherein outer side surfaces of the first vertical portion and the second vertical portion of each of the plurality of channel patterns are in contact with the first insulating pattern.

15. The semiconductor memory device of claim 13, wherein top surfaces of the first vertical portion and the second vertical portion of each of the plurality of channel patterns are located at substantially the same level as top surfaces of the first insulating pattern and the second insulating pattern.

16. The semiconductor memory device of claim 13, wherein the gate insulating pattern comprises:
a first portion provided between an outer side surface of the first word line and the first vertical portion of each of the plurality of channel patterns;
a second portion provided between an outer side surface of the second word line and the second vertical portion of each of the plurality of channel patterns; and
a third portion provided between a bottom surface of the first word line and the horizontal portion and between a bottom surface of the second word line and the horizontal portion.

17. The semiconductor memory device of claim 16, wherein the first portion and the second portion of the gate insulating pattern are in contact with a side surface of the first insulating pattern between each pair of the plurality of channel patterns that are adjacent to each other in the second direction.

18. A semiconductor memory device, comprising:
a bit line extending in a first direction;
a channel pattern on the bit line, the channel pattern comprising a first vertical portion and a second vertical portion facing each other and a horizontal portion connecting the first vertical portion and the second vertical portion;
a first word line extending in a second direction to cross the bit line, the first word line being disposed on the horizontal portion and between the first vertical portion and the second vertical portion; and
a gate insulating pattern interposed between the first word line and the channel pattern,
wherein the horizontal portion of the channel pattern is substantially parallel to the bit line.

19. The semiconductor memory device of claim 18, further comprising a data storage pattern connected in common to the first vertical portion and the second vertical portion of the channel pattern.

20. The semiconductor memory device of claim 18, wherein the first word line comprises a first side surface and a second side surface that are opposite to each other, wherein the first vertical portion of the channel pattern covers the first side surface of the first word line, and
wherein the second vertical portion of the channel pattern covers the second side surface of the first word line.

\* \* \* \* \*